(12) United States Patent
Takeuchi et al.

(10) Patent No.: US 10,136,564 B2
(45) Date of Patent: Nov. 20, 2018

(54) POWER CONVERTER

(71) Applicant: DENSO CORPORATION, Kariya, Aichi-pref. (JP)

(72) Inventors: Kazuya Takeuchi, Kariya (JP); Naoki Hirasawa, Nishio (JP); Hiromi Ichijo, Kariya (JP); Shingo Oono, Kariya (JP); Takuya Oizumi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/718,526

(22) Filed: Sep. 28, 2017

(65) Prior Publication Data

US 2018/0098457 A1 Apr. 5, 2018

(30) Foreign Application Priority Data

Sep. 30, 2016 (JP) ................................ 2016-192508
Sep. 30, 2016 (JP) ................................ 2016-192509
Sep. 30, 2016 (JP) ................................ 2016-192510

(51) Int. Cl.
*H05K 7/20* (2006.01)
*H01L 23/46* (2006.01)
*H02M 7/00* (2006.01)
*H02M 3/158* (2006.01)
*H02M 7/5387* (2007.01)
(Continued)

(52) U.S. Cl.
CPC ............. *H05K 7/209* (2013.01); *H01L 23/46* (2013.01); *H02M 7/003* (2013.01); *H05K 7/20927* (2013.01); *H02M 3/158* (2013.01); *H02M 7/5387* (2013.01); *H02M 2001/007* (2013.01); *H02M 2001/008* (2013.01); *H02M 2001/327* (2013.01); *H05K 7/20854* (2013.01)

(58) Field of Classification Search
CPC .. H02M 7/003; H02M 3/158; H05K 7/20854; H05K 7/20927
See application file for complete search history.

(56) References Cited

U.S. PATENT DOCUMENTS

2005/0259402 A1* 11/2005 Yasui ..................... H02M 7/003
361/716
2009/0250195 A1* 10/2009 Yoshida ..................... F28F 3/02
165/80.3
(Continued)

FOREIGN PATENT DOCUMENTS

JP  2015-220839 A  12/2015
JP  2016-005424 A   1/2016

*Primary Examiner* — David M Sinclair
*Assistant Examiner* — Robert Brown
(74) *Attorney, Agent, or Firm* — Oliff PLC

(57) ABSTRACT

A power converter includes a stack of a plurality of semiconductor modules, each of which incorporates semiconductor elements, and a plurality of cooling conduits, though each of which a coolant flows to cool the semiconductor modules, at least one electronic component electrically connected to the semiconductor modules, and a cooling plate for cooling the at least one electronic component. The stack, the at least one electronic component, and the cooling plate are arranged in a stacking direction of the stack. The cooling plate is connected to the cooling conduits and has an intra-plate pathway formed therein thorough which the coolant flows in a direction perpendicular to the stacking direction. The cooling plate has a larger area than each cooling conduit when viewed from the stacking direction.

21 Claims, 58 Drawing Sheets

(51) Int. Cl.
  *H02M 1/00*  (2006.01)
  *H02M 1/32*  (2007.01)

(56) References Cited

U.S. PATENT DOCUMENTS

| | | | | |
|---|---|---|---|---|
| 2011/0299243 | A1* | 12/2011 | Yamaura | H05K 7/20927 361/688 |
| 2013/0058068 | A1* | 3/2013 | Funatsu | H05K 7/20927 361/820 |
| 2013/0264891 | A1* | 10/2013 | Sawada | H02M 3/00 307/147 |
| 2013/0272043 | A1* | 10/2013 | Sano | H02M 7/003 363/123 |
| 2013/0335918 | A1* | 12/2013 | Tachibana | H05K 5/0213 361/689 |
| 2014/0001630 | A1* | 1/2014 | Takamura | H01L 23/433 257/719 |
| 2014/0284765 | A1* | 9/2014 | Kiuchi | H01L 28/40 257/532 |
| 2014/0313671 | A1* | 10/2014 | Sugita | H05K 7/20927 361/700 |
| 2015/0189790 | A1* | 7/2015 | Tachibana | H05K 7/20254 361/699 |
| 2015/0289411 | A1* | 10/2015 | Kamiya | H05K 7/20927 361/701 |
| 2015/0349394 | A1* | 12/2015 | Hayashida | H01M 10/6551 429/120 |
| 2016/0073556 | A1* | 3/2016 | Nakasaka | H01L 23/473 361/699 |
| 2016/0106011 | A1* | 4/2016 | Mizuno | H05K 7/20927 361/699 |
| 2016/0157381 | A1* | 6/2016 | Takeuchi | H05K 7/20927 361/709 |
| 2016/0192539 | A1* | 6/2016 | Sugita | H05K 7/20927 361/699 |
| 2016/0227677 | A1* | 8/2016 | Hirasawa | H05K 7/20927 |
| 2016/0241155 | A1* | 8/2016 | Takeuchi | H02M 7/003 |
| 2016/0308480 | A1* | 10/2016 | Wang | B60L 11/1803 |
| 2017/0141082 | A1* | 5/2017 | Hirasawa | B60L 11/1874 |

\* cited by examiner

POWER CONVERTER

CROSS-REFERENCE TO RELATED APPLICATION

This application is based on and claims the benefit of priority from earlier Japanese Patent Applications No. 2016-192510, No. 2016-192508, and No. 2016-192509 filed on Sep. 30, 2016, the contents of which are incorporated herein by reference.

BACKGROUND

Technical Field

The present invention relates to a power converter including a stack of a plurality of electronic components configuring a power conversion circuit and a plurality of cooling conduits for cooling the electronic components.

Related Art

A power converter is known that includes a stack of electronic components configuring a power conversion circuit and cooling conduits for cooling the electronic components (see, for example, Japanese Patent Application Laid-Open Publication No. 2015-220839). The electronic components include semiconductor modules each incorporating semiconductor elements, and other components. The power converter is configured to convert direct-current (DC) power into alternating-current (AC) power by switching on and off the respective semiconductor elements. Upon activating the power converter, the electronic components generate heat. The electronic components are cooled by coolant flowing through pathways formed in the cooling conduits.

The power converter further includes a boost reactor, a capacitor, a DC-to-DC converter and other electronic components. These electronic components are electrically connected to the semiconductor modules. Upon activating the power converter, these electronic components also generate heat. Therefore, in recent years, there is a need to cool the electronic components.

To this end, for example, a metallic cooling plate is provided that is shaped like a cooling conduit. The electronic components are sandwiched between the cooling plate and the cooling conduit so that heat generated in the electronic components is dissipated using the cooling plate. This can lower the temperature of the electronic components.

However, even with such a configuration, it is not possible to sufficiently cool the electronic components. That is, even if a metallic plate is used as the cooling plate, it is not possible to sufficiently absorb the heat generated in the electronic components. The cooling plate shaped like the cooling conduit has a small area that can be used to cool the electronic components, which cannot achieve sufficient heat dissipation efficiency.

In addition, in the power converter set forth above, any two of the cooling conduits adjacent to each other in a stacking direction of the stack are connected by a pair of connecting pipes. The inlet pipe and the outlet pipe are connected to an end cooling conduit that is a stacking-direction end one of the plurality of cooling conduits. The coolant introduced into the inlet pipe flows through connecting pipes and cooling conduits, and leaves through the outlet pipe, thereby cooling the electronic components.

The pipes, such as the inlet pipe, the outlet pipe, and the connecting pipes, are provided at both ends of each cooling conduit in an extensional direction of its pathway (see FIG. 38). The electronic component is displaced between a pair of pipes in the extensional direction of the pathway. The pathway in each cooling conduit and all the connected pipes thereto are in fluid communication with each other. Such a cooling conduit is referred to as a communication cooling conduit.

However, the power converter set forth above has room for improvement in efficiency of cooling the electronic components. In the case of the stack configured using only the communication cooling conduits, the entire introduced coolant will divide and flow through the cooling conduits (see FIG. 38), so that only a small amount coolant can flow through each cooling conduit. Thus, efficiency of cooling the electronic components is less likely to increase.

In addition, in the power converter set forth above, the pipes are provided at both ends of the cooling conduit in an extensional direction of its pathway, and the electronic component is displaced between a pair of pipes in the extensional direction of the pathway. Therefore, a portion of the cooling conduit that the pipes are connected to is not available for cooling the electronic components, so that only a small area of the cooling conduit can be used to cool the electronic components. Thus, efficiency of cooling the electronic components cannot be sufficiently improved.

In the power converter set forth above, a casing for the power converter accommodates the stack, an electronic component, such as a reactor, a DC-to-DC converter or the like, and a pressure applying member. Within the casing, the stack is interposed between the pressure applying member and the electronic component in a stacking direction of the stack. For example, the stack is pressed against the electronic component by the pressure applying member, thereby pressing the electronic component against a side wall of the casing (see FIG. 61). With this configuration, a pressing force of the pressure applying member allows the electronic component and the stack to be secured within the casing and allow the semiconductor modules configuring the stack and the cooling conduits to be in intimate contact with each other. Some of the cooling conduits can make contact with the electronic component, which allows the electronic component to be cooled.

However, as a deficiency, the power converter configured as above cannot sufficiently improve efficiency of cooling the electronic component. That is, in the power converter configured as above, one side of the electronic component can be cooled by the cooling conduit in the stacking direction while the other side of the electronic component abuts the side wall of the casing. No coolant flows within the side wall of the casing, leading to low efficiency of cooling the electronic component. Therefore, there is a need to improve efficiency of cooling the electronic component.

To this end, in recent years, the following power converter configuration has been proposed. That is, the side wall of the casing has an opening extending therethrough in the stacking direction of the stack. The opening is sealed by a cooling plate having a coolant pathway therein from the outside of the casing (see FIG. 62). The cooling plate is secured to the casing using fastening members. Under the action of forces of the pressure applying member, the electronic component is pressed against the cooling plate, thereby cooling the electronic component. The coolant pathway is formed in the cooling plate, which can improve the efficiency of cooling the electronic component.

However, in such a configuration where the electronic component is pressed against the cooling plate using the pressure applying member, forces of the pressure applying member are applied to the cooling plate. Thus, a large stress is liable to be applied to fixing points where the cooling plate is secured to the casing. For example, when the cooling plate is fastened to the casing using the fastening members, a large stress is liable to be applied to the fastening members.

To cure such a deficiency, it can be devised fastening the electronic component to the casing using bolts or the like so that the bolts can receive the force of the pressure applying member. This configuration can prevent forces of the pressure applying member from being applied to the cooling plate. However, the forces of the pressure applying member may be applied to the bolts, and therefore large forces will be applied the bolts. The bolts alone may be unable to receive the forces of the pressure applying member, and therefore the electronic component may not be reliably secured within the casing, which may cause vibration resistance of the electronic component to decrease. The vibration resistance of the electronic component, because the electronic component in the reactor, the DC-to-DC converter or the like, is heavy, is liable to decrease unless the electronic component is reliably secured within the casing.

In consideration of the foregoing, it is desired to have to have a power converter that can improve efficiency of cooling electronic components. It is further desired to have a power converter that can improve efficiency of cooling electronic components, prevent application of large forces of a pressure applying member to a cooling plate, and improve vibration resistance of the electronic components.

SUMMARY

In accordance with a first aspect of the present invention, there is provided a power converter including: a stack of a plurality of semiconductor modules, each of which incorporates semiconductor elements, and a plurality of cooling conduits, though each of which a coolant flows to cool the semiconductor modules; at least one electronic component electrically connected to the semiconductor modules; and a cooling plate for cooling the at least one electronic component. In the power converter, the stack, the at least one electronic component, and the cooling plate are arranged in a stacking direction of the stack. The cooling plate is connected to the cooling conduits and has an intra-plate pathway formed therein thorough which the coolant flows in a direction perpendicular to the stacking direction. The cooling plate has a greater area than each cooling conduit as viewed from the stacking direction.

In the power converter configured as above, the intra-plate pathway through which the coolant flows is formed in the cooling plate.

Therefore, heat can be effectively exchanged between the coolant flowing through the intra-plate pathway and the electronic components, and the electronic components can be effectively cooled.

The cooling plate of the power converter has a larger area than each cooling conduit as viewed from the stacking direction of the stack.

This configuration can increase an area where the cooling plate and the electronic components are in thermal contact with each other, and can effectively cool the electronic components.

Increasing the area of the cooling plate can provide a larger intra-plate pathway that can be formed in the cooling plate, which can improve the efficiency of cooling the electronic components.

Increasing the area of the cooling plate can provide a larger area in contact with air, thereby increasing heat dissipation efficiency of the cooling plate. Therefore, the temperature of the cooling plate can be lowered, which can provide higher efficiency cooling the electronic components.

In accordance with a second aspect of the present invention, there is provided a power converter including: a stack of a plurality of electronic components configuring a power conversion circuit and a plurality of cooling conduits each having a pathway formed therein through which a coolant flows to cool the electronic components; and a plurality of pipes connected to the respective cooling conduits, the plurality of pipes defining pathways of the coolant between any two of the cooling conduits adjacent to each other in a stacking direction of the stack and pathways of the coolant between the cooling conduit that is one of the plurality of the cooling conduits at one end of the stack in its stacking-direction and an external device operative to cool and circulate the coolant. In the power converter, the plurality of cooling conduits include a plurality of communication cooling conduits and at least one separation cooling conduit, each communication cooling conduit being connected to the pipes at both ends in an extensional direction of a pathway of the communication cooling conduit, all the pipes connected to the communication cooling conduit and the pathway in the communication cooling conduit being in fluid communication with each other, the at least one separation cooling conduit having a through hole formed therein and a separator, the through hole being formed at one end of the separation cooling conduit in the extensional-direction and extending therethrough in the stacking direction, the separator being interposed between the through hole and the pathway of the separation cooling conduit to separate them from each other. Flow-channel pipes, of the plurality of pipes, are connected to the pathway of the separation cooling conduit on both sides of the separation cooling conduit in the stacking direction, and through pipes, of the plurality of pipes, are connected to the through hole of the separation cooling conduit on both sides of the separation cooling conduit in the stacking direction. On one side of the separation cooling conduit in the stacking direction, the flow-channel pipe is disposed separately from the through pipe in the extensional direction, and on the other side of the separation cooling conduit in the stacking direction, the flow-channel pipe is disposed adjacent to the through pipe to form a pair of pipes. At least one of the electronic components is disposed adjacent to the pair of pipes in the extensional direction.

The power converter configured as above includes the communication cooling conduits and the separation cooling conduit.

With this configuration, efficiency of cooling the electronic components can be improved. That is, the separation cooling conduit has the pathway and the through hole formed therein, and the pathway and the through hole are separated from each other by the separator. Therefore, the coolant that has flowed through the through hole and the coolant that has flowed through the pathway are not mixed, thus allowing the entire coolant to directly pass through the through hole and the pathway (see FIG. 18). This can prevent the coolant from dividing in the separation cooling conduit, and can increase an amount of coolant that flows though the separation cooling conduit. For example, when the coolant is first conducted through the through hole, the coolant divides and flows through the downstream cooling conduits, then returns to the separation cooling conduit to flow through the pathway of the separation cooling conduit. The entire coolant introduced in the through hole is allowed to flow through the pathway of the separation cooling conduit, which can increase an amount of coolant that flows through the pathway. Efficiency of cooling the electronic components can thus be improved. The same is true if the flow direction of coolant is reversed.

In the power converter, the flow-channel pipe and the through pipe are spaced apart from each other on one side of the separation cooling conduit in the stacking direction. The flow-channel pipe and the through pipe are adjacent to each other on the other side of the separation cooling conduit in the stacking direction to form a pair of pipes. The electronic component is disposed adjacent to the pair of pipes in the extensional direction.

Thus, the pair of pipes (the flow-channel pipe and the through pipe) are disposed in a small area at one end of the separation cooling conduit in the extensional direction while there are no pipes disposed in an opposite area of the separation cooling conduit at the other end in the extensional direction, which allows the opposite area of the separation cooling conduit to be used to cool the electronic component. Therefore, an area of the separation cooling conduit used to cool the electronic component can be increased, which can lead to higher efficiency of cooling the electronic component.

In accordance with a third exemplary aspect of the present invention, there is provided a power converter including: a stack of a plurality of semiconductor modules, each of which incorporates semiconductor elements, and a plurality of cooling conduits, though each of which a coolant flows; an electronic component disposed adjacent to the stack in a stacking direction of the stack and electrically connected to the semiconductor modules; a pressure applying member pressing the stack against the electronic component; a casing housing the stack, the electronic component, and the pressure applying member, the casing having an adjacent side wall that is one of side walls of the casing, adjacent to the electronic component in the stacking direction, the adjacent side wall having an opening that opens toward the stacking direction; and a cooling plate having a pathway formed therein, through which the coolant flows, the cooling plate sealing the opening from the outside of the casing, the cooling plate being secured to the casing so as to cool the electronic component from an opposite side of the electronic component from a side thereof on which the stack is disposed. In the power converter, the electronic component includes a body electrically connected to the semiconductor modules and at least one protrusion protruding from the body, and is fastened to the casing. The casing includes an abutment that the at least one protrusion abuts from the stacking direction.

In the power converter configured as above, the adjacent side wall of the casing has the opening formed therein. The opening is sealed by the cooling plate from the outside of the casing and the cooling plate is secured to the casing. The electronic component is cooled using the cooling plate.

The electronic component can thereby be effectively cooled by the cooling plate having a coolant pathway therein.

In addition, in the power converter configured as above, the protrusion is formed on the electronic component such that the protrusion abuts the abutment of the casing from the stacking direction.

With this configuration, forces applied from the pressure applying member to the electronic component can be received by the abutment. Therefore, the electronic component can be secured within the casing, and vibration resistance of the electronic component can be improved.

In this configuration, the protrusion abuts the abutment of the casing. Therefore, the body of the electronic component is less liable to be pressed against the cooling plate. That is, the forces of the pressure applying member are less liable to be applied to the cooling plate via the body, which can prevent heavy loading of fixing points where the cooling plate is secured to the casing. For example, when the cooling plate is fastened to the casing using the fastening member, heavy loading of the fastening member can be prevented.

DESCRIPTION OF SPECIFIC EMBODIMENTS

Figure 1:
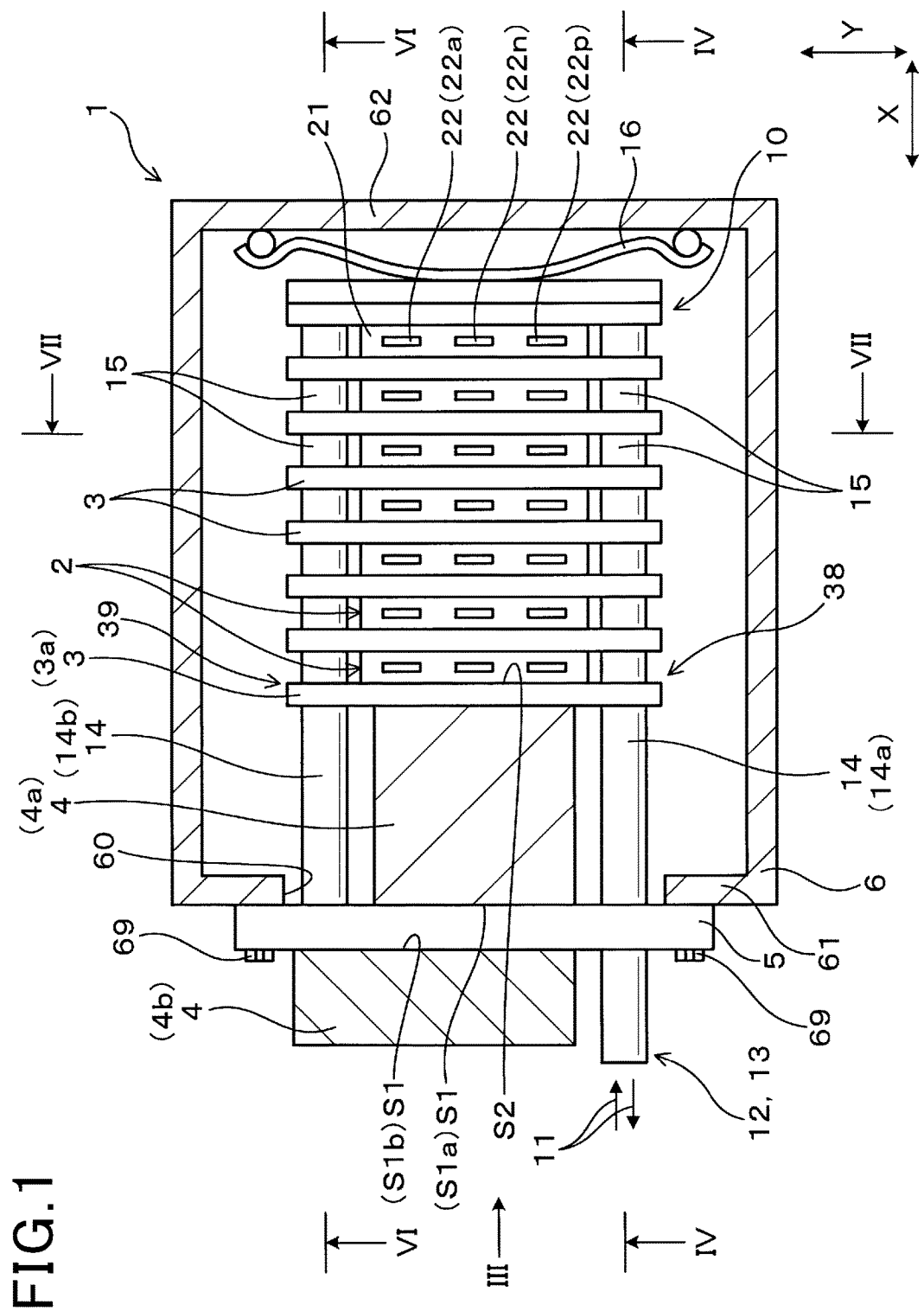
FIG. 1 is a cross-sectional view of a power converter taken along line I-I of FIG. 7, in accordance with a first embodiment of the present invention.

Hereinafter, exemplary embodiments of the present disclosure will be described in detail with reference to the accompanying drawings, in which like reference numerals refer to like or similar elements regardless of reference numerals and duplicated description thereof will be omitted.

A power converter of the present invention may be configured to be mounted in an electrical vehicle, a hybrid vehicle or the like.

First Embodiment

A power converter in accordance with a first embodiment of the present invention will now be described with reference to FIGS. 1-8. As shown in FIG. 1, the power converter 1 of the present embodiment contains a stack 10, electronic components 4, and a cooling plate 5. The stack 10 is formed by stacking a plurality of semiconductor modules 2 and a plurality of cooling conduits 3.

Figure 8:
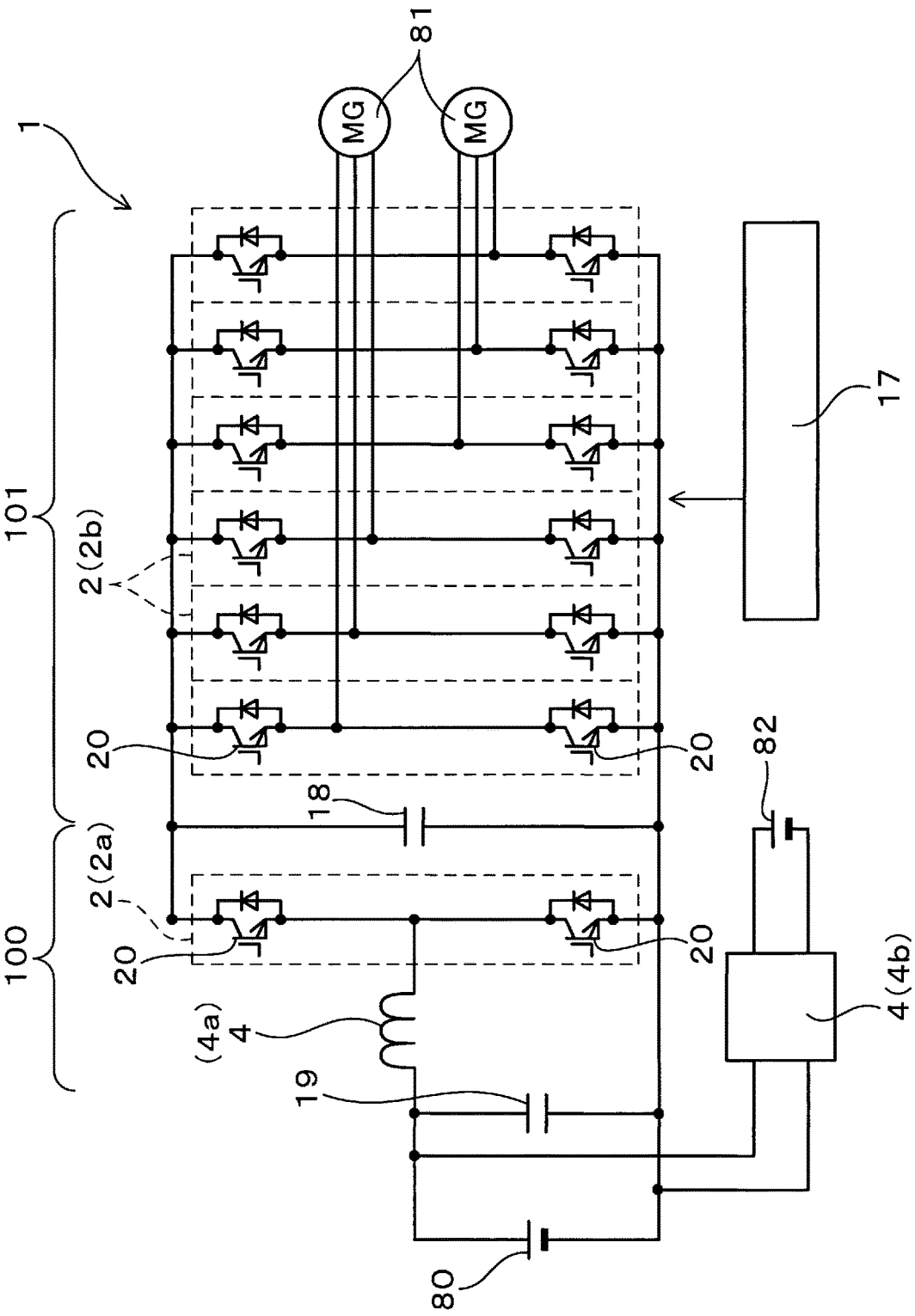
FIG. 8 is a circuit diagram of the power converter of the first embodiment.

Each semiconductor module 2 contains semiconductor elements 20 (see FIG. 8). An intra-pipe pathway 30 that a coolant 11 flows through is formed in each cooling conduit 3 (see FIG. 5). The semiconductor module 2 is cooled by exchanging heat between the coolant 11 and the semiconductor module 2.

The electronic components 4(4a, 4b) are electrically connected to the semiconductor modules 2 (see FIG. 8). Each electronic component 4 has a larger volume than the semiconductor modules 2.

The cooling plate 5 is provided to cool the electronic components 4.

As shown in FIG. 1, the cooling plate 5 is disposed such that its thickness direction coincides with a stacking direction (that is an X-direction) of the stack 10. The stack 10, the electronic components 4, and the cooling plate 5 are aligned in the X-direction.

The cooling plate 5 is connected to the cooling conduits 3 by a pair of pipes 14(14a, 14b). As shown in FIGS. 2-6, an intra-plate pathway 50 through which the coolant 11 flows in a direction perpendicular to the X-direction is formed in the cooling plate 5.

Figure 2:
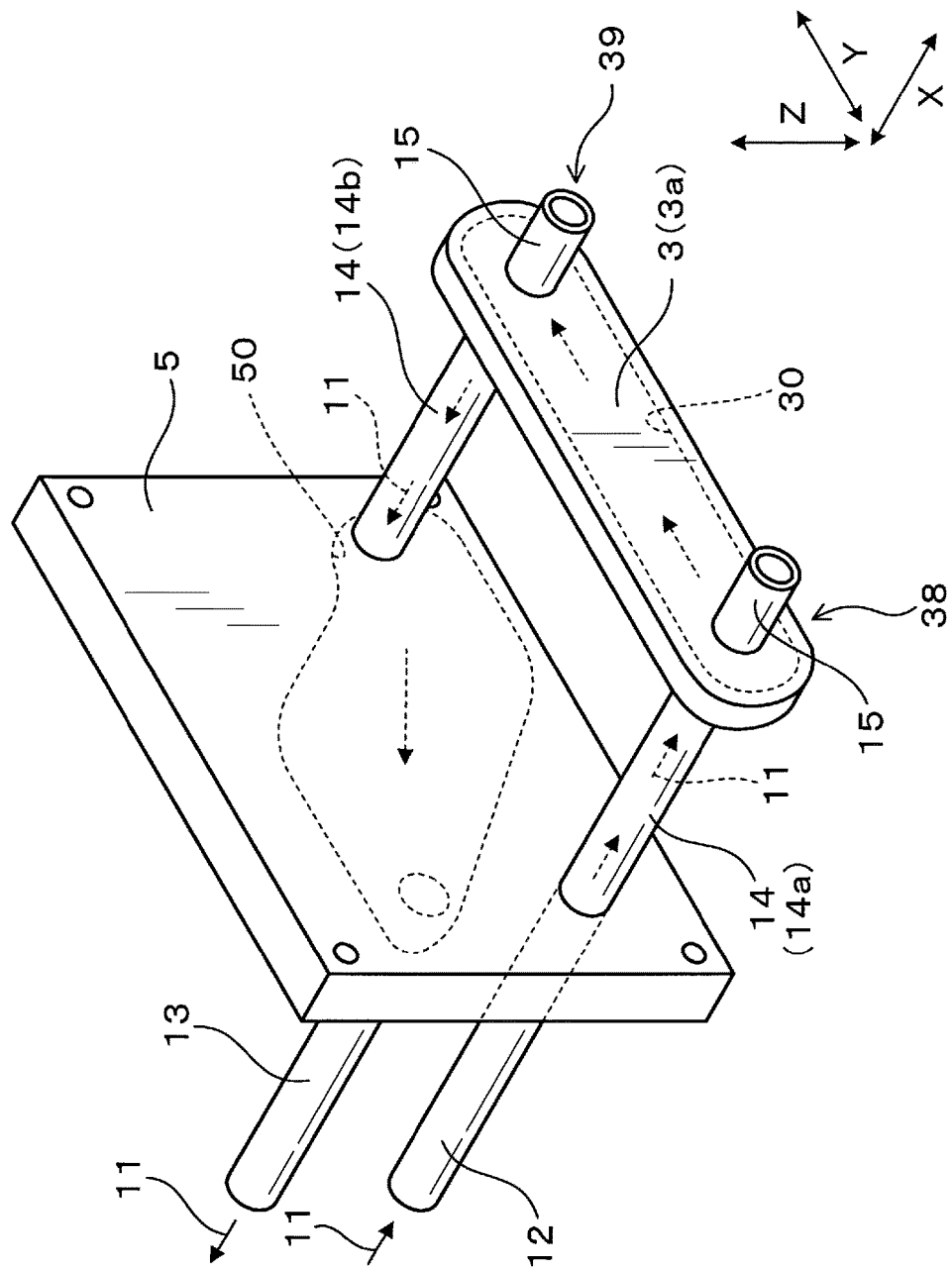
FIG. 2 is a perspective view of a cooling plate and a cooling conduit of the first embodiment.

As shown in FIG. 2, the cooling plate 5 has a larger surface area than the cooling conduits 3 as viewed from the X-direction.

The power converter 1 may be a vehicle-mounted power converter for an electrical vehicle, a hybrid vehicle or the like. As shown in FIG. 1, the power converter 1 contains two electronic components 4 that are a first electronic component 4a and a second electronic component 4b, where the first electronic component 4a is a reactor and the second electronic component 4b is a DC-to-DC converter. As shown in FIG. 8, a boost circuit 100 is formed of a semiconductor module 2a that is one of the plurality of semiconductor modules 2, the first electronic component 4a, and a filter capacitor 19, and configured to step up a voltage of the DC power source 80.

The inverter circuit 101 is formed of the other semiconductor modules 2b and a smoothing capacitor 18. The stepped-up DC power is converted into alternating-current (AC) power by switching on and off the semiconductor elements 20 in each semiconductor module 2b. The vehicle is driven by driving an AC load 81 that is a three-phase AC motor.

The second electronic component 4b, that is, the DC-to-DC converter, is electrically connected in parallel with the filter capacitor 19. The low-voltage battery 82 is charged by the DC-to-DC converter stepping down the voltage of the DC power source 80.

Figure 7:
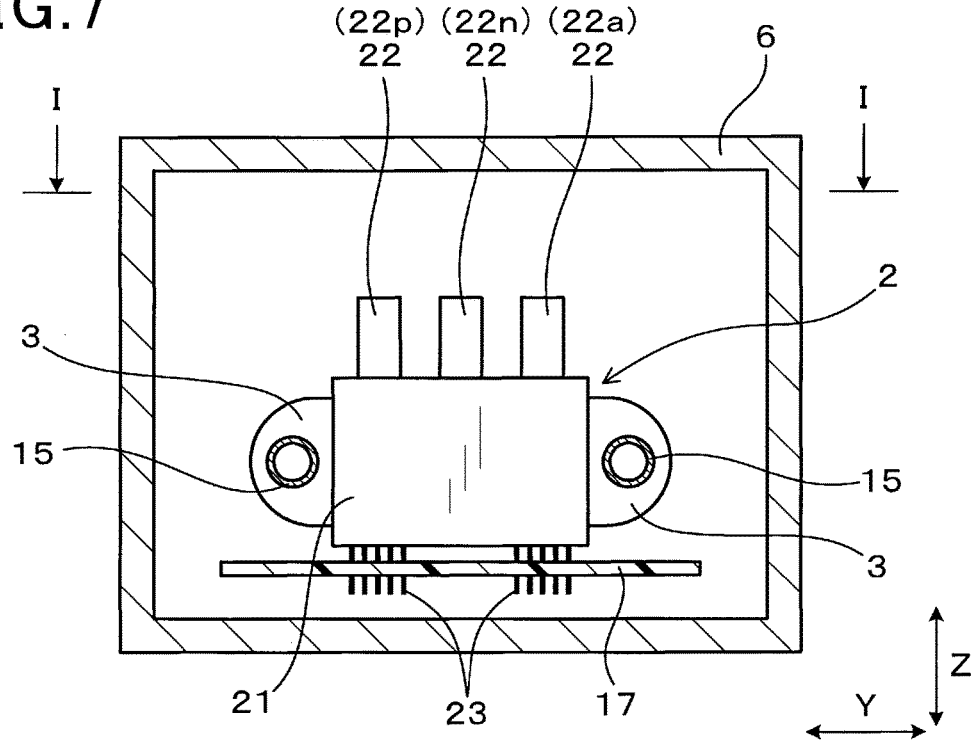
FIG. 7 is a cross-sectional view of the power converter taken along line VII-VII of FIG. 1.

As shown in FIG. 7, each semiconductor module 2 has a body 21 incorporating therein the semiconductor elements 20 (see FIG. 8), and power terminals 22 and control terminals 23 protruding from the body 21. The power terminals 22 include DC terminals 22p and 22n to which a DC voltage is applied and an AC terminal 22a to which the AC load 81 is electrically connected. The power terminals 23 are electrically connected to a control circuit board 17 used to control switching of the semiconductor elements 20.

As shown in FIG. 1, the power converter 1 includes a casing 6 accommodating the stack 10 and the first electronic components 4a. The casing 60 has an opening extending in the X-direction. The opening 60 is sealed from the outside of the casing 6 by the cooling plate 5. The cooling plate 5 is bolted to the casing 6 by bolts 69.

The first electronic components 4a is interposed between the cooling plate 5 and the stack 10. The second electronic components 4b is disposed on the opposite side of the cooling plate 5 from the side that the first electronic components 4a is disposed on. The two electronic components 4, i.e., the first electronic components 4a and the second electronic components 4b, are cooled by the cooling plate 5.

A pressure applying member 16, such as a plate spring, is disposed within a wall 62 of the casing 6 and the stack 10. The stack 10 is pressed against the first electronic component 4a by the pressure applying member 16. With such a configuration, the stack 10 is fastened within the casing 6 while ensuring a contact pressure between the cooling conduits 3 and the semiconductor modules 2.

Any two cooling conduits 3 adjacent to each other in the X-direction are connected by two connecting pipes 15 disposed on both ends of each cooling conduit 3 in a width direction (i.e., the Y-direction) that is perpendicular to a protruding direction (i.e., the Z-direction) of the power terminals 22 and to the X-direction.

Figure 3:
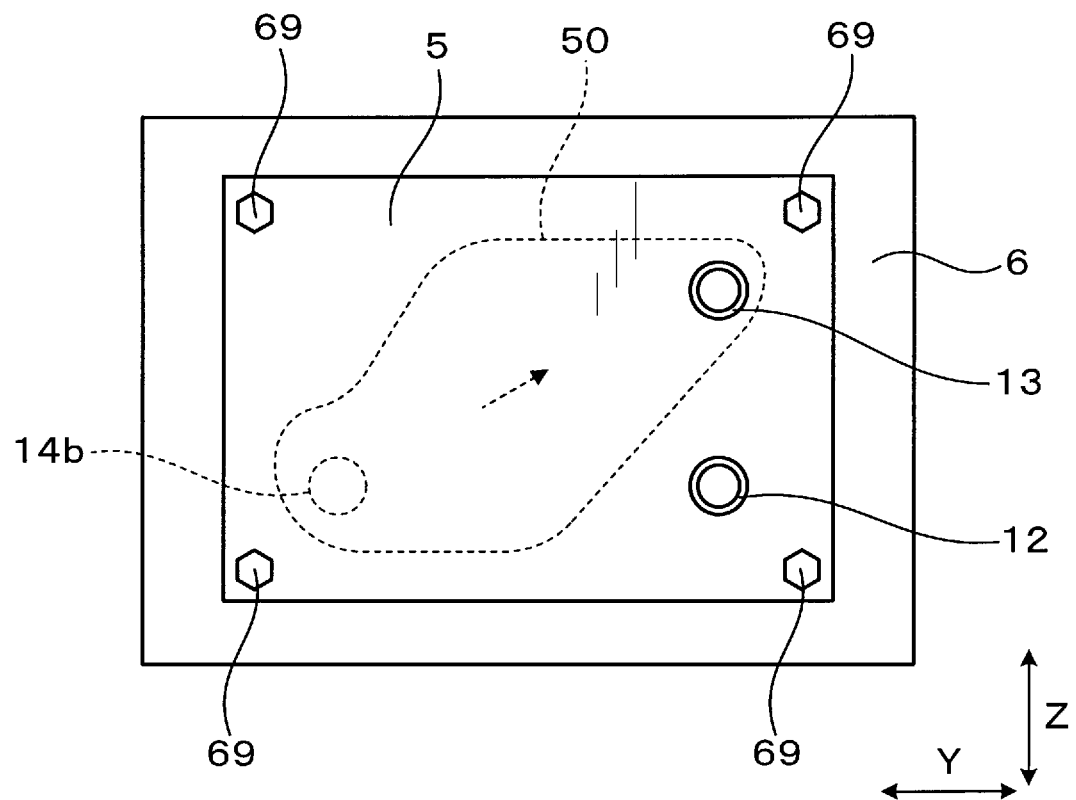
FIG. 3 is a side view of the power converter of the first embodiment as viewed from a III-direction of FIG. 1, where an electronic component outside a casing is removed.
Figure 4:
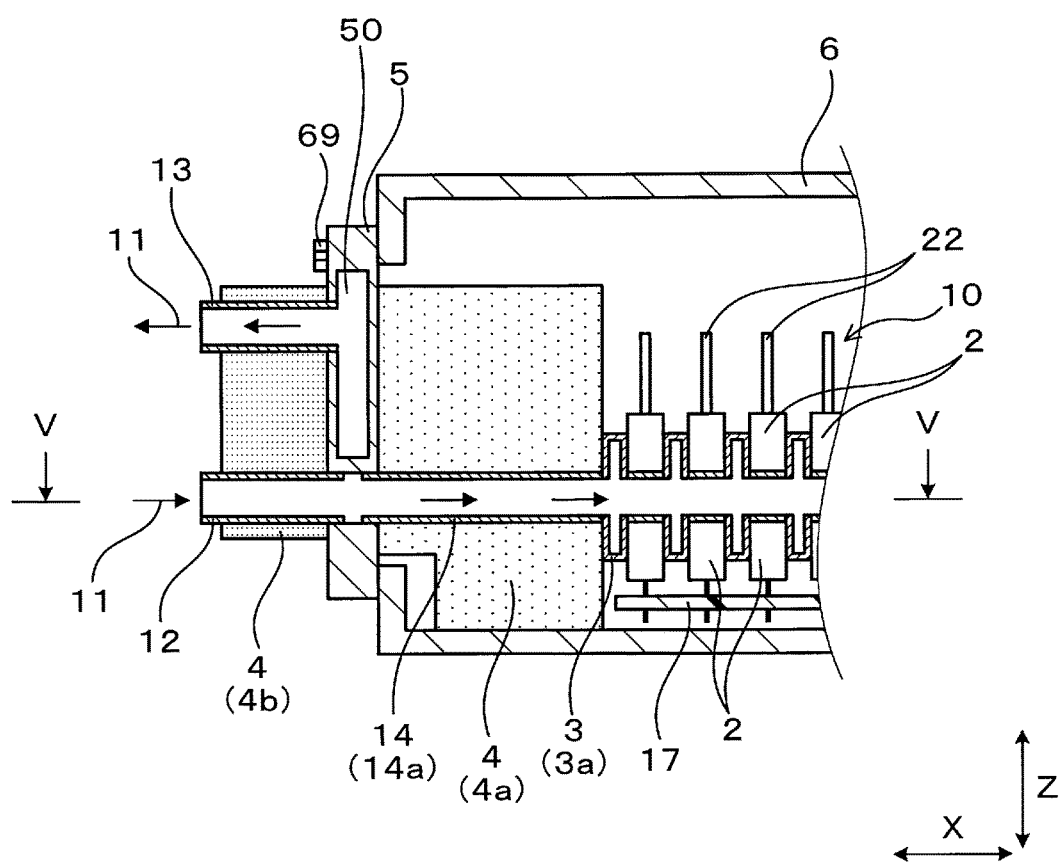
FIG. 4 is a cross-sectional view of the power converter taken along line IV-IV of FIG. 1.

As shown in FIGS. 1-3, an inlet pipe 12 for the coolant 11 to be introduced into and an outlet pipe 13 for the coolant 11 to be led out from are connected to the cooling plate 5. The inlet pipe 12 and the outlet pipe 13 are mutually overlapped as viewed from the Z-direction.

As shown in FIGS. 1 and 2, two pipes 14(14a, 14b) are provided within the casing 6. These two pipes 14 are interposed between the cooling plate 5 and the stack 10. The pipes 14 include an inlet-side pipe 14a connected to the inlet pipe 12 and an outlet-side pipe 14b through which the coolant 11 flows after passing through the cooling conduits 3.

The two pipes 14 connect an end cooling conduit 3a and the cooling plate 5, where the end cooling conduit 3a is one of the plurality of cooling conduits 3 included in the stack 10 that is closest to the first electronic component 4a in the X-direction. The inlet-side pipe 14a is connected to one end 38 of the end cooling conduit 3a in the Y-direction. The outlet-side pipe 14b is connected to the other end 39 of the end cooling conduit 3a in the Y-direction. The two pipes 14a, 14b are longer than each connecting pipe 15 in the X-direction. The first electronic component 4a is interposed between the two pipes 14a, 14b.

As shown in FIGS. 2-6, the intra-plate pathway 50 that the coolant 11 flows through is formed in the cooling plate 5. The intra-plate pathway 50 has a larger area than the intra-pipe pathway 30 (see FIG. 5) formed in each cooling conduit 3 as viewed from the X-direction.

Figure 5:
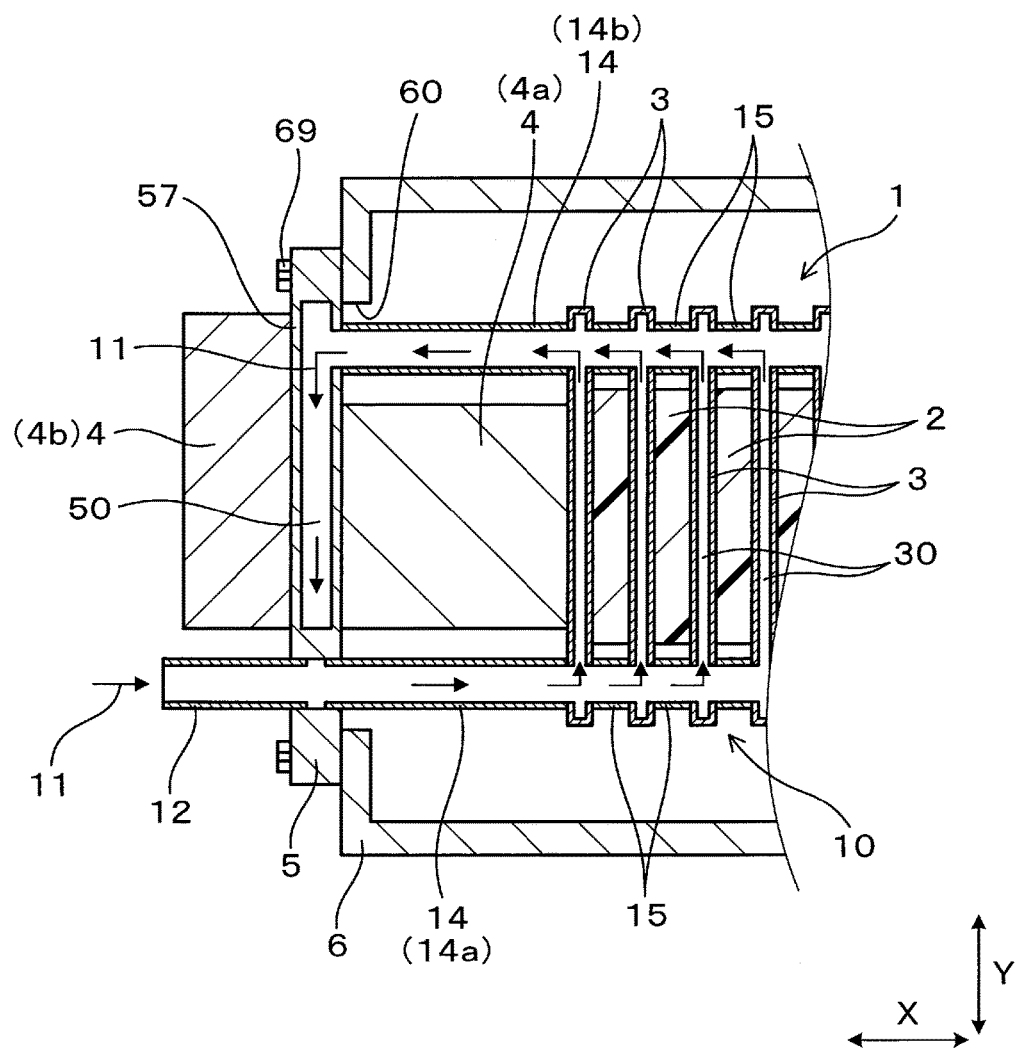
FIG. 5 is a cross-sectional view of the power converter taken along line V-V of FIG. 4.
Figure 6:
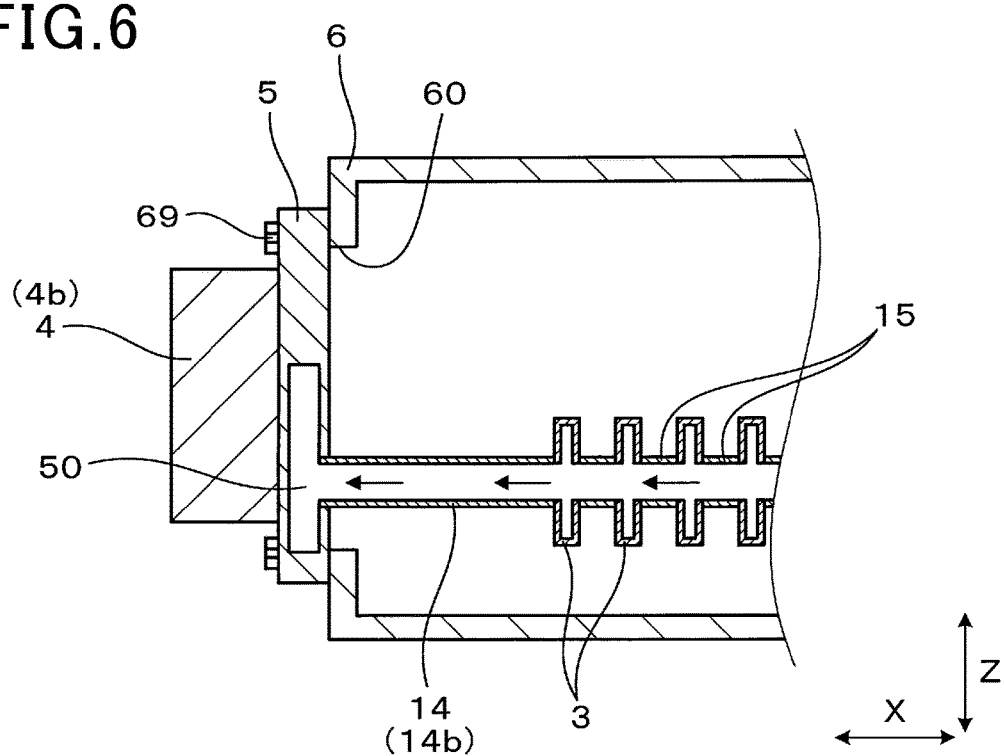
FIG. 6 is a cross-sectional view of the power converter taken along line VI-VI of FIG. 1.

As shown in FIG. 5, the coolant 11 introduced into the inlet pipe 12 flows through the inlet-side pipe 14a, divides and flows through the plurality of cooling conduits 3 (i.e., the intra-pipe pathways 30) via the respective connecting pipes 15. Thereafter, the separate coolant flows 11 that have passed through the respective cooling conduits 3 merge and flow through the outlet-side pipe 14b and the intra-plate pathway 50, and then leave through the outlet pipe 13. Thus, the semiconductor modules 2 and the electronic components 4a, 4b are cooled by the coolant 11 flowing through the intra-pipe pathways 30 and the intra-plate pathway 50.

Advantages of the present embodiment will now be described. As shown in FIGS. 2 and 5, the intra-plate pathway 50 through which the coolant 11 flows within the cooling plate 5 is formed.

Therefore, heat can be exchanged between the coolant 11 that flows through the intra-plate pathway 50 and the electronic components 4, which allows the electronic components 4 to be cooled effectively.

The cooling plate 5 of the present embodiment has a larger area than the cooling conduits 3 as viewed from the X-direction.

Therefore, an area where the cooling plate 5 is in thermal contact with the electronic components 4 can be increased, which can lead to higher efficiency of cooling the electronic components 4.

Increasing the area of the cooling plate 5 allows a large intra-plate pathway 50 to be formed in the cooling plate 5. Thus, the efficiency of cooling the electronic components 4 can be improved.

A contact area of the cooling plate 5 with air increases with increasing area of the cooling plate 5, which can lead to higher heat dissipation efficiency of the cooling plate 5. Therefore, a temperature of the cooling plate 5 can be lowered, which can further improve efficiency of cooling the electronic components 4.

Figure 16:
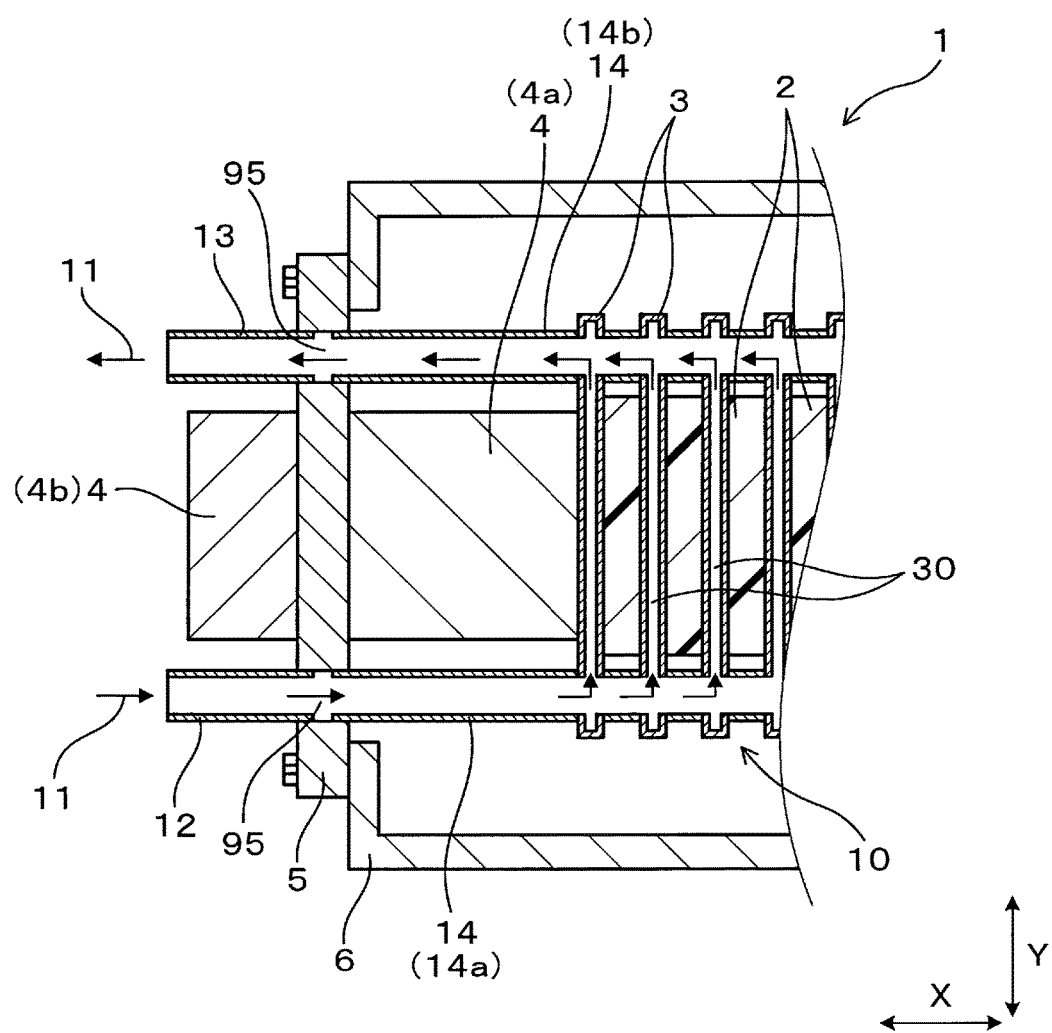
FIG. 16 is a cross-sectional view of a power converter in a comparative example.

In the present embodiment, the coolant 11 flows through the intra-plate pathway 50 in a direction perpendicular to the X-direction. Therefore, increasing the area of the cooling plate 5 can improve efficiency of cooling the electronic components 4. For example, assuming that within the cooling plate 5, the coolant 11 flows through a pathway 95 in the X-direction as shown in FIG. 16, the coolant 11 does not flow adjacent to the electronic components 4. Thus, the coolant 11 provides no contribution to cooling the electronic components 4. Therefore, even though the area of the cooling plate 5 is increased, the efficiency of cooling the electronic components 4 cannot be sufficiently improved.

In the present embodiment, as shown in FIGS. 2 and 5, a pathway (i.e., the intra-plate pathway 50) that the coolant 11 flows through in a direction perpendicular to the X-direction is formed in the cooling plate 5. This configuration allows the coolant 11 to flow adjacent to the electronic components 4 in the X-direction. Increasing the area of the cooling plate 5 allows for increasing the area of the intra-plate pathway 50, thereby facilitating heat exchange between the electronic components 4 and the coolant 11. Thus, efficiency of cooling the electronic components 4 can be improved.

In the present embodiment, as shown in FIG. 1, an opening 60 extending in the X-direction is formed in the casing 6. The opening 60 is sealed by the cooling plate 5.

Forming the opening 60 as above can reduce an amount of metal material used to produce the casing 6, thereby reducing the weight and production cost of the casing 6. In addition, a pathway in the cooling plate 5 that is a separate member from the casing 6 can be more readily formed than a pathway in a side wall 61 of the casing 6. Forming the cooling plate 5 having a pathway (i.e., the intra-plate pathway 50) therein and attaching the cooling plate 5 to the casing 6 can facilitate producing the casing 6.

Contact between the cooling plate 5 and the casing 6 allows heat to be transferred from the cooling plate 5 to the casing 6. This can further lower the temperature of the cooling plate 5, which can provide higher efficiency of cooling the electronic components 4.

In the present embodiment, an area S1(S1a, S1b) of each electronic component 4, facing the cooling plate 5, is greater than an area S2 of each semiconductor module 2, facing the cooling conduits 3.

This configuration can increase the area of each electronic component 4, facing the cooling plate 5, and can thus improve efficiency of cooling the electronic components 4.

As shown in FIG. 1, the power converter 1 of the present embodiment includes two electronic components 4a, 4b, that is, the first electronic component 4a and the second electronic component 4b. The cooling plate 5 is interposed between the two electronic components 4a, 4b.

Therefore, the electronic components 4a, 4b can be cooled by the cooling plate 5.

In the present embodiment, as shown in FIG. 1, the first electronic component 4a is interposed between the end cooling conduit 3a and the cooling plate 5.

This configuration allows the first electronic component 4a to be cooled using the end cooling conduit 3a and the cooling plate 5 and can thus further improve efficiency of cooling the first electronic components 4a.

In the present embodiment, as shown in FIGS. 2 and 3, the inlet pipe 12 and the outlet pipe 13 are arranged such that they become superimposed upon each other as viewed from the Z-direction. Therefore, as shown in FIG. 5, one side 57 of the cooling plate 5 that is opposite from the side of cooling plate 5, connected to the outlet pipe 14b, may be used to cool the second electronic components 4b. This configuration can increase an area of the cooling plate 5, used to cool the second electronic component 4b.

As above, the power converter of the present embodiment can further improve efficiency of cooling the electronic components.

In the present embodiment, as shown in FIG. 2, the coolant 11 introduced into the inlet pipe 12 flows through the cooling conduits 3 and then flows within the cooling plate 5. Alternatively, the flow direction may be reversed. That is, the coolant 11 may flow within the cooling plate 5 and may then flow through the cooling conduits 3.

In the present embodiment, the reactor and the DC-to-DC converter are employed as the electronic components 4 to be cooled by the cooling plate 5. Alternatively, for example, a smoothing capacitor 18 or the like (see FIG. 8) may be cooled by the cooling plate 5.

Second Embodiment

Figure 9:
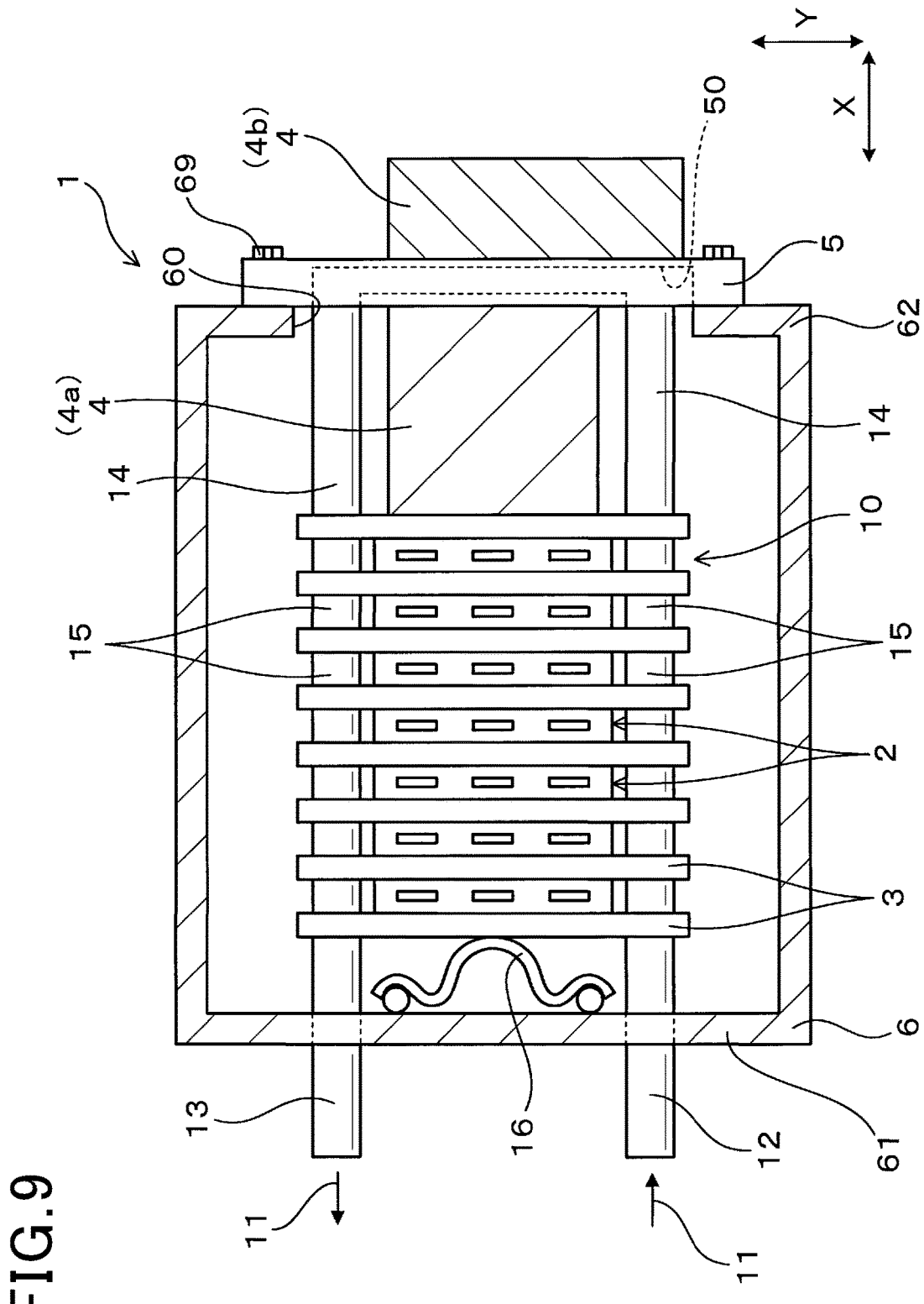
FIG. 9 is a cross-sectional view of a power converter in accordance with a second embodiment of the present invention.

In the present embodiment, positions of the electronic components 4 and the cooling plate 5 are modified. As shown in FIG. 9, an opening 60 is formed in one of the walls of the casing 6 (a second wall 62), opposite from another wall (a first wall 61) to which the inlet pipe 12 and the outlet pipe 13 are attached. The opening 60 is sealed by the cooling plate 5.

As in the first embodiment, the intra-plate pathway 50 is formed in the cooling plate 5. The first electronic component 4a is interposed between the cooling plate 5 and the stack 10. The second electronic component 4b is disposed on a side of the cooling plate 5 opposite from a side on which the first electronic component 4a is provided. The two electronic components 4a, 4b are cooled by the cooling plate 5.

As shown in FIG. 9, a pressure applying member 16 is provided between the first wall 61 and the stack 10. The stack 10 is pressed against the cooling plate 5 by the pressure applying member 16. Thus, the stack 10 can be fastened within the casing 6.

The coolant 11 introduced into the inlet pipe 12 divides and flows through the plurality of cooling conduits 3 and the cooling plate 5. Thereafter, the separate coolant flows 11 that have passed through the respective cooling conduits 3 and the cooling plate 5 merge and leave through the outlet pipe 13. The semiconductor modules 2 and the electronic components 4a, 4b are thereby cooled.

The present embodiment can also provide similar advantages to those of the first embodiment.

Third Embodiment

Figure 10:
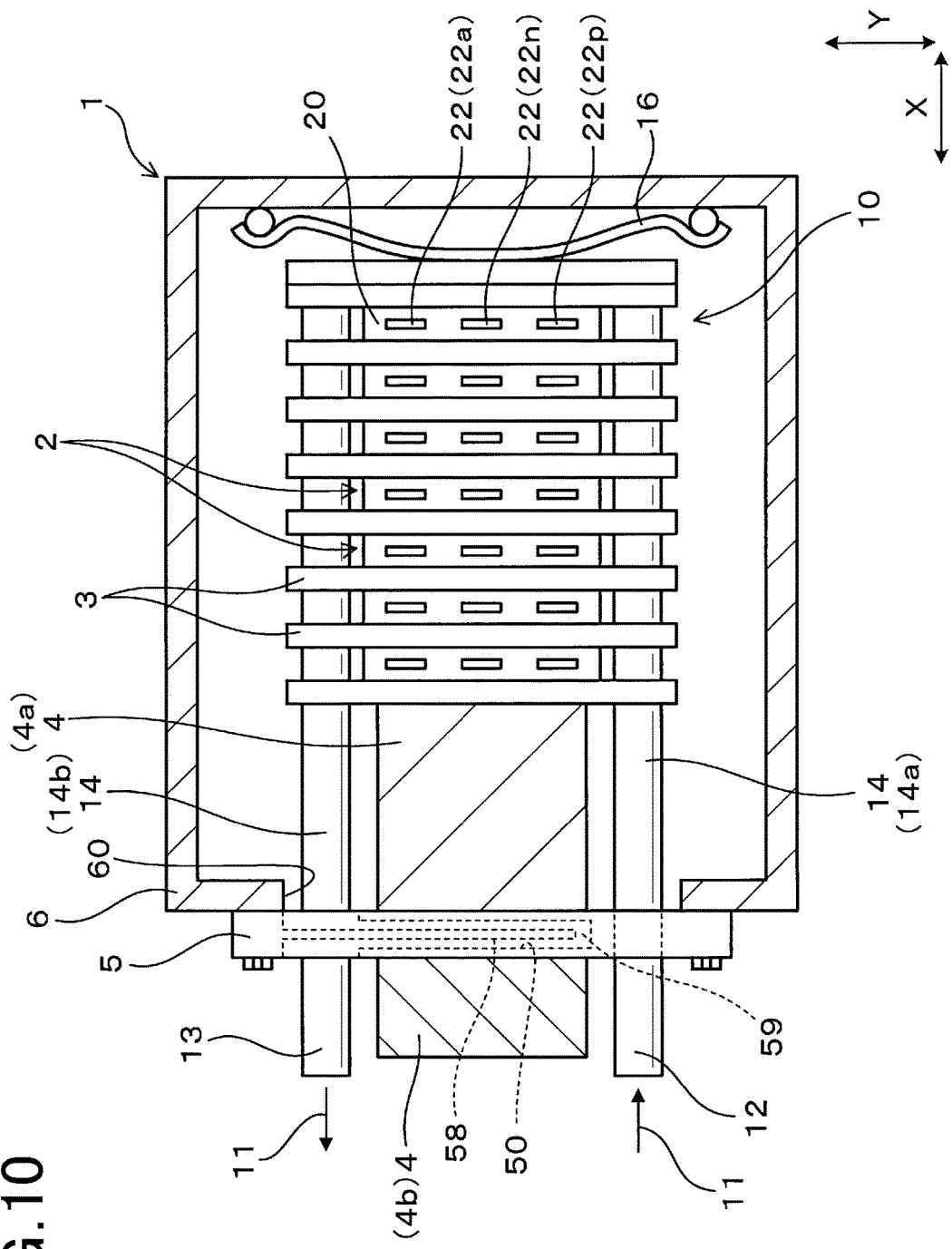
FIG. 10 is a cross-sectional view of a power converter in accordance with a third embodiment of the present invention.
Figure 11:
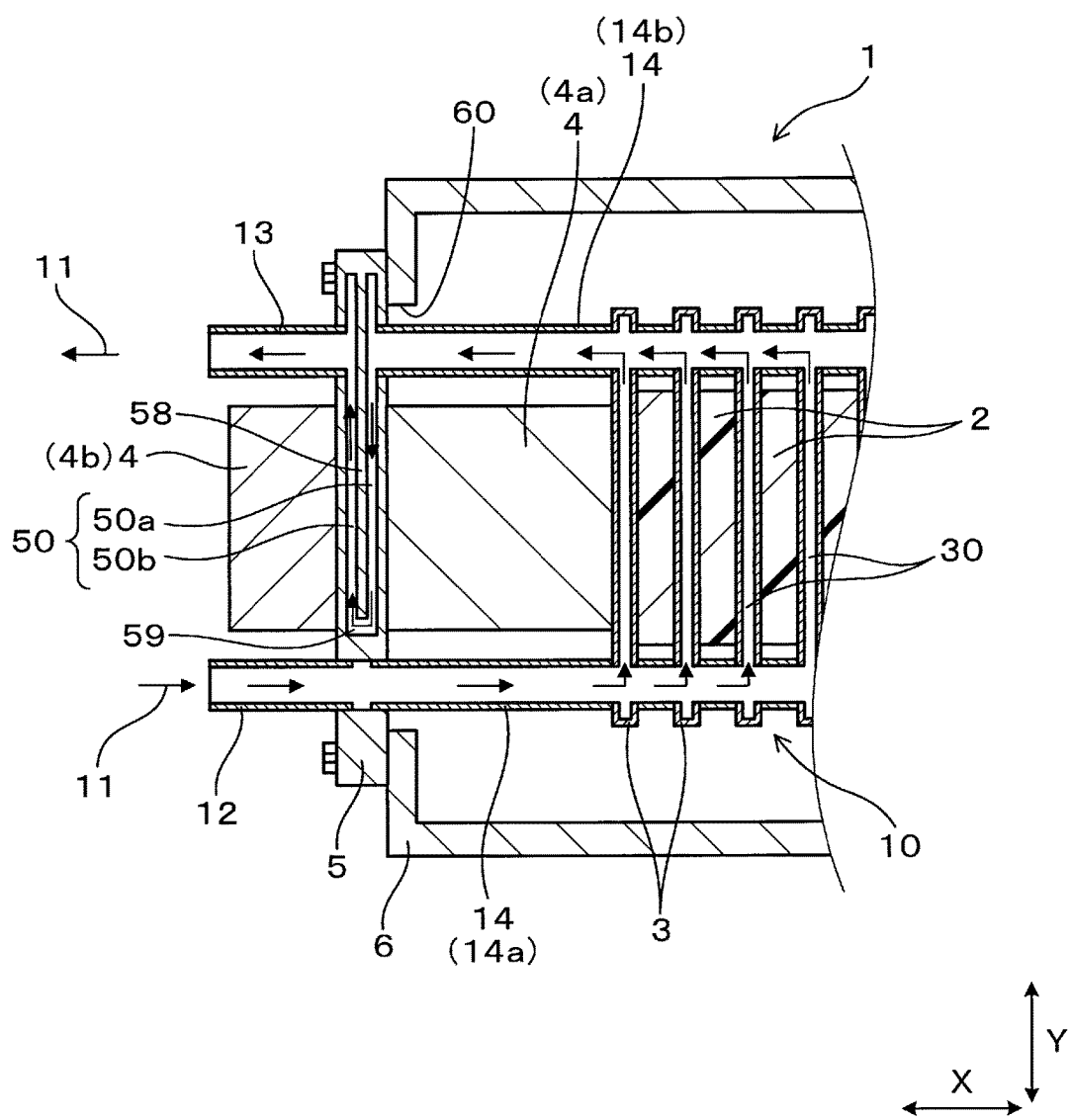
FIG. 11 is an expanded view of the power converter of FIG. 10.
Figure 12:
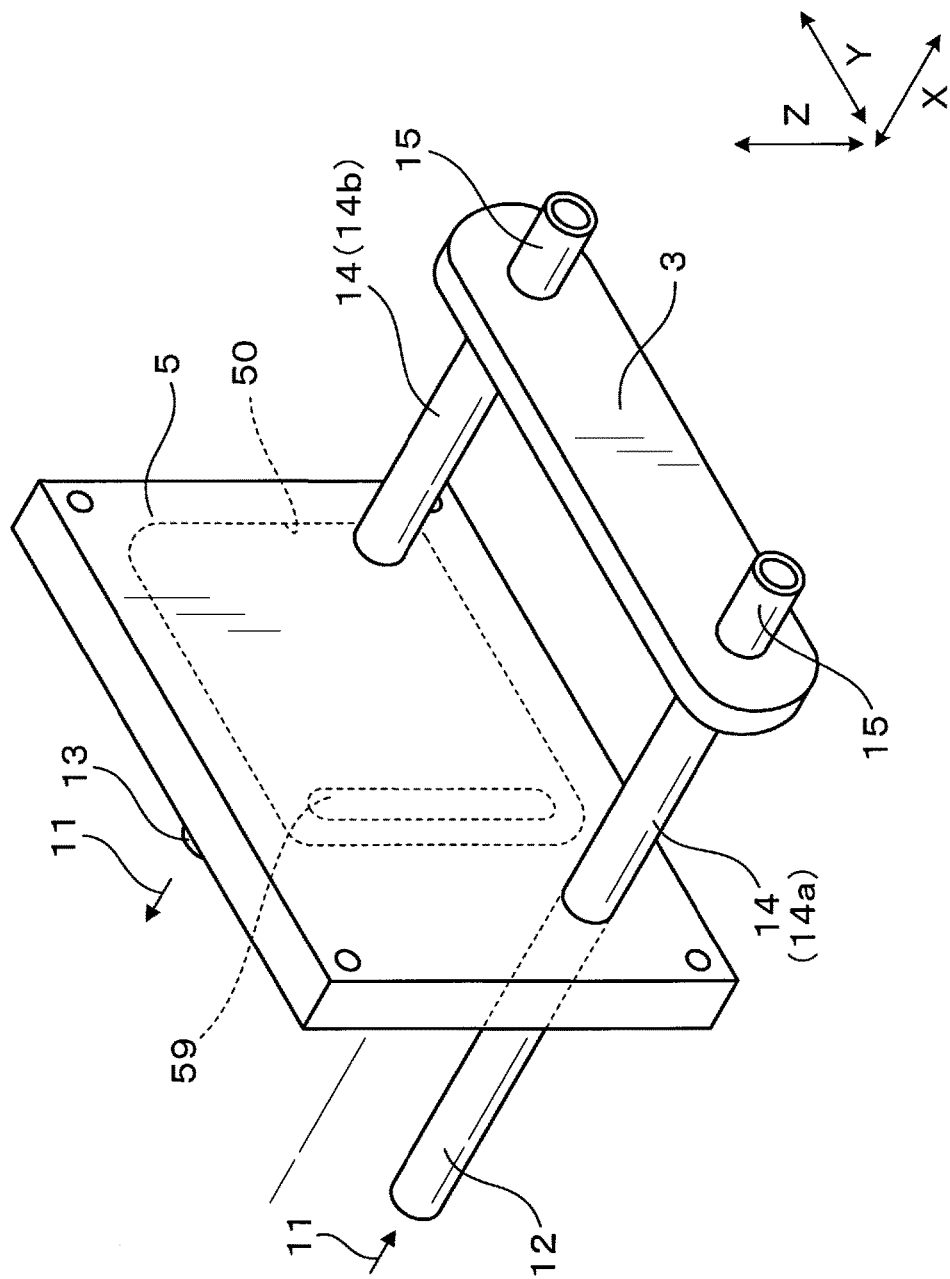
FIG. 12 is a perspective view of a cooling plate and a cooling conduit of the third embodiment.

In the present embodiment, a configuration of the cooling plate 5 is modified. As shown in FIGS. 10-12, the inlet pipe 12 and the outlet pipe 13 are attached to the cooling plate 5. The inlet pipe 12 is superimposed upon the inlet-side pipe 14a as viewed from the X-direction, and the outlet pipe 13 is superimposed upon the outlet-side pipe 14b as viewed from the X-direction.

As shown in FIG. 11, a medium plate 58 is provided in the cooling plate 5. The intra-plate pathway 50 is partitioned by the medium plate 58 into a first portion 50a and a second portion 50b. The coolant 11 that has passed through the outlet-side pipe 14b flows through the first portion 50a, a halfway point 59, and the second portion 50b, and is led out from the outlet pipe 13. The two electronic components 4(4a, 4b) are cooled by the coolant 11 flowing within the cooling plate 5.

The present embodiment can also provide similar advantages to those of the first embodiment.

Fourth Embodiment

Figure 13:
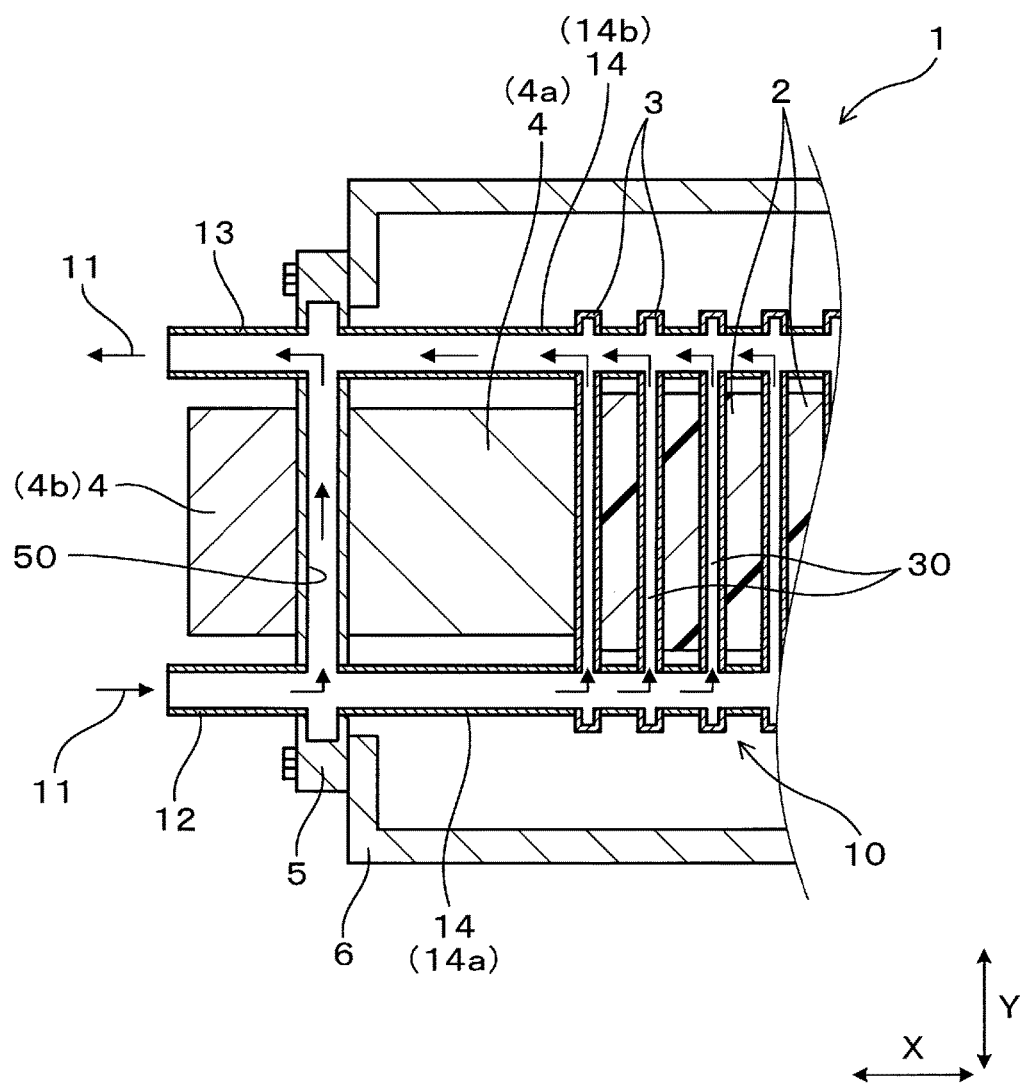
FIG. 13 is a cross-sectional view of a power converter in accordance with a fourth embodiment of the present invention.

In the present embodiment, the cooling plate 5 is modified in shape and position. As shown in FIG. 13, the inlet pipe 12 and the outlet pipe 13 are connected to the cooling plate 5. The coolant 11 introduced into the inlet pipe 12 divides and flows through the intra-plate pathway 50 and the plurality of intra-pipe pathways 30. Thereafter, the coolants 11 that have passed through the intra-plate pathway 50 and the respective cooling conduits 3 merge and then are led out from the outlet pipe 13.

Some of the coolant 11 introduced into the inlet pipe 12 flows through the intra-plate pathway 50 without entering the intra-pipe pathways 30, which allows a low-temperature coolant 11 to flow through the intra-plate pathway 50. Thus, higher efficiency of cooling the electronic components 4a, 4b can be achieved.

The present embodiment can also provide similar advantages to those of the first embodiment.

Fifth Embodiment

Figure 14:
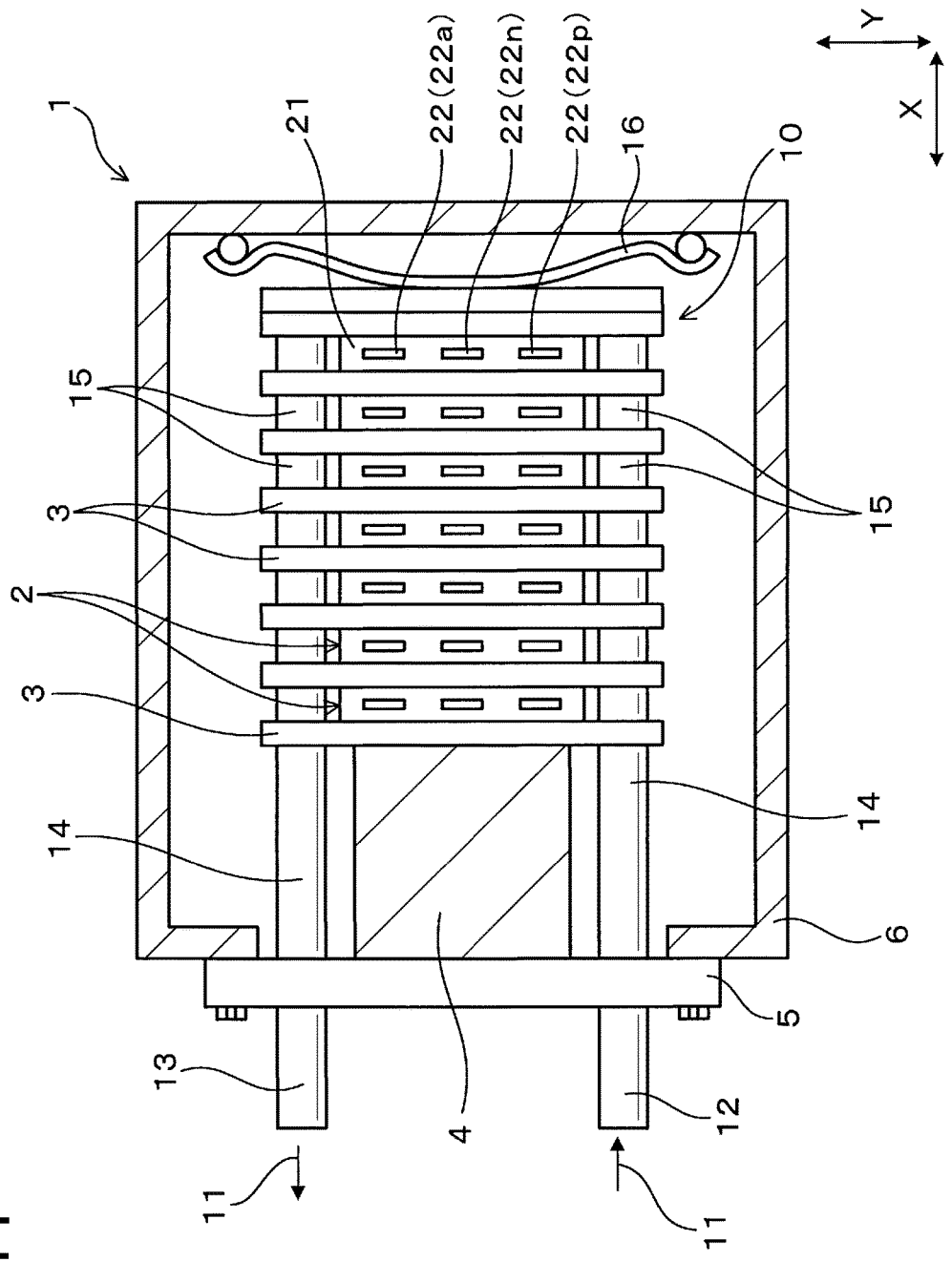
FIG. 14 is a cross-sectional view of a power converter in accordance with a fifth embodiment of the present invention.

In the present embodiment, the number of electronic components 4 is modified. As shown in FIG. 14, a single electronic component 4 is cooled by the cooling plate 5. The electronic component 4 is disposed inside the casing 6. The electronic component 4 is interposed between the cooling plate 5 and the cooling conduits 3. The electronic component 4 is cooled by the cooling plate 5 and the cooling conduits 3.

The present embodiment can also provide similar advantages to those of the first embodiment.

Sixth Embodiment

Figure 15:
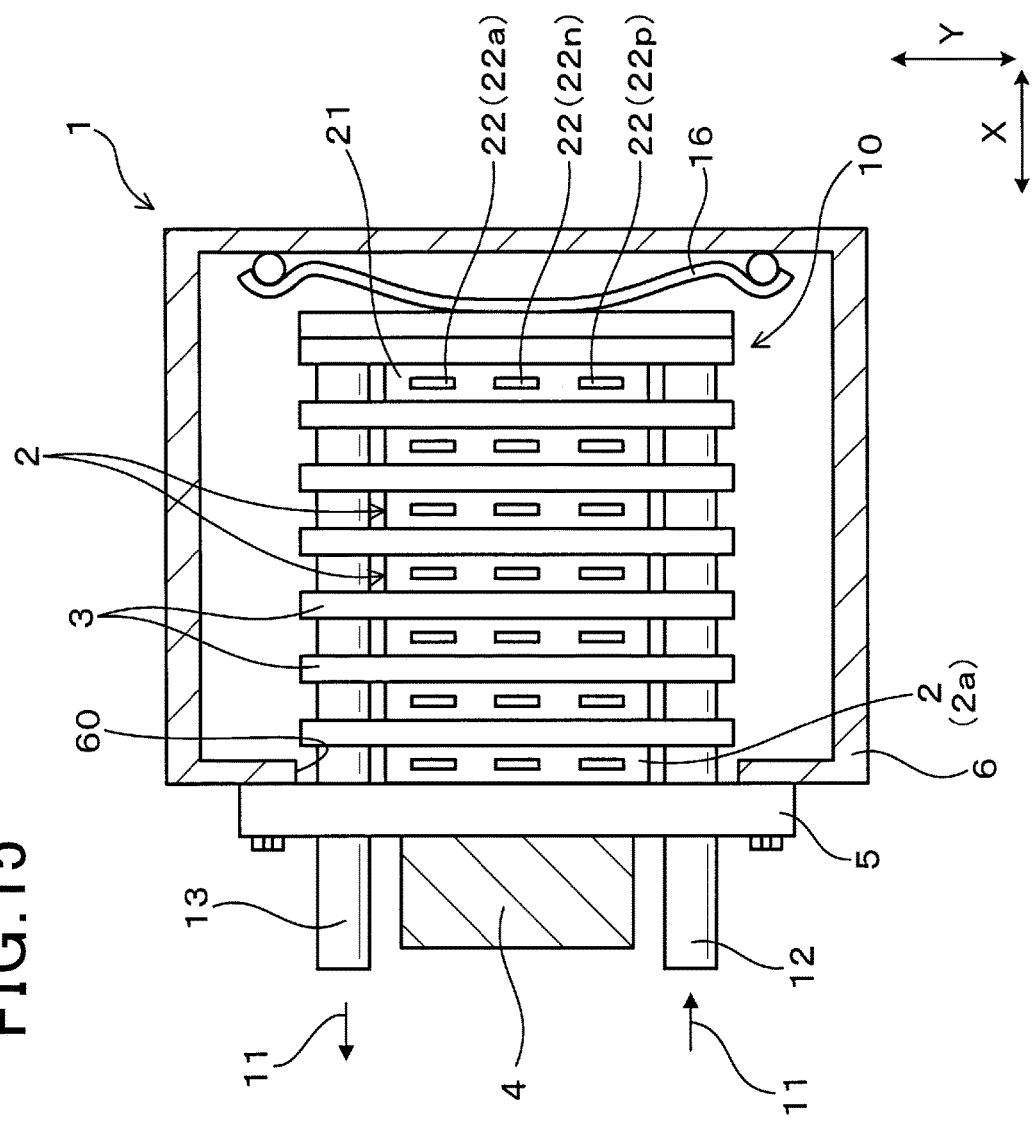
FIG. 15 is a cross-sectional view of a power converter in accordance with a sixth embodiment of the present invention.

In the present embodiment, the number of electronic components 4 is modified. As shown in FIG. 15, a single electronic component 4 is cooled using the cooling plate 5. The electronic component 4 is disposed outside the casing 6. The semiconductor modules 2a are disposed on one side of the cooling plate 5 that is opposite from the other side of cooling plate 5 on which the electronic component 4 is provided. The semiconductor modules 2a and the electronic component 4 are cooled using the cooling plate 5.

The present embodiment can also provide similar advantages to those of the first embodiment.

Seventh Embodiment

Figure 17:
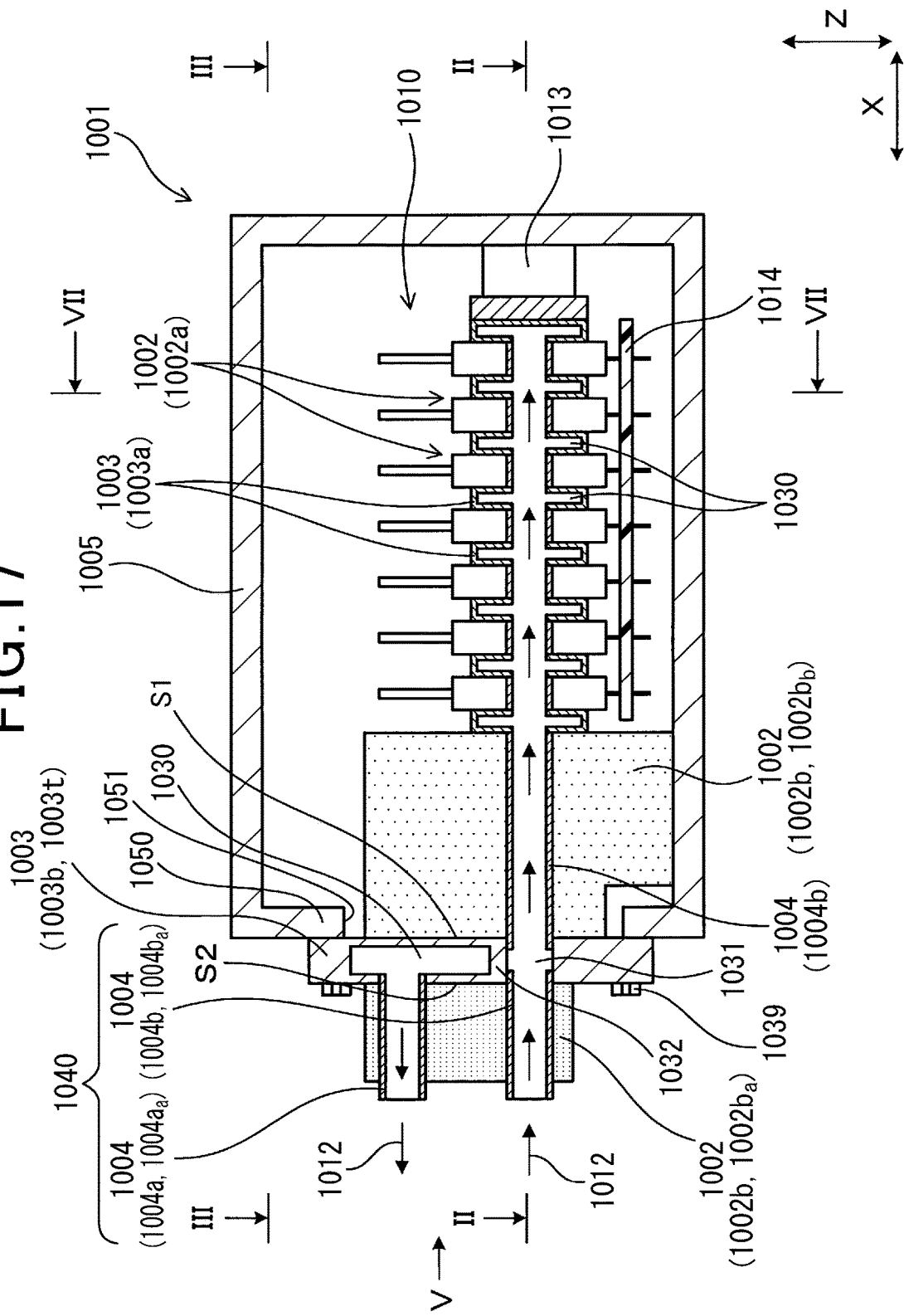
FIG. 17 is a cross-sectional view of a power converter taken along line I-I of FIG. 18, in accordance with a seventh embodiment of the present invention.
Figure 18:
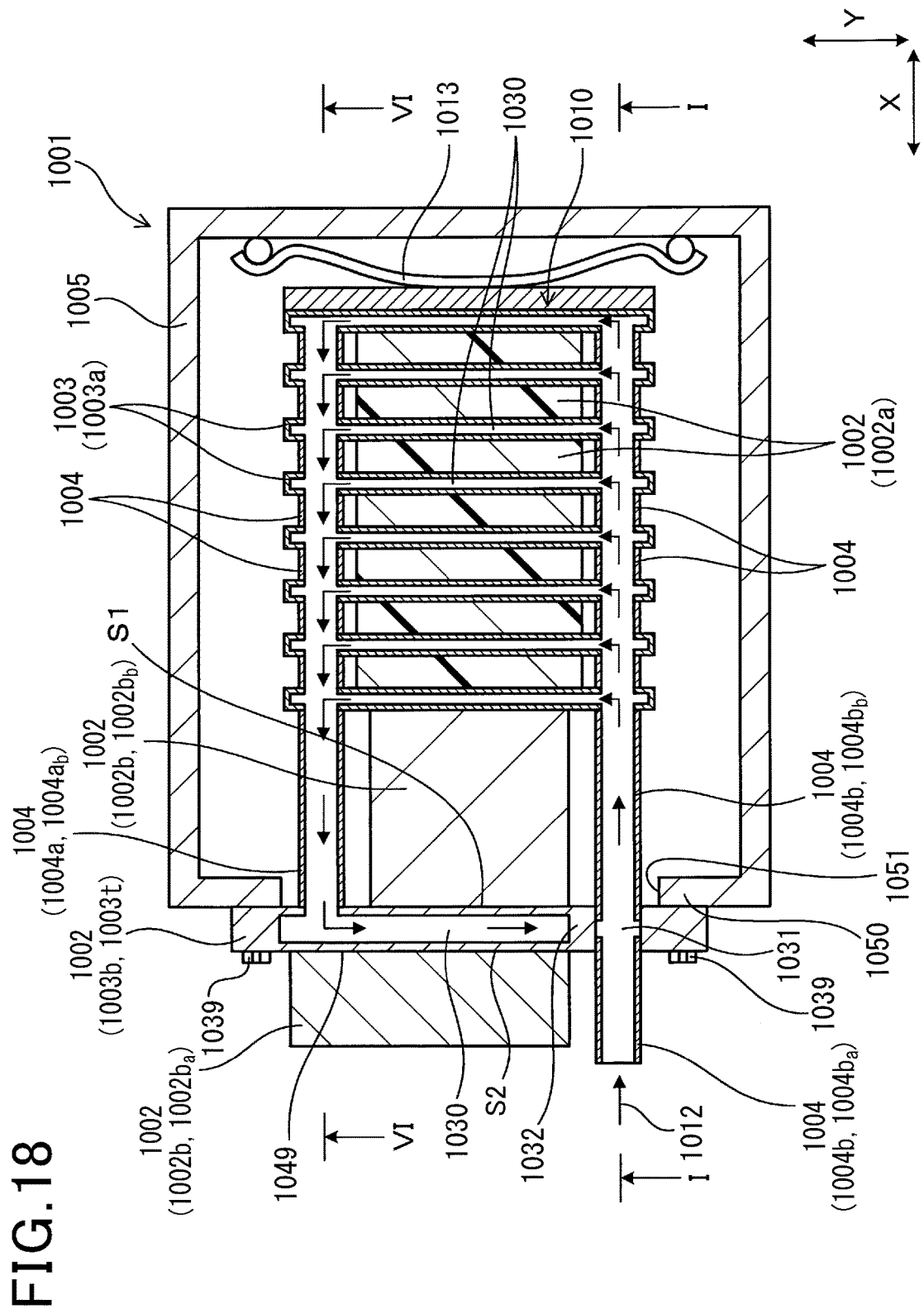
FIG. 18 is a cross-sectional view of the power converter taken along line II-II of FIG. 17.

A power converter in accordance with a seventh embodiment of the present invention will now be described with reference to FIGS. 17-25. As shown in FIGS. 17 and 18, the power converter 1001 of the present embodiment includes a stack 1010 and a plurality of pipes 1004. The stack 1010 is formed by stacking a plurality of electronic components 1002 and a plurality of cooling conduits 1003. The plurality of electronic components 1002 configure a power conversion circuit 1011 (see FIG. 24). Pathways 1030 through which a coolant 1012 flows is formed in the respective cooling conduits 1003 to cool the electronic components 1002.

The pipes 1004 are connected to the respective cooling conduits 1003. The pipes 1004 provide pathways of the coolant 1012 between any two cooling conduits 1003 adjacent to each other in a stacking direction (hereinafter referred to as an X-direction) of the stack 1010 and pathways of the coolant 1012 between the cooling conduit 1003t that is an X-direction end one of the plurality of the cooling conduits 1003 and an external device (not shown) operative to cool and circulate the coolant 1012.

The plurality of cooling conduits 1003 include communication cooling conduits 1003a and a separation cooling conduit 1003b. Each communication cooling conduit 1003a is connected to the pipes 1004 at its both ends in an extensional direction (hereinafter referred to as a Y-direction) of a pathway 1030. All the pipes connected to the communication cooling conduits 1003a and pathways 1030 in the respective communication cooling conduits 1003a are fluid communication with each other.

Figure 20:
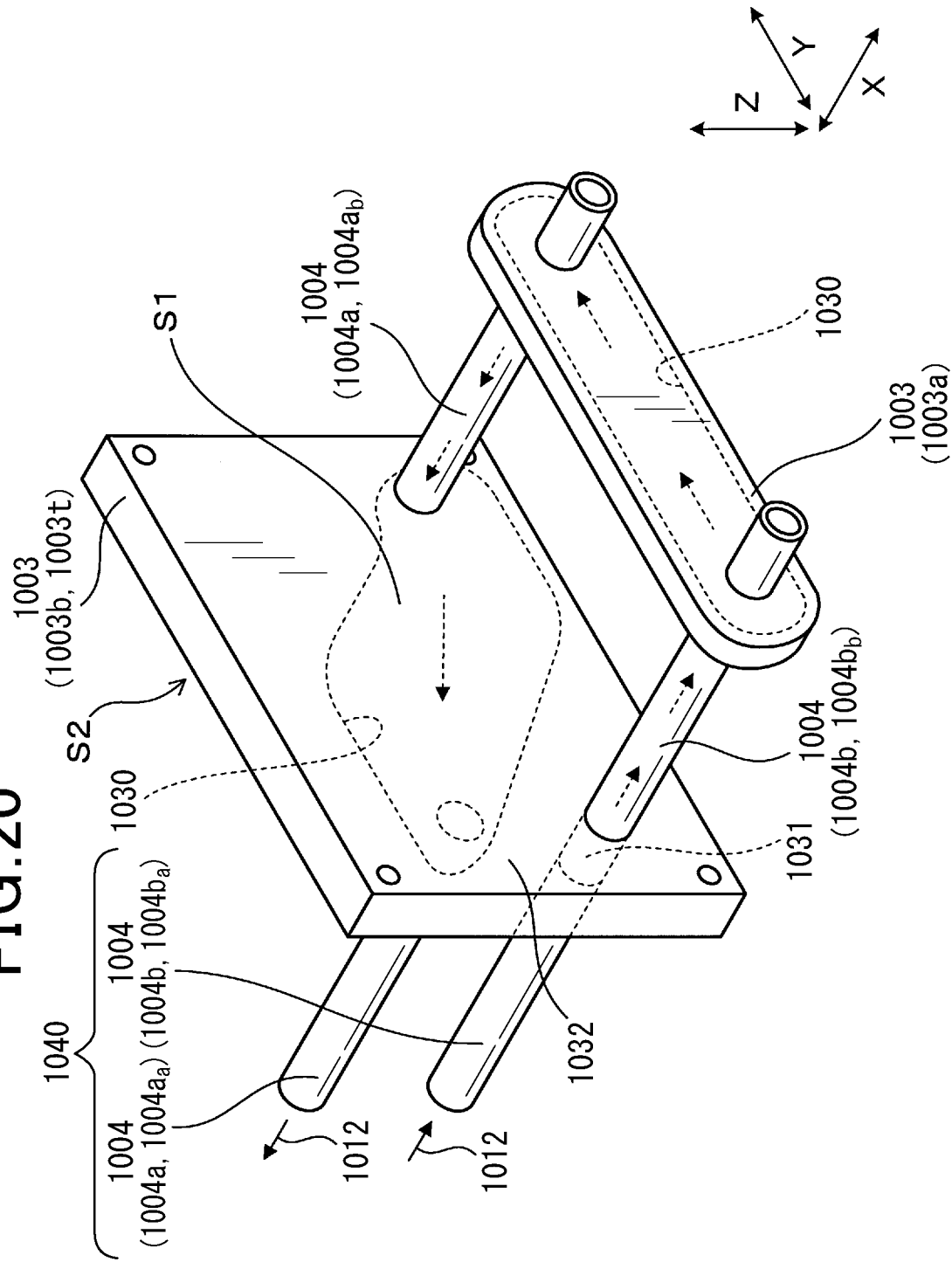
FIG. 20 is a perspective view of a separation cooling conduit and a cooling conduit of the seventh embodiment.

As shown in FIGS. 18 and 20, the separation cooling conduit 1003b has a through hole 1031 and a separator 1032. The through hole 1031 is formed at one end of the separation cooling conduit 1003b in the Y-direction and extends in the X-direction. The coolant 1012 flows through the through hole 1031 in the X-direction. The separator 1032 is interposed between the through hole 1031 and the pathway 1030 to separate them from each other.

As shown in FIG. 20, flow-channel pipes 1004a (1004aa, 1004ab), of the plurality of pipes 1004, are connected to the pathway 1030 of the separation cooling conduit 1003b on both sides of the separation cooling conduit 1003b in the X-direction. Through pipes 1004b(1004ba,1004bb), of the plurality of pipes 1004, are connected to the through hole 1031 of the separation cooling conduit 1003b on both sides of the separation cooling conduit 1003b in the X-direction.

As shown in FIGS. 17-20, the flow-channel pipe 1004a is spaced apart from the through pipe 1004b in the Y-direction on one of opposing sides of the separation cooling conduit 1003b in the X-direction, denoted by S1. An electronic component 1002(1002bb) is disposed between the flow-channel pipe 1004a and the through pipe 1004b. The flow-channel pipe 1004a is disposed adjacent to the through pipe 1004b in the Z-direction on the other of opposing sides of the separation cooling conduit 1003b in the X-direction, denoted by S2. Another electronic component 1002(1002ba) is disposed adjacent to the pair of pipes 1040, that is. The pair of the flow-channel pipe 1004a and the through pipe 1004ba, in the Y-direction.

Figure 24:
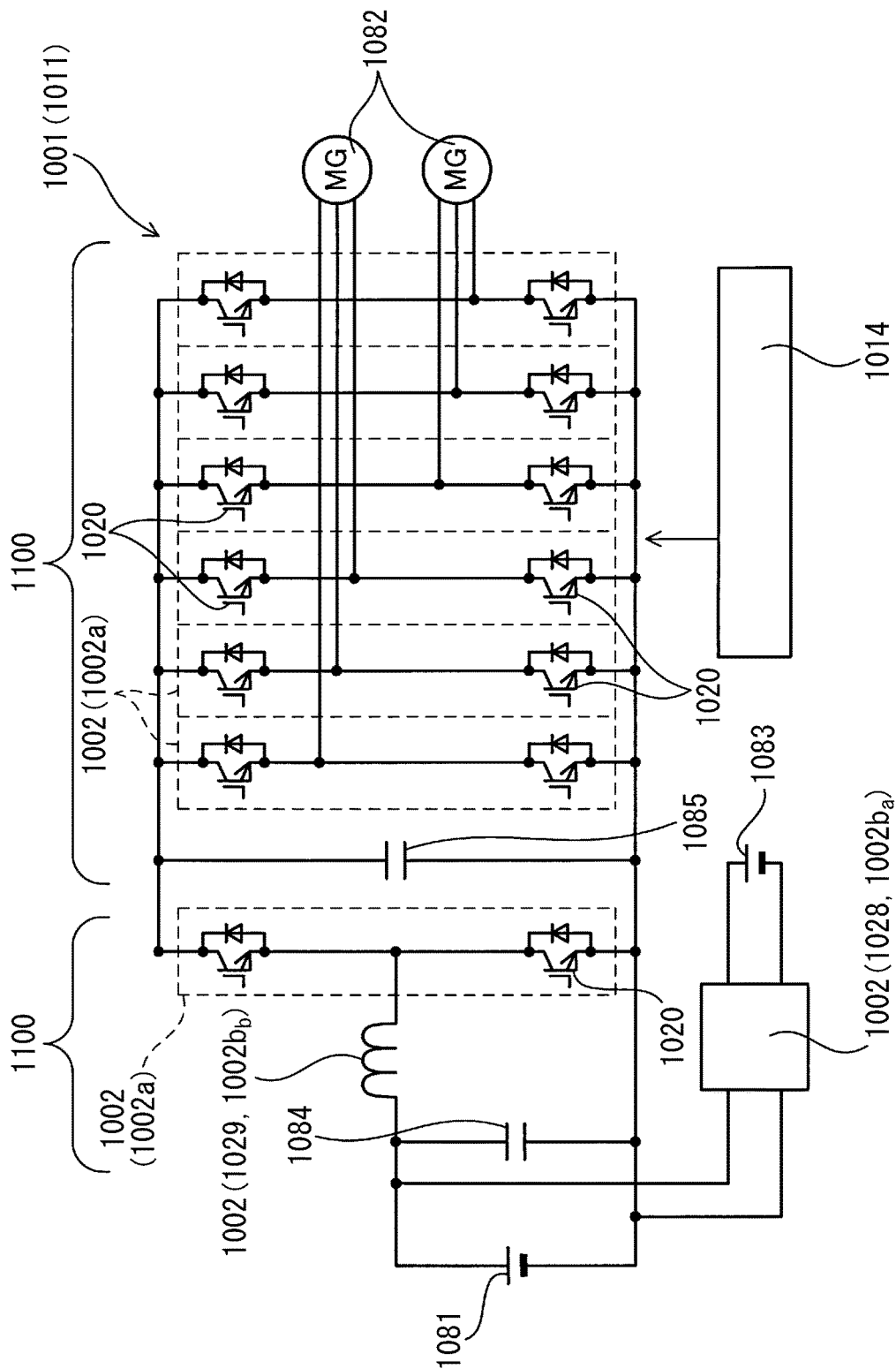
FIG. 24 is a circuit diagram of the power converter of the seventh embodiment.

The power converter 1001 may be a vehicle-mounted power converter for an electrical vehicle, a hybrid vehicle or the like. As shown in FIG. 24, the power converter 1001 contains a booster 1100 and an inverter 1101. The booster 1100 is formed of a filter capacitor 1084, a reactor 1029, and a semiconductor module 1002a. The semiconductor module 1002a contains semiconductor elements 1020 such as insulated gate bipolar transistors (IGBTs). The DC voltage of the DC power source 1081 is stepped up by switching on and off the respective semiconductor elements 1020.

The inverter 1101 is formed of a smoothing capacitor 1085 and a plurality of semiconductor modules 1002a. The smoothing capacitor 1085 smoothes the voltage stepped up by the booster 1100. The stepped-up DC power is converted into alternating-current (AC) power by switching on and off the respective semiconductor elements 1020 in each semiconductor module 1002. The vehicle is driven by the AC power driving an AC load 1082.

The DC-to-DC converter 1028 is electrically connected in parallel with the filter capacitor 1084. A low-voltage battery 1083 is charged by the DC-to-DC converter 1028 stepping down the voltage of the DC power source 1081.

Figure 23:
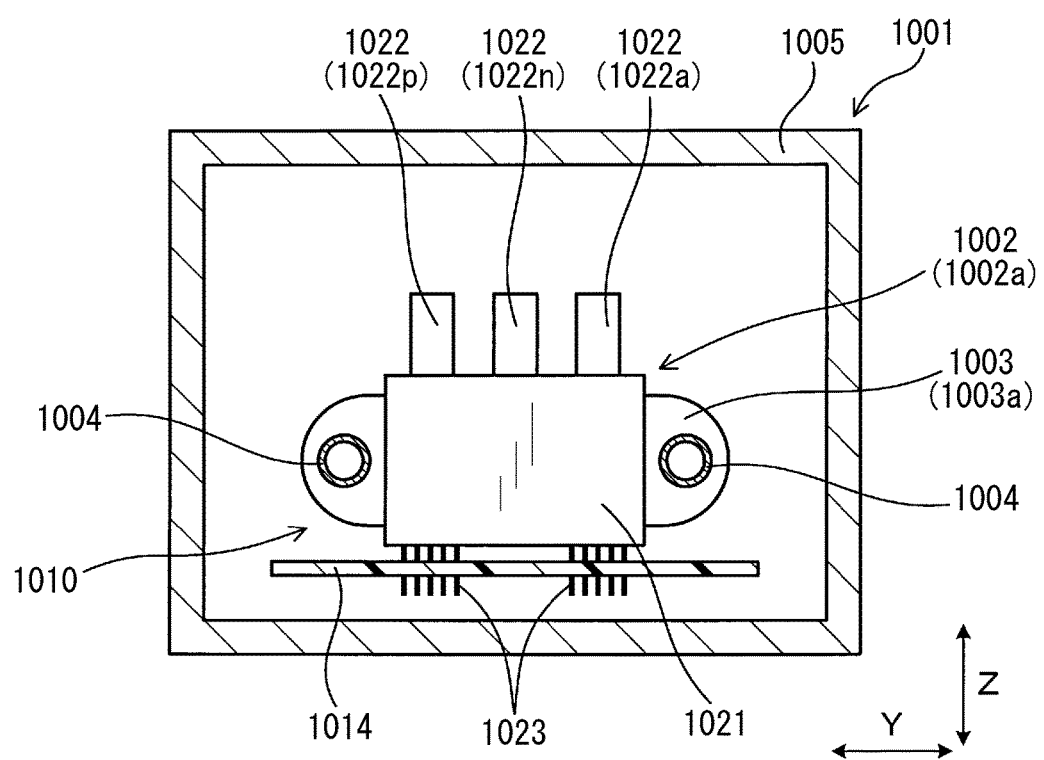
FIG. 23 is a cross-sectional view of the power converter taken along line VII-VII of FIG. 17.

As shown in FIG. 23, each semiconductor module 1002a has a body 1021 incorporating therein the semiconductor elements 1020, power terminals 1022 protruding from the body 1021, and control terminals 1023. The power terminals 1022 include DC terminals 1022p and 1022n to which DC voltage is applied and an AC terminal 1022a to which the AC load 1082 is electrically connected. The power terminals 1022 protrude from the body 1021 in a direction (referred to as a Z-direction) perpendicular to both the X- and Y-directions. The control terminal 1023 is electrically connected to a control circuit board 1014 used to control switching of the semiconductor elements 1020.

Figure 19:
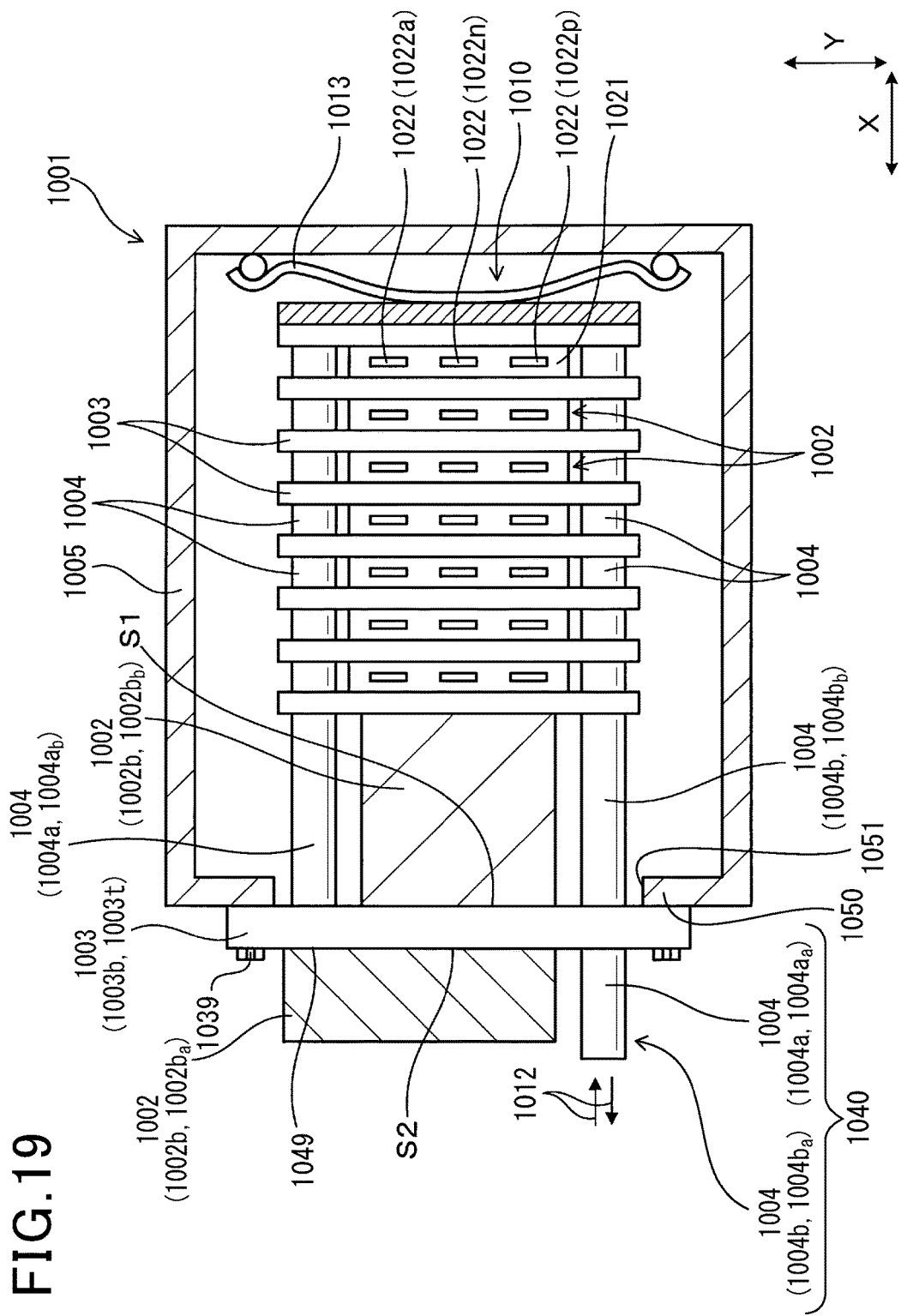
FIG. 19 is a cross-sectional view of the power converter taken along line III-III of FIG. 17.

As shown in FIGS. 17-19, the power converter 1001 of the present embodiment includes, as the electronic components 1002, the semiconductor modules 1002a, and a first and a second large component 1002b(1002ba, 1002bb) being electrically connected to the semiconductor modules 1002a and having a larger volume than the semiconductor modules 1002a. The first large component 1002ba is the DC-to-DC converter 1028. The second large component 1002bb is the reactor 1029 (see FIG. 24). The two large components 1002ba, 1002bb are cooled by the separation cooling conduit 1003b. The semiconductor modules 1002a are cooled by the communication cooling conduits 1003a.

The power converter 1001 includes a casing 1005 accommodating part of the stack 1010. A wall 1050 of the casing 1005 has an opening 1051 formed extending therethrough in the X-direction. The opening 1051 is sealed by the separation cooling conduit 1003b from the outside of the casing 1005. The separation cooling conduit 1003b is fastened to the casing 1005 by bolts 1039.

Figure 21:
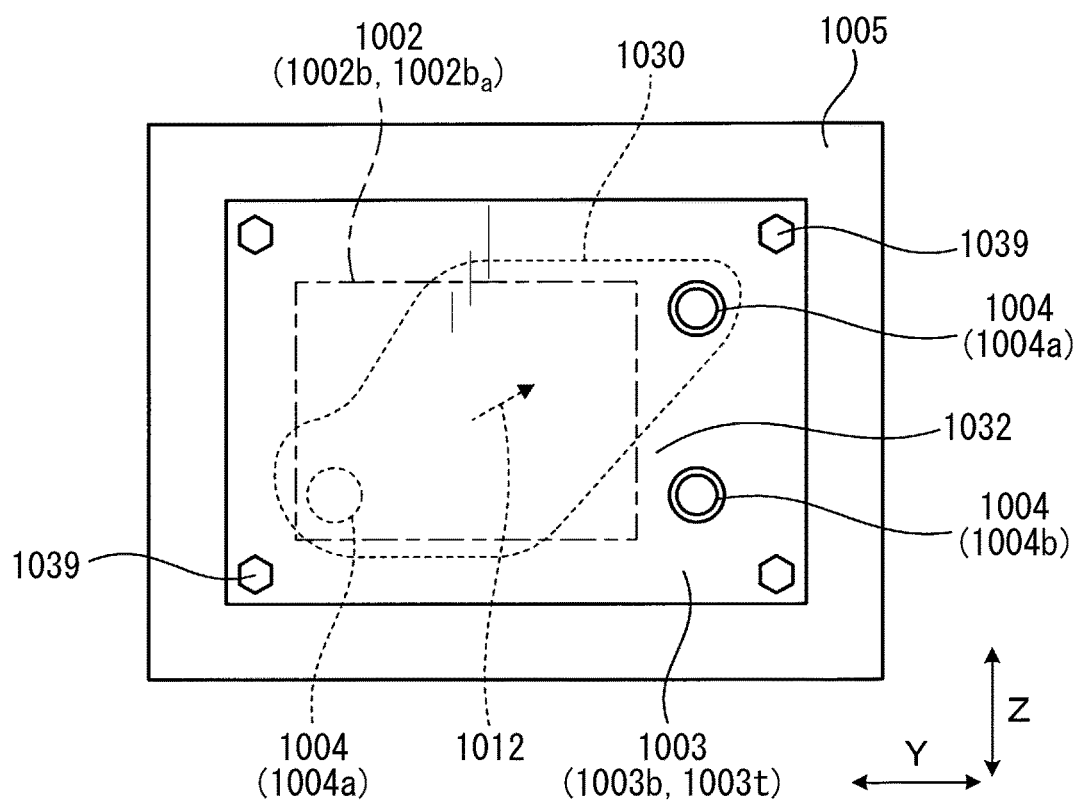
FIG. 21 is a side view of the power converter of the seventh embodiment as viewed from a V-direction of FIG. 17, where an electronic component outside a casing is removed.
Figure 22:
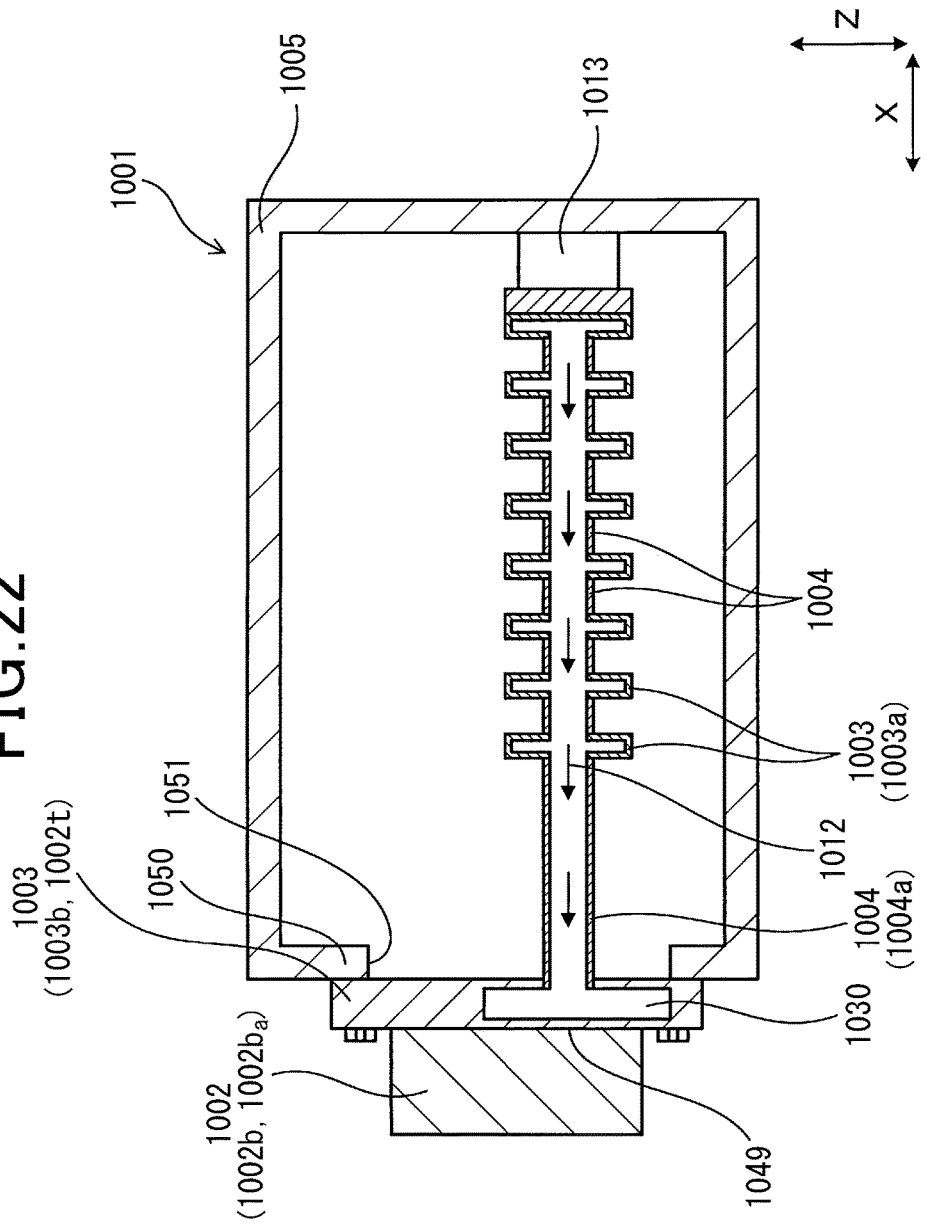
FIG. 22 is a cross-sectional view of the power converter taken along line VI-VI of FIG. 18.

As shown in FIG. 21, the separation cooling conduit 1003b has a larger area than each communication cooling conduit 1003a as viewed from the X-direction (see FIG. 23). As shown in FIGS. 17 and 18, among the two large components 1002ba, 1002bb cooled by the separation cooling conduit 1003b, the first large component 1002ba is disposed outside the casing 1005, and the second large component 1002bb is disposed inside the casing 1005.

As shown in FIGS. 17-19, a pressure applying member 1013, such as a plate spring, is disposed within the casing 1005. The plurality of communication cooling conduits 1003a, the semiconductor modules 1002a, and the second large component 1002bb are pressed against the separation cooling conduit 1003b by the pressure applying member 1013. With such a configuration, the communication cooling conduits 1003a, the semiconductor modules 1002a, and the second large component 1002bb are secured within the casing 1005, and a contact pressure can be ensured between the communication cooling conduits 1003a and the semiconductor modules 1002a.

As described above, the flow-channel pipe 1004a and the through pipe 1004b defining the pair of pipes 1040 are connected to the separation cooling conduit 1003b. These pipes 1004a, 1004b are adjacent to each other in the Z-direction. As shown in FIG. 18, the coolant 1012 introduced into the through pipe 1004ba passes through the though hole 1031 and the through pipe 1004bb within the casing 1005, and divides and flows through the plurality of communication cooling conduits 1003a. As described above, the pathway 1030 within each communication cooling conduit 1003a is in fluid communication with all the connected pipes 1004. Therefore, the coolant 1012 flows through the pathways 1030 of the respective communication cooling conduits 1003a in a distributed manner.

After passing through the pathways 1030 of the communication cooling conduits 1003a, the coolants 1012 merge to flow through the flow-channel pipe 1004ab within the casing 1005. Thereafter, the coolant 1012 is introduced into the pathway 1030 of the separation cooling conduit 1003b and then led out through the flow-channel pipe 1004aa (see FIG. 17). The entire coolant 1012 introduced into the through pipe 1004ba flows through the pathway 1030 of the separation cooling conduit 1003b. Therefore, an amount of the coolant that flows through the pathway 1030 of the separation cooling conduit 1003b is increased, thereby increasing efficiency of cooling the electronic components 1002b (1002ba).

Some advantages of the present embodiment will now be described. The power converter 1001 of the present embodiment includes the communication cooling conduits 1003a and the separation cooling conduit 1003b.

This configuration can improve efficiency of cooling the electronic components 1002. The pathway 1030 that the coolant 1012 flows through and the through hole 1031 are formed in the separation cooling conduit 1003b, where the pathway 1030 and the through hole 1031 are separated from each other by a separator 1032. Therefore, there is no mixing between the coolant 1012 that has passed through the through hole 1031 and the coolant that has passed through the pathway 1030 (see FIG. 18). This configuration can prevent the coolant 1012 from splitting in the separation cooling conduit 1003b, thus increasing an amount of coolant 1012 that flows through the separation cooling conduit 1003b. The efficiency of cooling the electronic components 1002b that are in contact with the separation cooling conduit 1003b can be increased.

Figure 38:
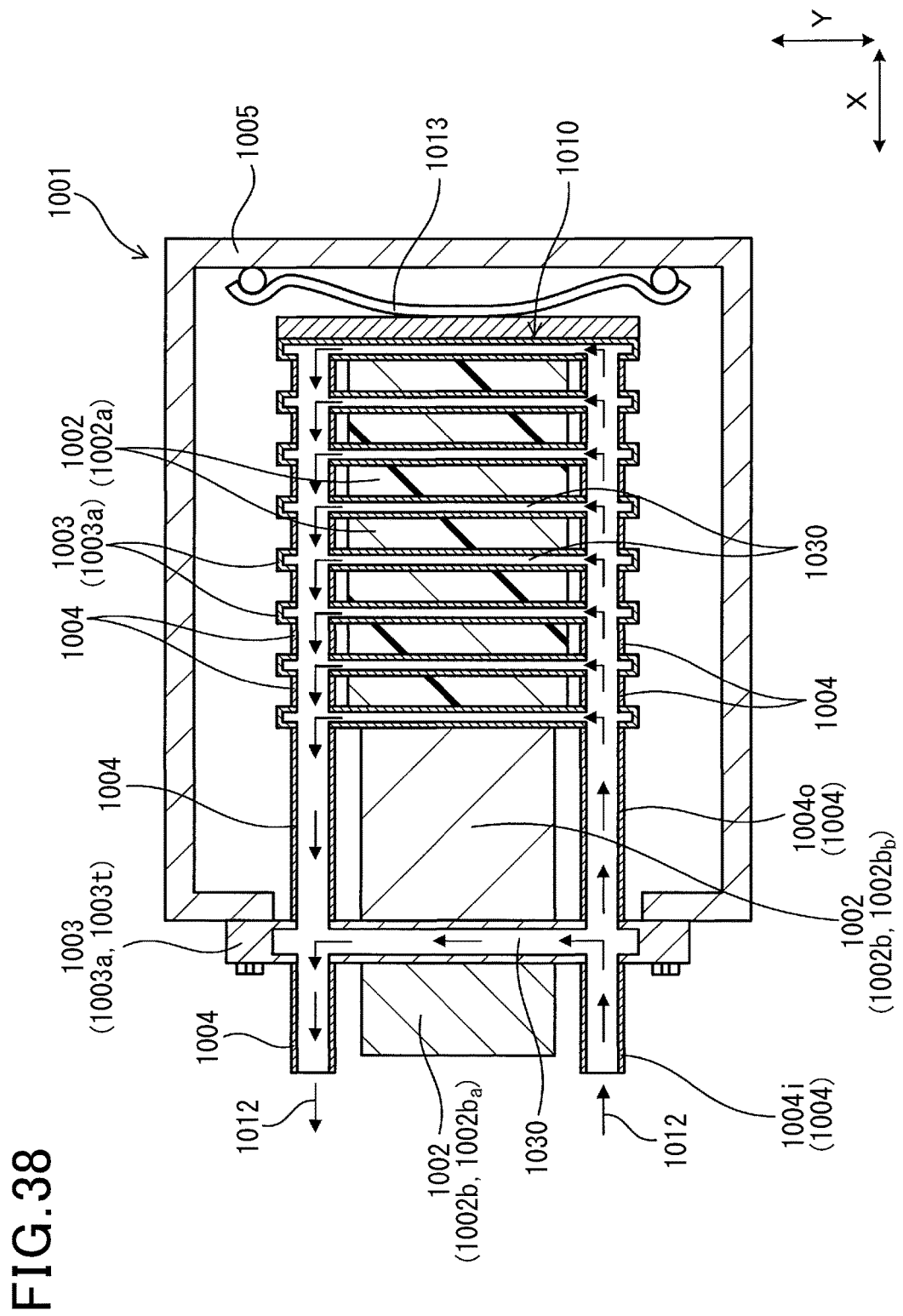
FIG. 38 is a cross-sectional view of a power converter in a comparative example.

In a configuration where, as shown in FIG. 38, a cooling conduit 1003t that is adjacent to a large component 1002ba serves as a communication cooling conduit 1003a, efficiency of cooling the large component 1002ba is liable to decrease. As described above, the pathway 1030 of each communication cooling conduit 1003a is in fluid communication with all the pipes 1004, which may cause some of coolant 1012 introduced to an inlet pipe 1004i to flow through the pathway 1030 of the cooling conduit 1003t and the other of the coolant 1012 to flow through a pipe 1004o on the opposite side from the pipe 1004i. That is, the coolant 1012 introduced into the inlet pipe 1004i will split. Thus, a small amount of coolant 1012 will flow through the pathway 1030 of the cooling conduit 1003t, which may lead to low efficiency of cooling the large component 1002ba.

In the configuration of the present embodiment where, as shown in FIG. 18, the cooling conduit 1003t that is adjacent to the large component 1002ba is the separation cooling conduit 1003b, high efficiency of cooling the large component 1002ba can be achieved. That is, as shown in FIG. 18, owing to the presence of the separator 1032 formed in the separation cooling conduit 1003b, the entire coolant 1012 introduced into the through hole 1031 of the separation cooling conduit 1003b will flow into the downstream cooling conduits 1003(1003a) without flowing into the pathway 1030 of the separation cooling conduit 1003b. Thereafter, the coolant 1012 will flow through the communication cooling conduits 1003a, and return to the separation cooling conduit 1003b to flow through the pathway 1030 of the separation cooling conduit 1003b. This allows the entire coolant 1012 introduced into the through hole 1031 to flow though the pathway 1030 of the separation cooling conduit 1003b, which can increase an amount of coolant 1012 that flows through the pathway 1030 of the separation cooling conduit 1003b. Thus, the efficiency of cooling the large component 1003ba can be increased.

Figure 25:
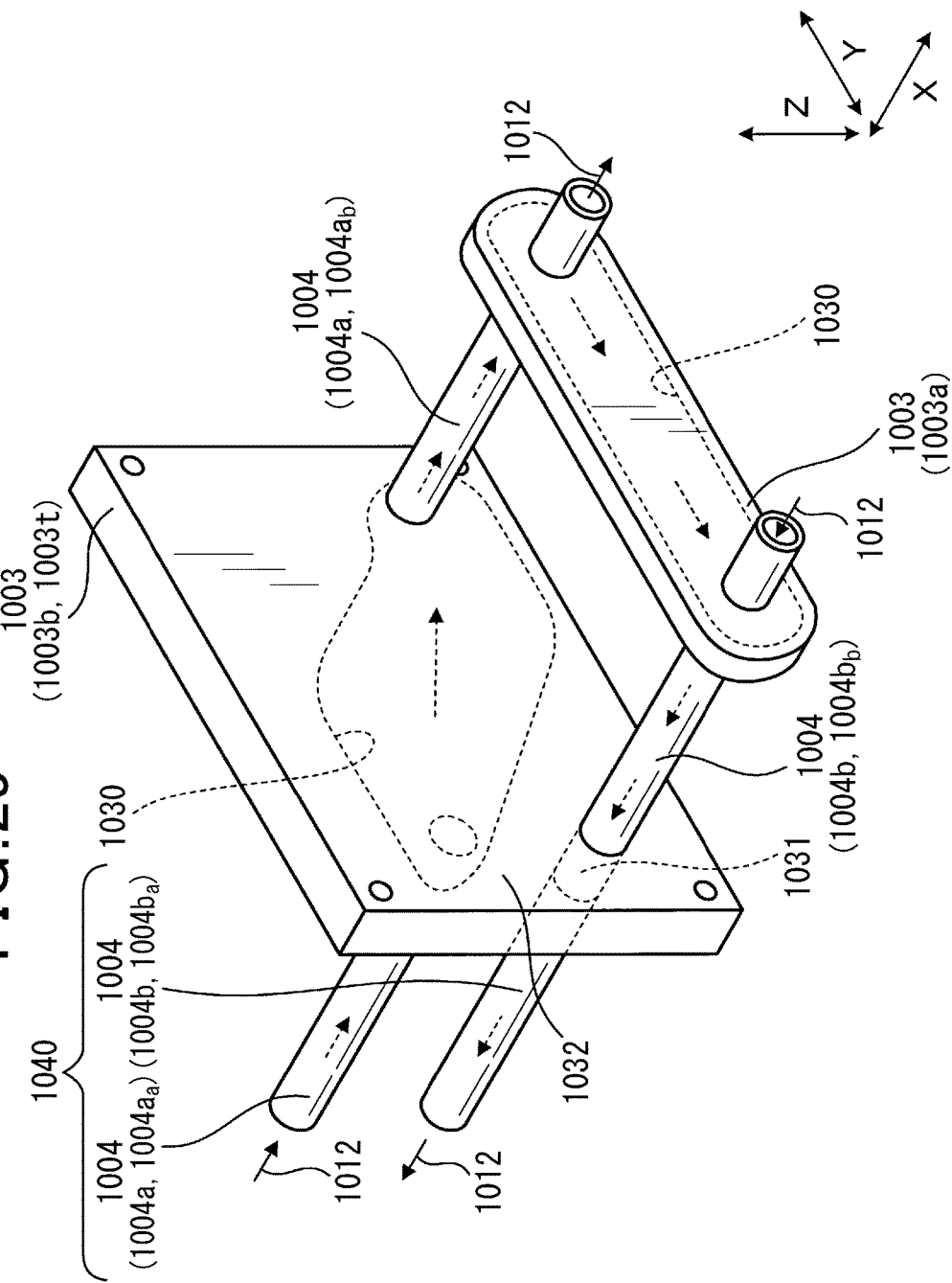
FIG. 25 is a perspective view of the separation cooling conduit and the cooling conduit of the seventh embodiment, where a flow direction of coolant is reversed.

In the present embodiment, the coolant 1012 is introduced into the through hole 1031 of the separation cooling conduit 1003b from the outside of the casing 1005. Alternatively, the flow direction of the coolant 1012 may be reversed. Such an embodiment can provide similar advantages. For example, as shown in FIG. 25, the coolant 1012 may be introduced into the pathway 1030 of the separation cooling conduit 1003b. The coolant 1012 will flow through the pathway 1030 of the separation cooling conduit 1003b and then flow through the flow-channel pipe 1004ab. Owing to the presence of the separator 1032 in the separation cooling conduit 1003b, the entire coolant 1012 is directed to the downstream communication cooling conduits 1003a without being diverted to the through hole 1031. The coolant 1012 will divide and flow through the plurality of communication cooling conduits 1003a, and then leave through the through hole 1031. This configuration allows the entire coolant 1012 to flow through the pathway 1030 of the separation cooling conduit 1003b, which can increase an amount of coolant 1012 that flows through the pathway 1030 of the separation cooling conduit 1003b. Hence, efficiency of cooling the large component 1002ba (see FIGS. 17 and 18) can be improved.

In the power converter 1001 of the present embodiment, as shown in FIG. 20, the flow-channel pipe 1004ab and the through pipe 1004bb are spaced apart from each other on one side S1 of the separation cooling conduit 1003b in the X-direction. The flow-channel pipe 1004aa and the through pipe 1004ba are adjacent to each other on the other side S2 of the separation cooling conduit 1003b in the X-direction to form the pair of pipes 1040. As shown in FIG. 18, the electronic component 1002(1002ba) is disposed adjacent to the pair of pipes 1040 in the Y-direction on the same side S2 of the separation cooling conduit 1003b.

The two pipes 1004aa, 1004ba are disposed close together at one end of the separation cooling conduit 1003b in the Y-direction on the side S2 of the separation cooling conduit 1003b while there are no pipes at the other end 1049 in the Y-direction on the same side S2 of the separation cooling conduit 1003b, which allows an area at the opposite end 1049 of the separation cooling conduit 1003b on the side S2 of the separation cooling conduit 1003b to be used to cool the electronic component 1002(1002ba). Therefore, an area of the separation cooling conduit 1003b used to cool the electronic component 1002(1002ba) can be increased, which can lead to higher efficiency of cooling the electronic component 1002(1002ba).

As shown in FIGS. 17 and 20, the through pipe 1004ba and the flow-channel pipe 1004aa forming the pair of pipes 1040 are adjacent to each other in the Z-direction.

A Y-directional length of the pair of pipes 1040 as viewed from the Z-direction can be decreased. Therefore, a Y-directional length of an area of the separation cooling conduit 1003b that can be used to cool the electronic component 1002(1002ba) can be increased, which leads to an increased area of the separation cooling conduit 1003b that can used to cool the electronic component 1002(1002ba).

The power converter 1001 of the present embodiment includes, as the electronic components 1002, the semiconductor modules 1002a and the large components 1002b having a larger volume than each semiconductor module 1002a. The large component 1002b(1002ba) is disposed adjacent to the pair of pipes 1040 in the Y-direction.

To be effective, the large component 1002ba needs to be cooled over a large area of the separation cooling conduit 1003b because of the large surface area of the large component 1002ba. In the present embodiment, the large component 1002ba is disposed adjacent to the pair of pipes 1040 in the Y-direction, which can provide a large area of the separation cooling conduit 1003b for cooling the large component 1002ba. Therefore, it becomes possible to cool the large component 1002ba over a large area.

As shown in FIG. 21, the separation cooling conduit 1003b has a larger area than each communication cooling conduit 1003a as views from the X-direction (see FIG. 23).

Therefore, an area of the separation cooling conduit 1003b for cooling the electronic component 1002(1002ba) can be increased, which can improve efficiency of cooling the electronic component 1002(1002ba).

As shown in FIG. 17, the cooling conduit 1003t that is one of the plurality of cooling conduits 1003 at one end of the stack 1010 in the X-direction is deemed as the separation cooling conduit 1003b.

Therefore, an amount of coolant 1012 that flows through the pathway 1030 of the separation cooling conduit 1003b can be increased. Indeed, as described later, another one of the plurality of cooling conduits 1003 than the cooling conduit 1003t at one end of the stack 1010 in the X-direction may be deemed as the cooling conduit 1003t (see FIG. 26). In such a configuration, however, there may be at least one of the communication cooling conduits 1003a between the inlet pipe 1004i and the separation cooling conduit 1003b, which may cause some of the coolant 1012 to be diverted to the at least one of the communication cooling conduits 1003a. Thus, an amount of coolant 1012 that can flow through the separation cooling conduit 1003b is liable to decrease. In the present embodiment where the cooling conduit 1003t that is one of the plurality of cooling conduits 1003 at one end of the stack 1010 in the X-direction is deemed as the separation cooling conduit 1003b, the entire led-in coolant 1012 can flow through the pathway 1030 of the separation cooling conduit 1003b. Therefore, an amount of coolant 1012 that can flow through the separation cooling conduit 1003b can be increased, which can lead to higher efficiency of cooling the electronic component 1002 (1002ba).

The power converter 1001 includes the casing 1005 accommodating part of the stack 1010. The opening 1051 extending in the X-direction is formed in the side wall 1050 of the casing 1005. The opening 1051 is sealed by the separation cooling conduit 1003b from the outside of the casing 1005. The pair of pipes 1040 are disposed outside the casing 1005. The electronic component 1002(1002ba) is disposed adjacent to the pair of pipes 1040.

Therefore, the electronic component 1002(1002ba) disposed outside the casing 1005 can be effectively cooled by the separation cooling conduit 1003b.

In the present embodiment, the opening 1051 is sealed by the separation cooling conduit 1003b from the outside of the casing 1005. Alternatively, the opening 1051 may be sealed by the separation cooling conduit 1003b from the inside of the casing 1005.

As above, the present embodiment can provide the power converter having improved efficiency of cooling the electronic components.

In the present embodiment, the DC-to-DC converter 1028 is employed as the large component 1002ba disposed outside the casing 1005. Alternatively, the reactor 1029, the capacitor or the like may be employed as the large component 1002ba disposed outside the casing 1005.

Eighth Embodiment

Figure 26:
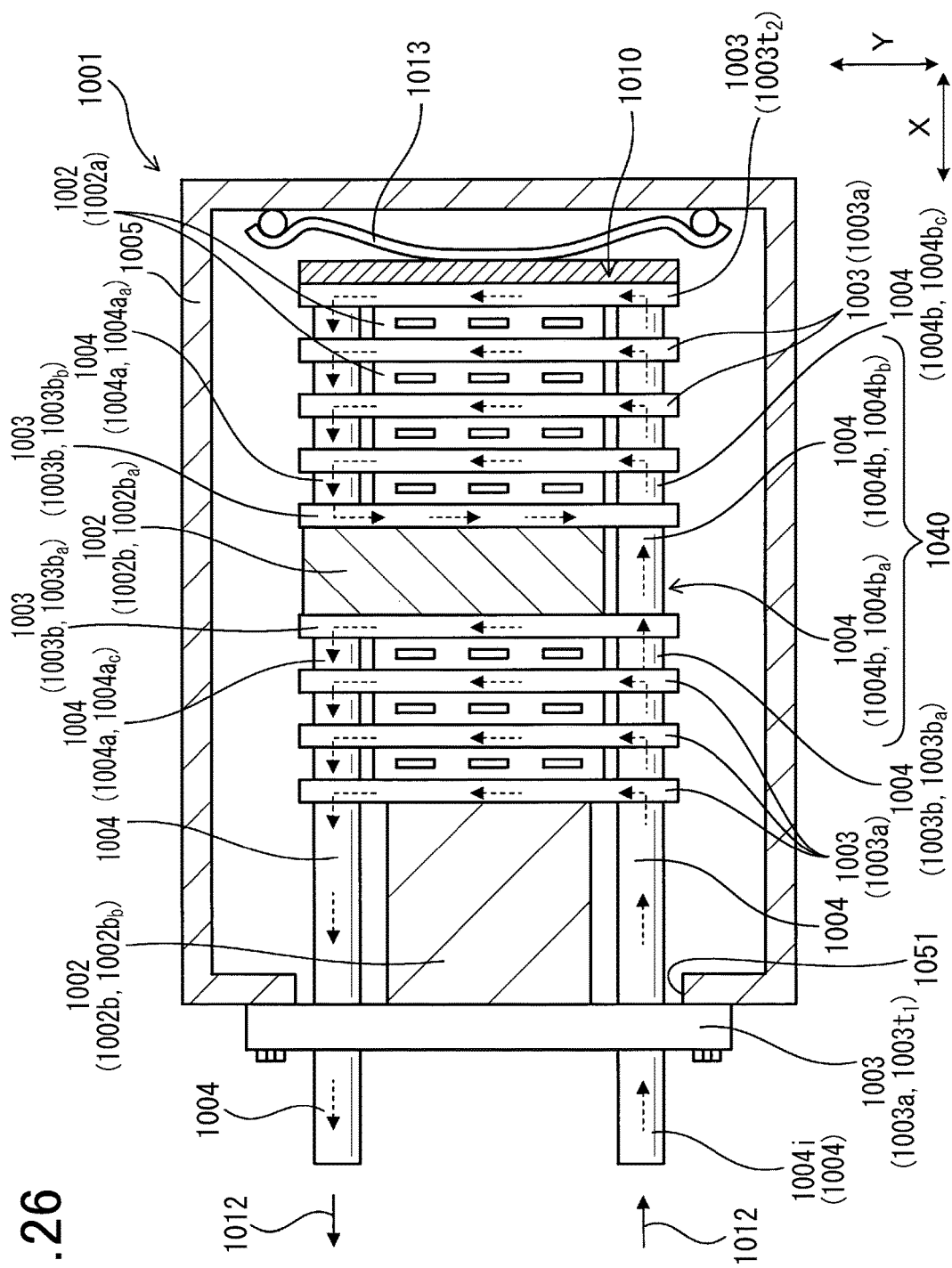
FIG. 26 is a cross-sectional view of a power converter in accordance with an eighth embodiment of the present invention.
Figure 27:
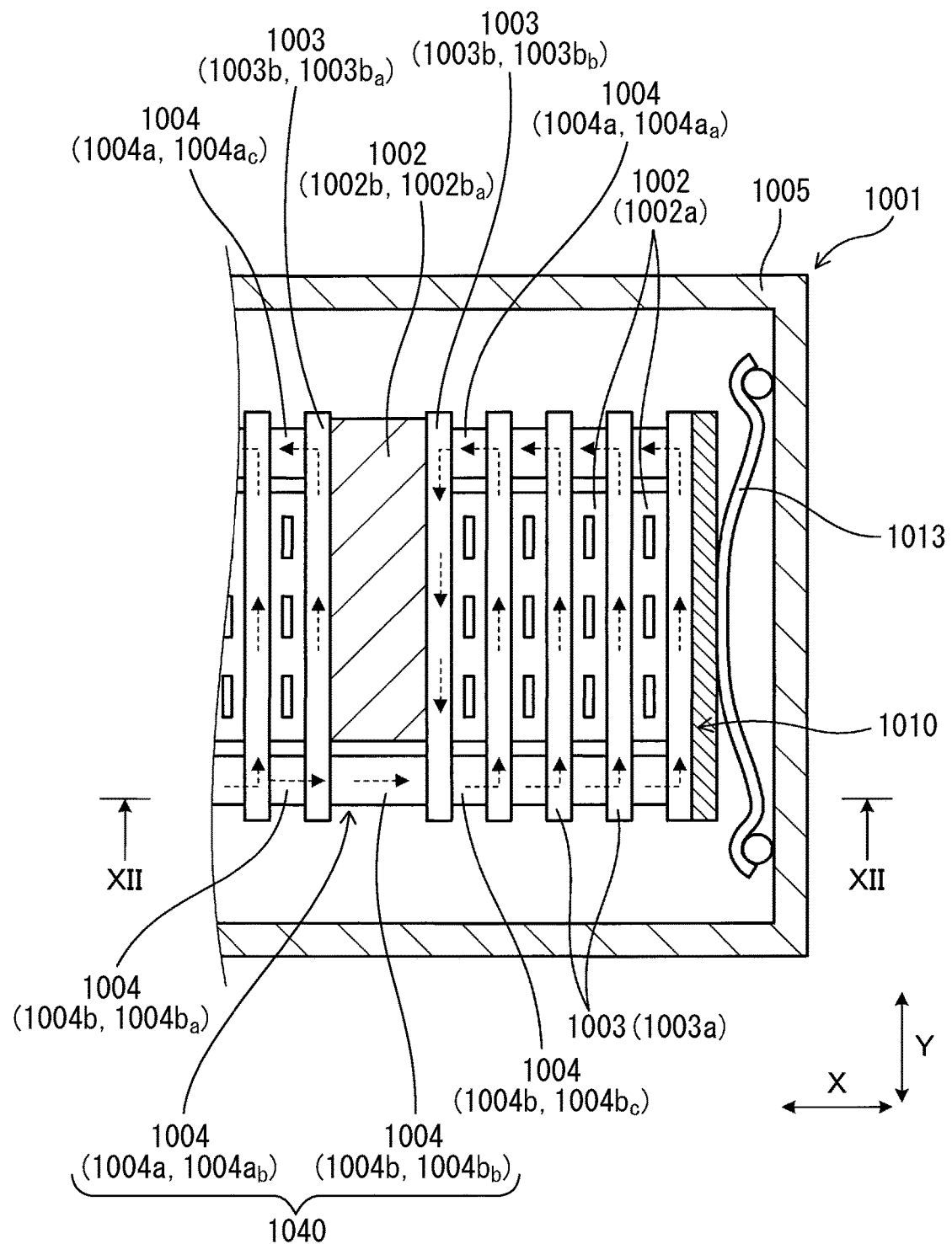
FIG. 27 is an expanded view of the power converter of FIG. 26.

In the present embodiment, the separation cooling conduit 1003b is modified in position. As shown in FIGS. 26 and 27, the power converter 1001 of the present embodiment includes two separation cooling conduits 1003b(1003ba, 1003bb), i.e., a first separation cooling conduits 1003ba and a second separation cooling conduit 1003bb. These two separation cooling conduits 1003ba, 1003bb are located at around the middle of the stack 1010 in the X-direction. A plurality (first plurality) of communication cooling conduits 1003a are provided on one side of the separation cooling conduits 1003ba, 1003bb where a pressure applying member 1013 is provided. Another plurality (second plurality) of communication cooling conduits 1003a are provided on the other side of the separation cooling conduits 1003ba, 1003bb on the other side of the separation cooling conduits 1003ba, 1003bb from the pressure applying member 1013.

Figure 28:
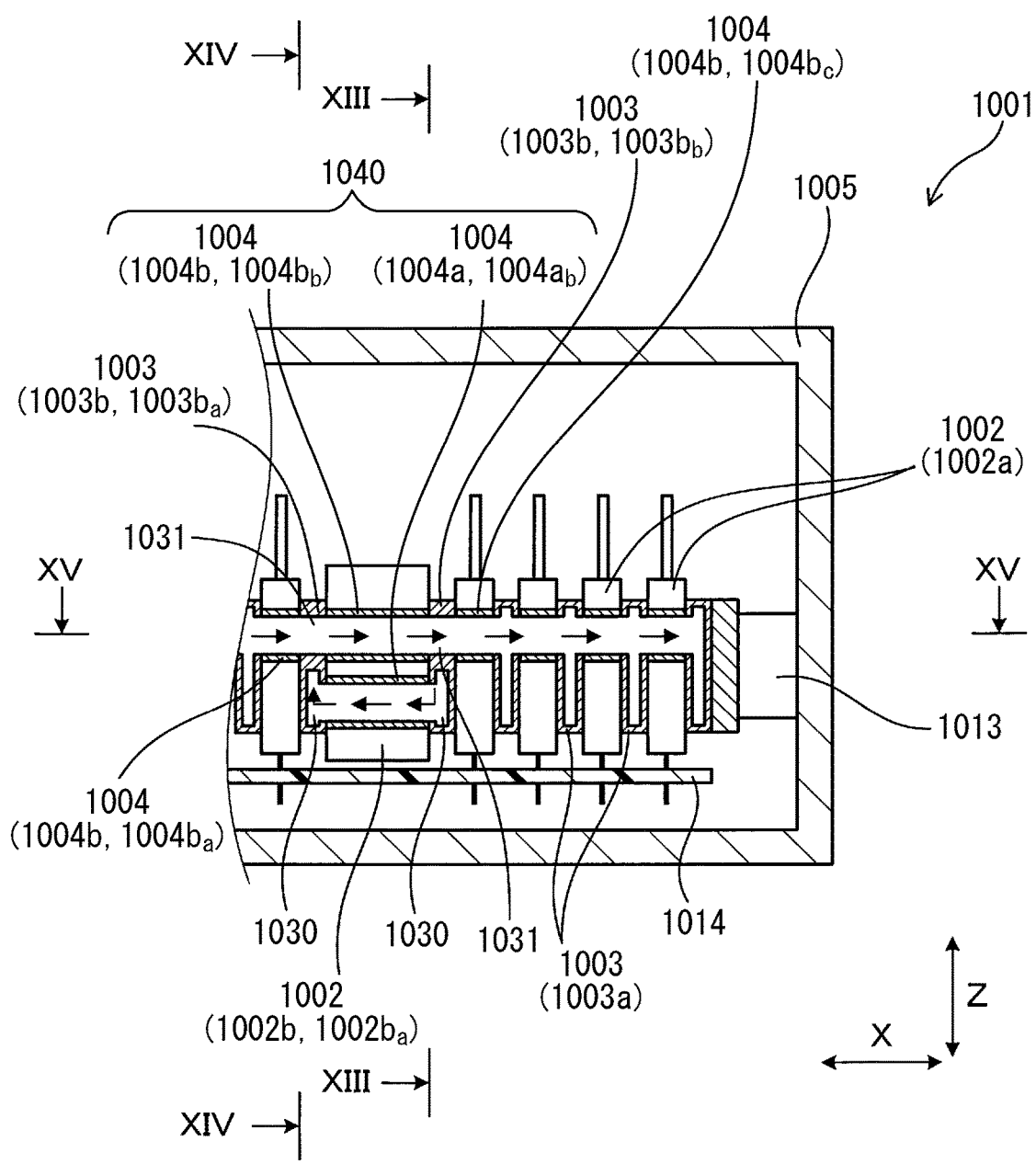
FIG. 28 is a cross-sectional view of the power converter taken along line XII-XII of FIG. 27.
Figure 29:
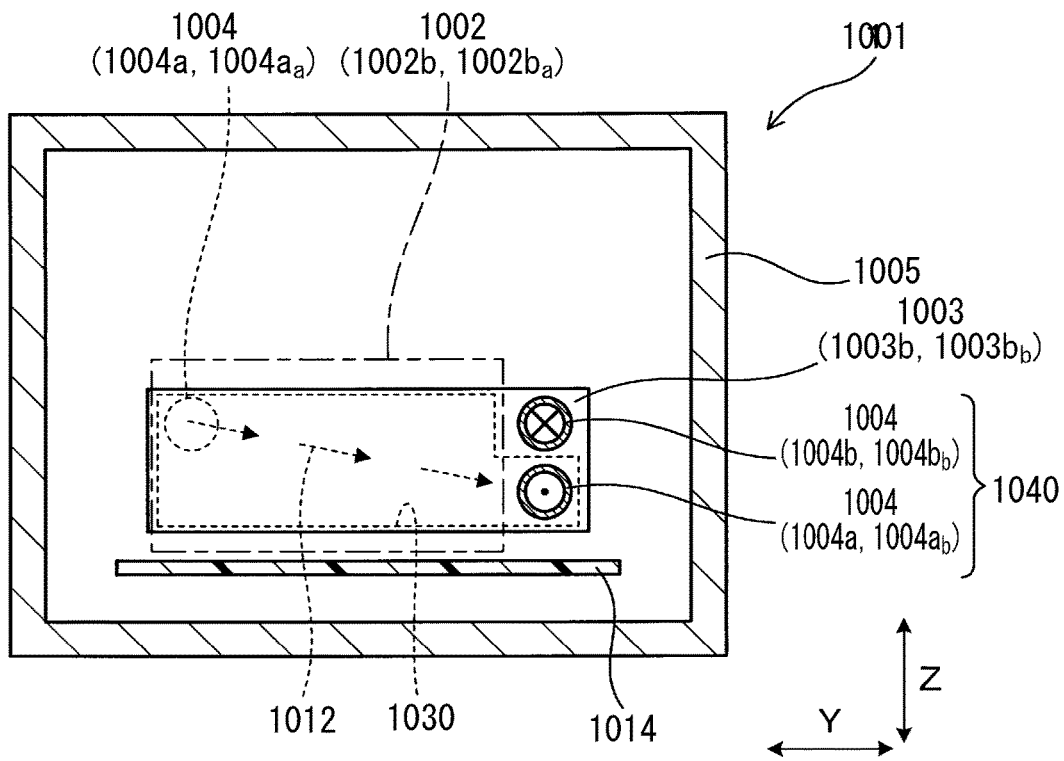
FIG. 29 is a cross-sectional view of the power converter taken along line XIII-XIII of FIG. 28.
Figure 30:
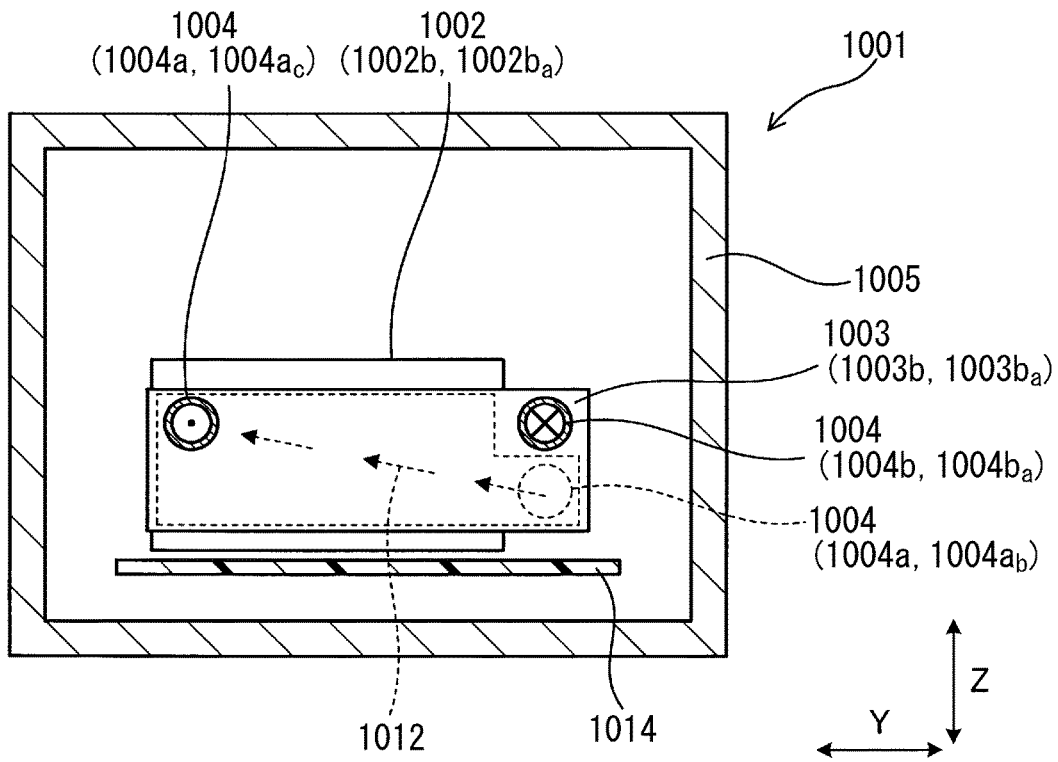
FIG. 30 is a cross-sectional view of the power converter taken along line XIV-XIV of FIG. 28.
Figure 31:
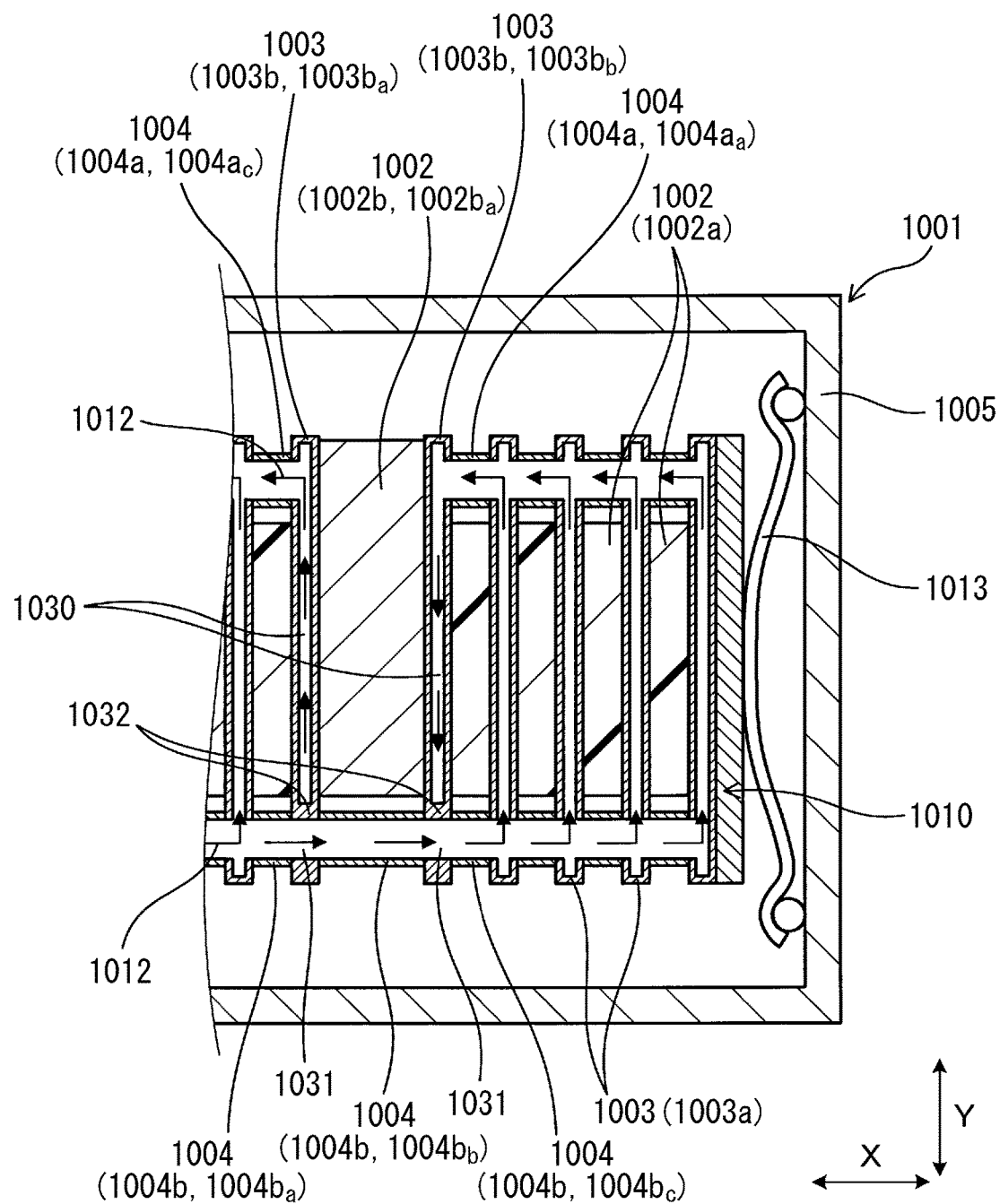
FIG. 31 is a cross-sectional view of the power converter taken along line XV-XV of FIG. 28.

As shown in FIGS. 28 and 31, two through pipes 1004b (1004ba, 1004bb), i.e., a first through pipe 1004ba and a second through pipe 1004bb, are connected to a through hole 1031 of the first separation cooling conduit 1003ba. Two through pipes 1004b(1004bb, 1004bc), i.e., the second through pipe 1004bb and a third through pipe 1004bc, are connected to a through hole 1031 of the second separation cooling conduit 1003bb. In addition, two flow-channel pipe 1004a(1004aa, 1004ab), i.e., a first flow-channel pipe 1004aa and a second flow-channel pipe 1004ab, are connected to the pathway 1030 of the second separation cooling conduit 1003bb. Two flow-channel pipe 1004a(1004ab, 1004ac), i.e., the second flow-channel pipe 1004ab and a third flow-channel pipe 1004ac, are connected to the pathway 1030 of the first separation cooling conduit 1003ba. The second through pipe 1004bb and the second flow-channel pipe 1004ab are disposed adjacent to each other to form a pair of pipes 1040.

As shown in FIG. 26, the coolant 1012 introduced into the pipe 1004i divides and flows through the first plurality of communication cooling conduits 1003a. As shown in FIGS. 28-31, the residual coolant 1012 flows through the first to third through pipes 1004ba-1004bc, and then divides and flows through the second plurality of communication cooling conduits 1003a downstream of the separation cooling conduits 1003ba, 1003bb. After flowing through the pathways 1030 of the second plurality of communication cooling conduits 1003a, the residual coolant 1012 flows through the first flow-channel pipe 1004aa, the pathway 1030 of the second separation cooling conduit 1003bb, the second flow-channel pipe 1004ab, the pathway 1030 of the first separation cooling conduit 1003ba, and the third flow-channel pipe 1004ac. With this configuration, the electronic component 1002(1002ba) can be cooled.

The second through pipe 1004bb and the second flow-channel pipe 1004ab, forming the pair of pipes 1040, are adjacent to each other in the Z-direction. The electronic components 1002(1002ba) is disposed adjacent to the pair of pipes 1040 in the Y-direction.

Also in the present embodiment, the entire coolant 1012 introduced into the through holes 1031 of the separation cooling conduits 1003ba, 1003bb flows through the pathways 1030 of the separation cooling conduits 1003ba, 1003bb. Therefore, an amount of coolant 1012 that flows through the pathways 1030 of the separation cooling conduits 1003ba, 1003bb can be increased, which can improve the efficiency of cooling the electronic component 1002 (1002ba).

The present embodiment can provide similar advantages to those of the seventh embodiment. The present embodiment can provide additional advantage.

In the present embodiment, as shown in FIG. 26, two of the plurality of cooling conduits 1003 other than the cooling conduits 1003(1003t1, 1003t2) disposed at both ends of the stack 1010 in the X-direction are deemed as the separation cooling conduits 1003b, which can increase the degree of freedom of positioning the separation cooling conduits 1003b, thus providing more design freedoms of the power converter 1001.

In the present embodiment, the large component 1002ba is interposed between the two separation cooling conduits 1003ba, 1003bb. Alternatively, at least one semiconductor module 1002a may be interposed between the two separation cooling conduits 1003ba, 1003bb. Particularly, to effectively cool the plurality of semiconductor modules 1002a, a high heating semiconductor module 1002a, among the plurality of semiconductor modules 1002a, may be interposed between the two separation cooling conduits 1003ba, 1003bb.

Ninth Embodiment

Figure 32:
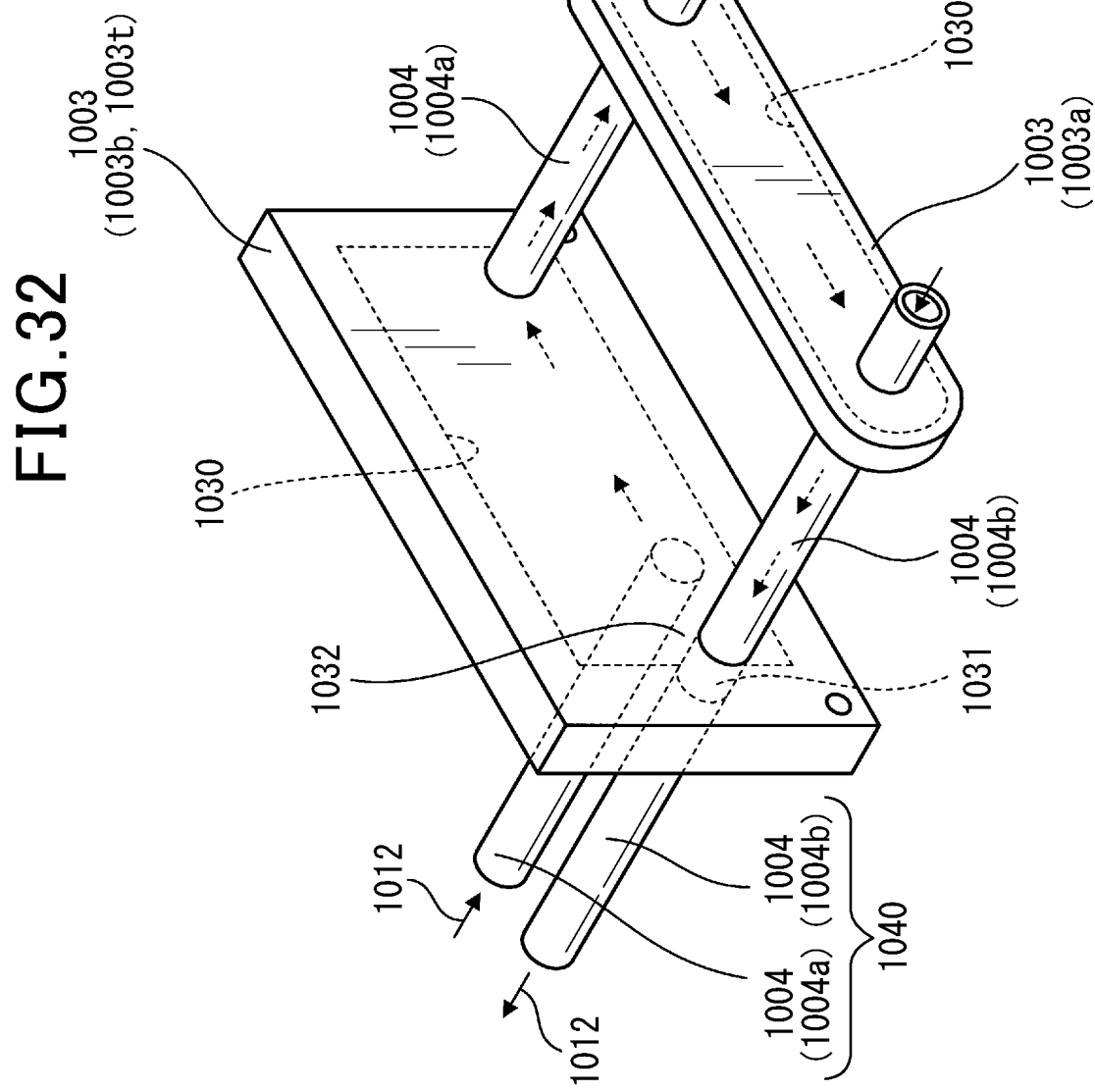
FIG. 32 is a perspective view of a separation cooling conduit and a cooling conduit of a ninth embodiment.
Figure 33:
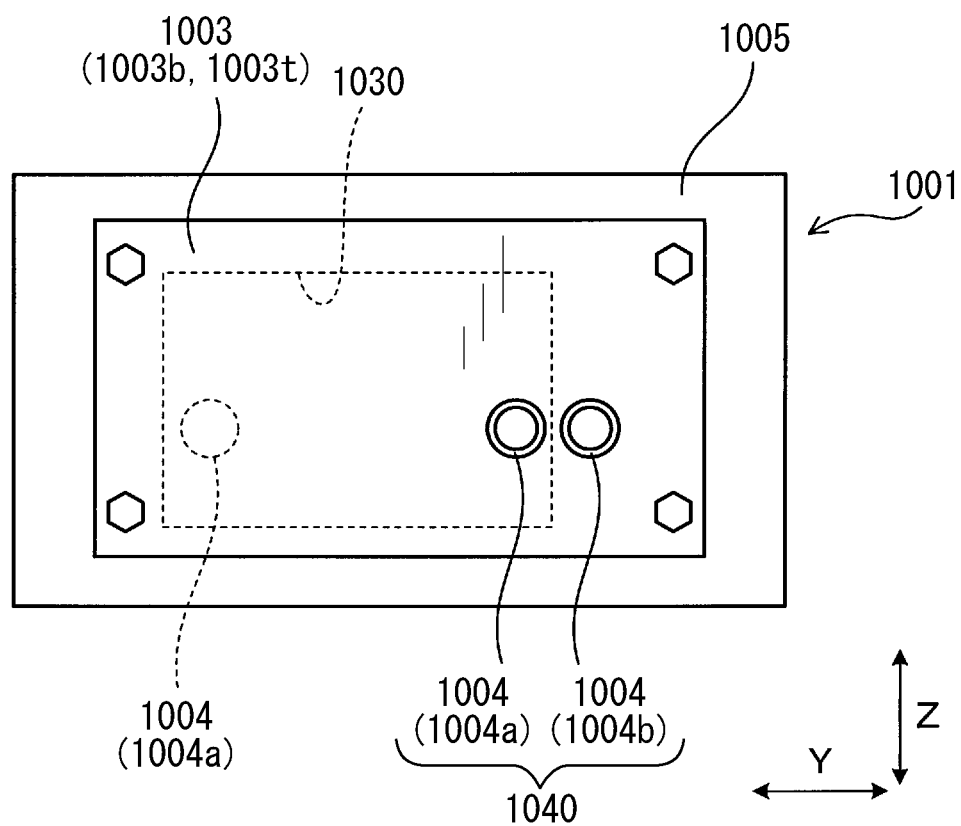
FIG. 33 is a side view of the power converter of the ninth embodiment, where an electronic component outside a casing is removed.

In a ninth embodiment, the positional relationship between the flow-channel pipe 1004a and the through pipe 1004b, forming the pair of pipes 1040, is modified. In the present embodiment, as shown in FIGS. 32 and 33 the flow-channel pipe 1004a and the through pipe 1004b, forming the pair of pipes 1040, are adjacent to each other in the Y-direction. As in the seventh embodiment, a cooling conduit 1003t that is one of the plurality of cooling conduits 1003 disposed at one end of the stack 1010 in the X-direction is deemed as the separation cooling conduit 1003b, where the pair of pipes 1040 are connected to the separation cooling conduit 1003b.

As above, in the present embodiment, the flow-channel pipe 1004a and the through pipe 1004b, forming the pair of pipes 1040, are adjacent to each other in the Y-direction. Therefore, a length of the separation cooling conduit 1003b in the Z-direction can be reduced as compared with the seventh embodiment where the flow-channel pipe 1004a and the through pipe 1004b are adjacent to each other in the Z-direction (see FIGS. 20 and 21), which can facilitate downsizing the power converter 1001.

The present embodiment can also provide similar advantages to those of the seventh embodiment.

Tenth Embodiment

Figure 34:
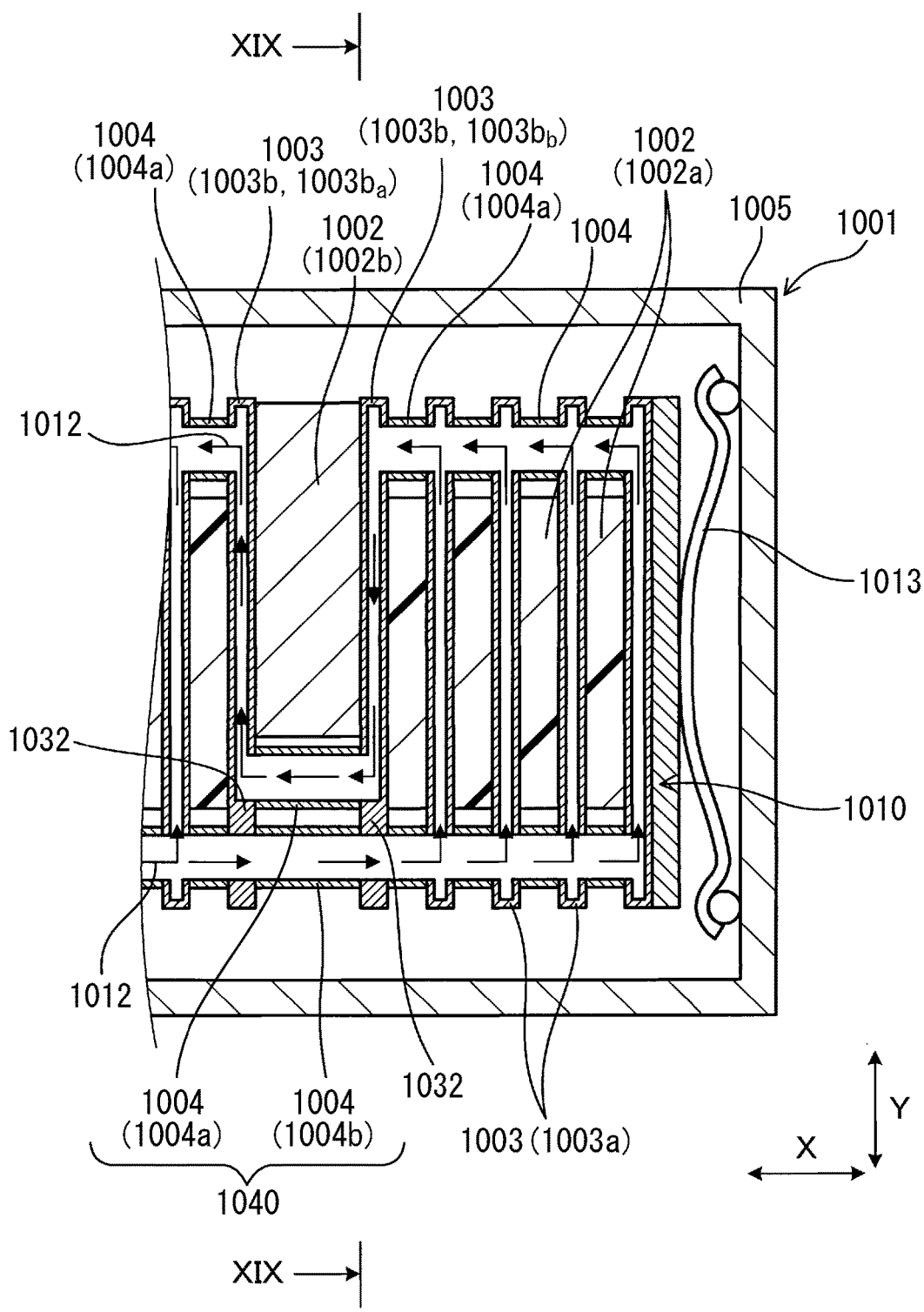
FIG. 34 is a partially enlarged cross-sectional view of a power converter in accordance with a tenth embodiment of the present invention.
Figure 35:
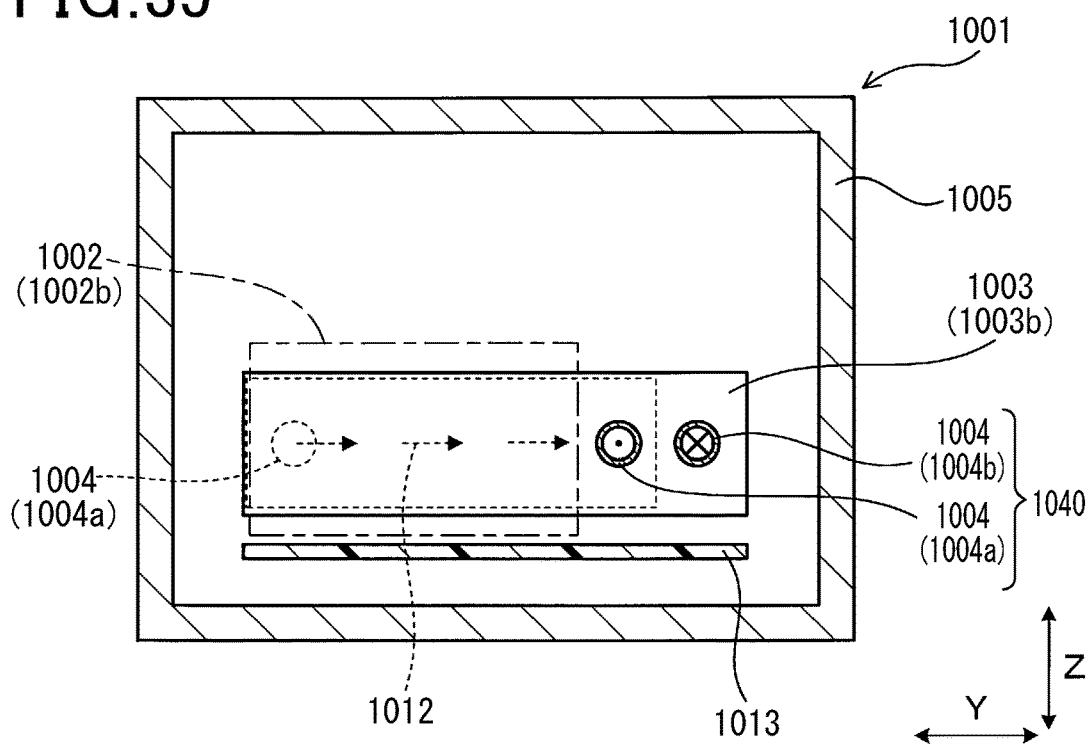
FIG. 35 is a cross-sectional view of the power converter taken along line XIX-XIX of FIG. 34.

In a tenth embodiment, the positional relationship between the flow-channel pipe 1004a and the through pipe 1004b, forming the pair of pipes 1040, is modified. As shown in FIGS. 34 and 35, as in the eighth embodiment, two separation cooling conduits 1003ba, 1003bb are provided at around the middle of the stack 1010 in the X-direction. The flow-channel pipe 4a and the through pipe 4b, connecting the two separation cooling conduits 1003ba, 1003bb, form the pair of pipes 1040.

The flow-channel pipe 1004a and the through pipe 1004b, forming the pair of pipes 1040, are adjacent to each other in the Y-direction. Therefore, a length of each of the separation cooling conduits 1003ba and 1003bb in the Z-direction can be reduced as compared with the eighth embodiment where the flow-channel pipe 1004a and the through pipe 1004b are adjacent to each other in the Z-direction, which can facilitate downsizing the power converter 1001.

The present embodiment can also provide similar advantages to those of the seventh embodiment.

Eleventh Embodiment

Figure 36:
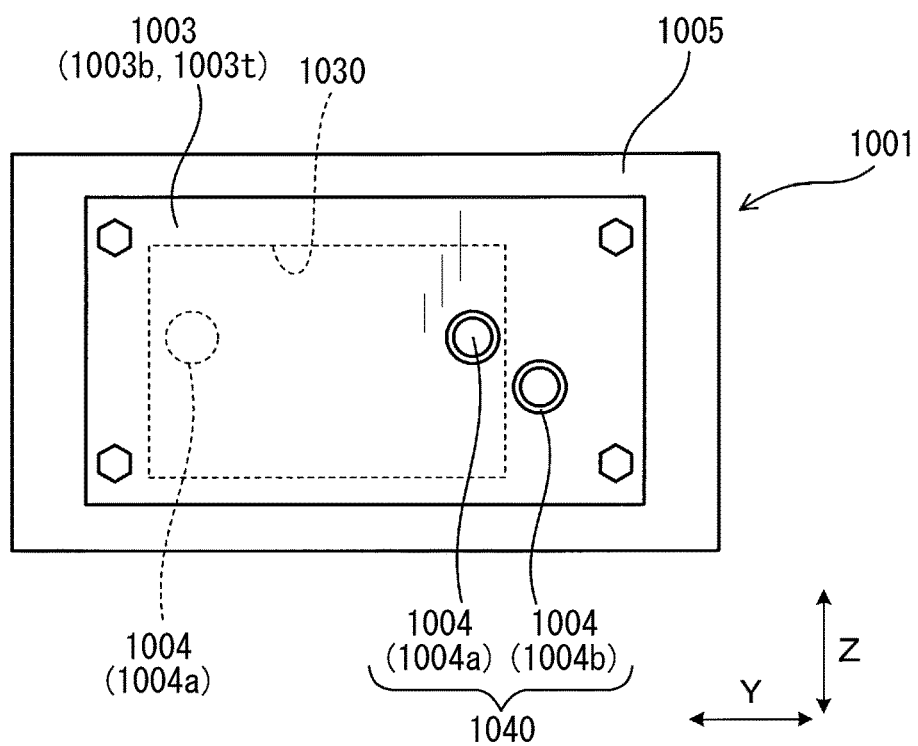
FIG. 36 is a side view of a power converter in accordance with an eleventh embodiment of the present invention, where an electronic component outside a casing is removed.

In an eleventh embodiment, the positional relationship between the flow-channel pipe 1004a and the through pipe 1004b, forming the pair of pipes 1040, is modified. As only one difference in configuration from the seventh embodiment, as shown in FIG. 36, the flow-channel pipe 1004a and the through pipe 1004b, forming the pair of pipes 1040, are adjacent to each other in an oblique direction.

The present embodiment can also provide similar advantages to those of the seventh embodiment.

Figure 37:
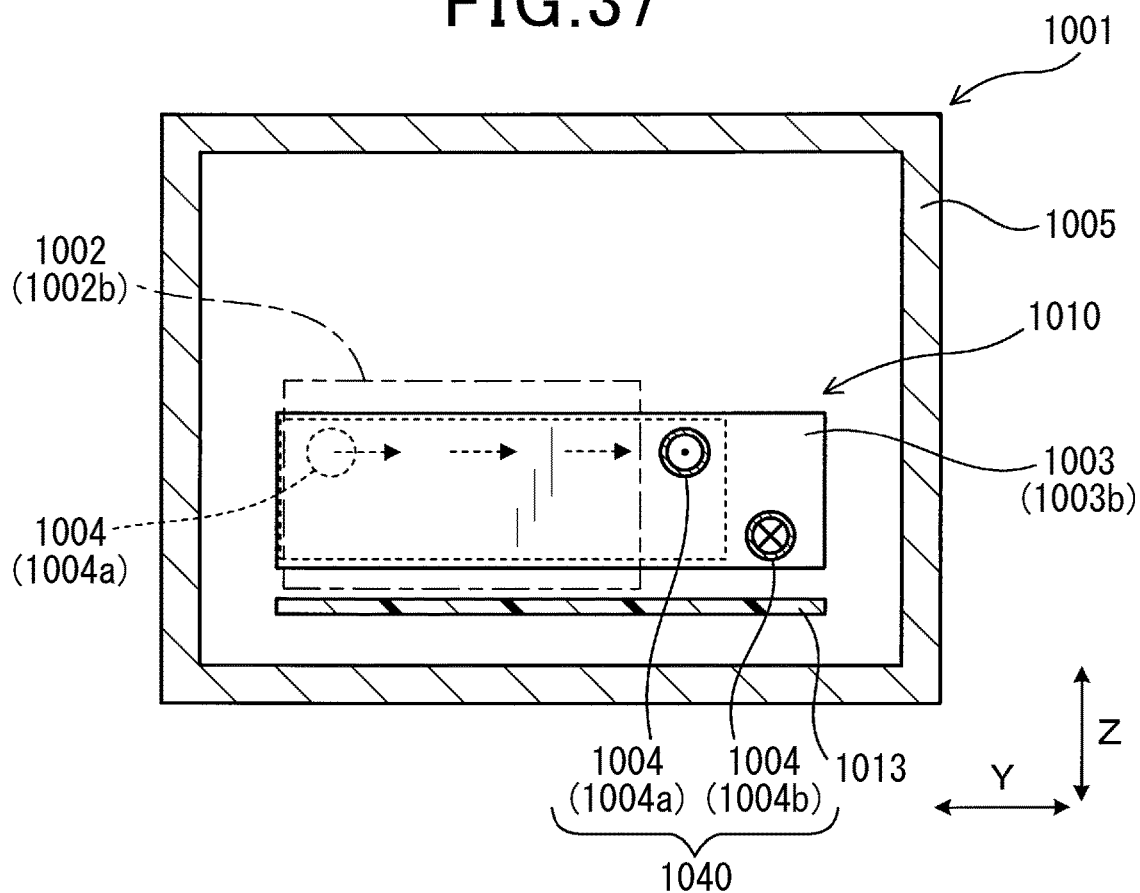
FIG. 37 is a cross-sectional view of the power converter of the eleventh embodiment, where a position of a separation cooling conduit is changed.

In the present embodiment, a cooling conduit 1003t that is one of the plurality of cooling conduits 1003 disposed at one end of the stack 1010 in the X-direction is deemed as the separation cooling conduit 1003b. Alternatively, as shown in FIG. 37, a cooling conduit 1003t that is one of the plurality of cooling conduits 1003 disposed in the middle of the stack 1010 in the X-direction may be the separation cooling conduit 1003b.

The power converters described as above may be configured to be mounted in an electrical vehicle, a hybrid vehicle or the like. However, during travel of the vehicle, substantial vibration is likely to occur in the power converter mounted in the vehicle. Therefore, in the following, embodiments that can improve vibration resistance of electronic component will now be described.

Twelfth Embodiment

Figure 39:
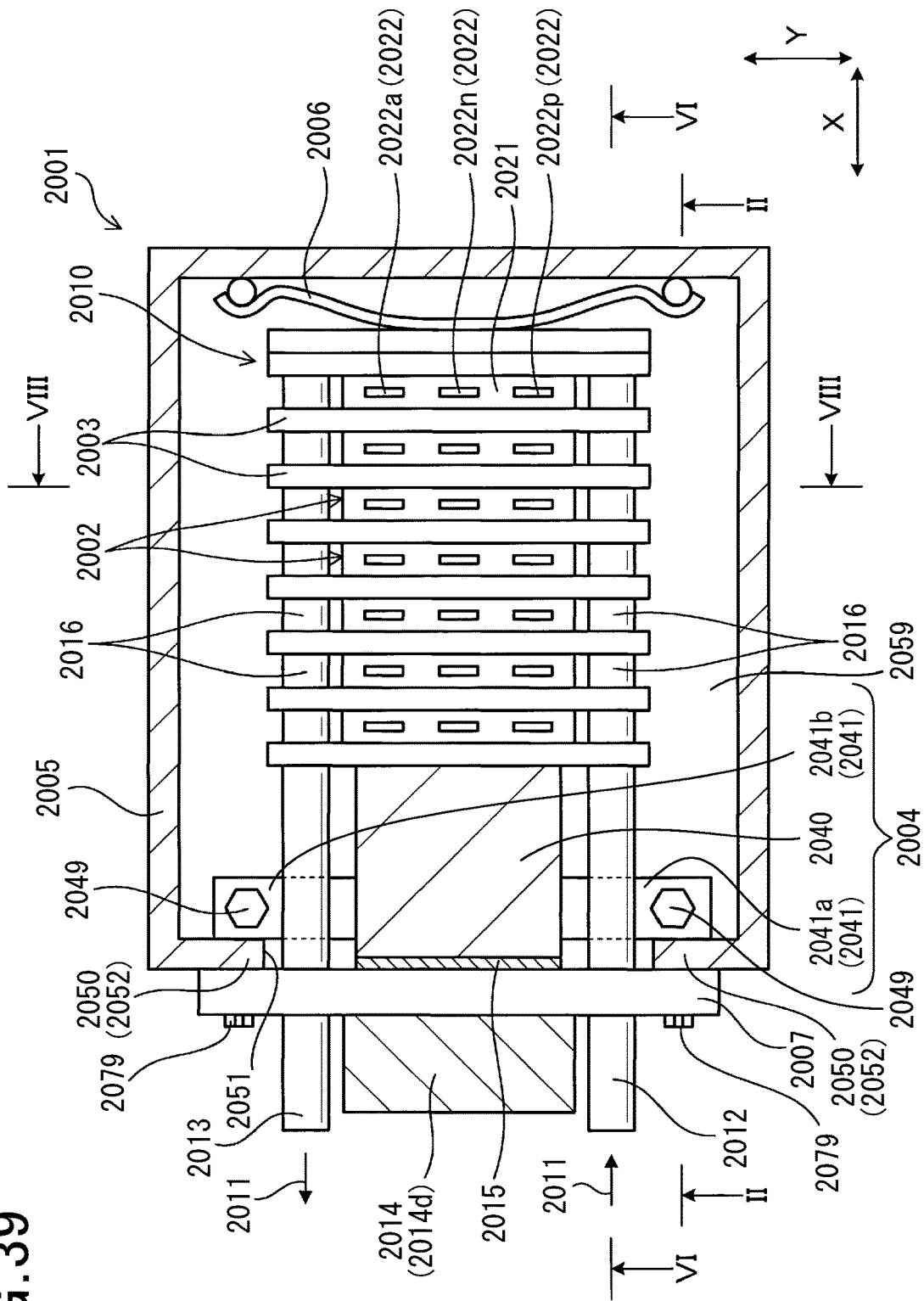
FIG. 39 is a cross-sectional view of a power converter taken along line I-I of FIG. 40, in accordance with a twelfth embodiment of the present invention.
Figure 40:
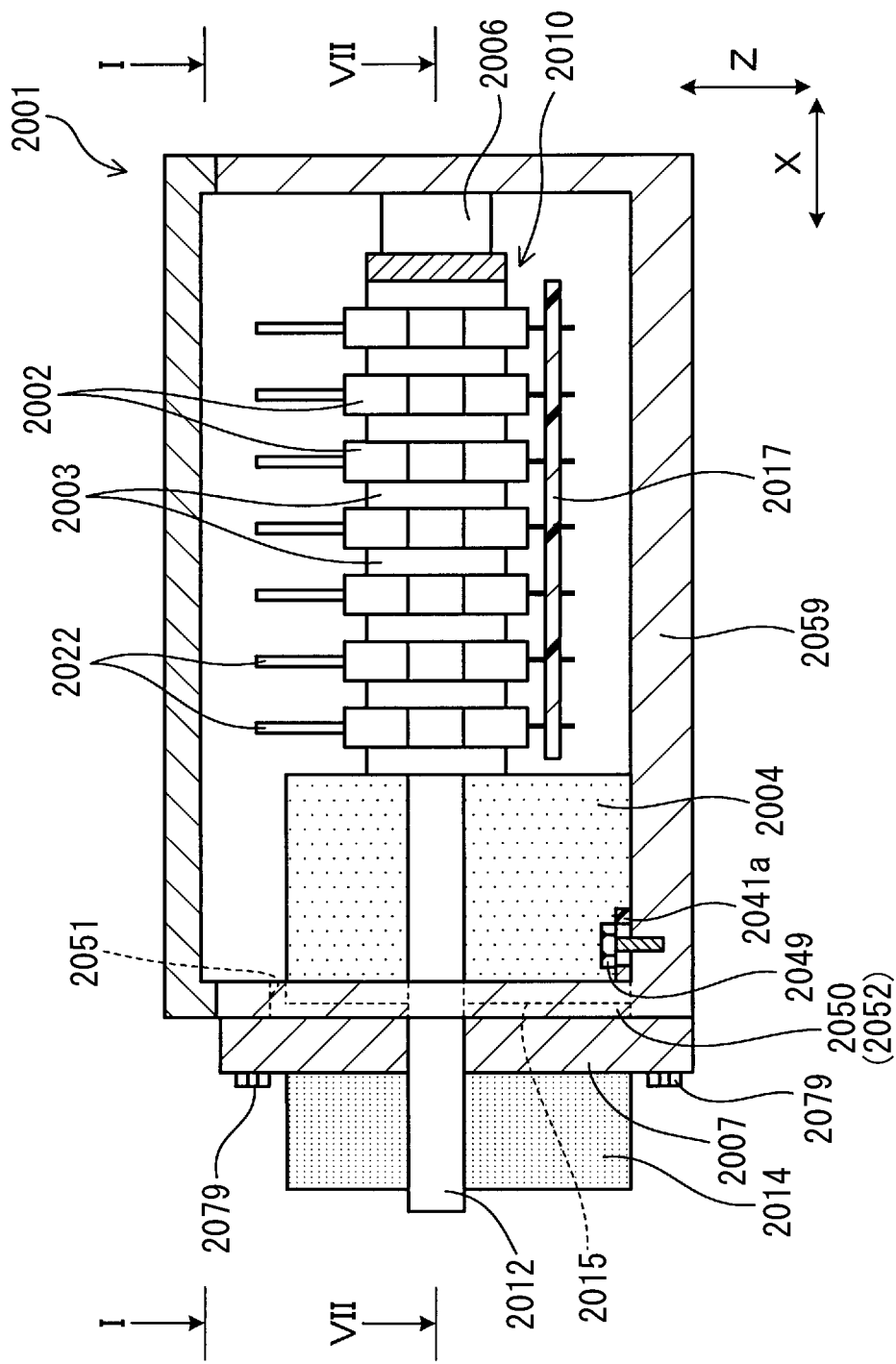
FIG. 40 is a cross-sectional view of the power converter taken along line II-II of FIG. 39.
Figure 41:
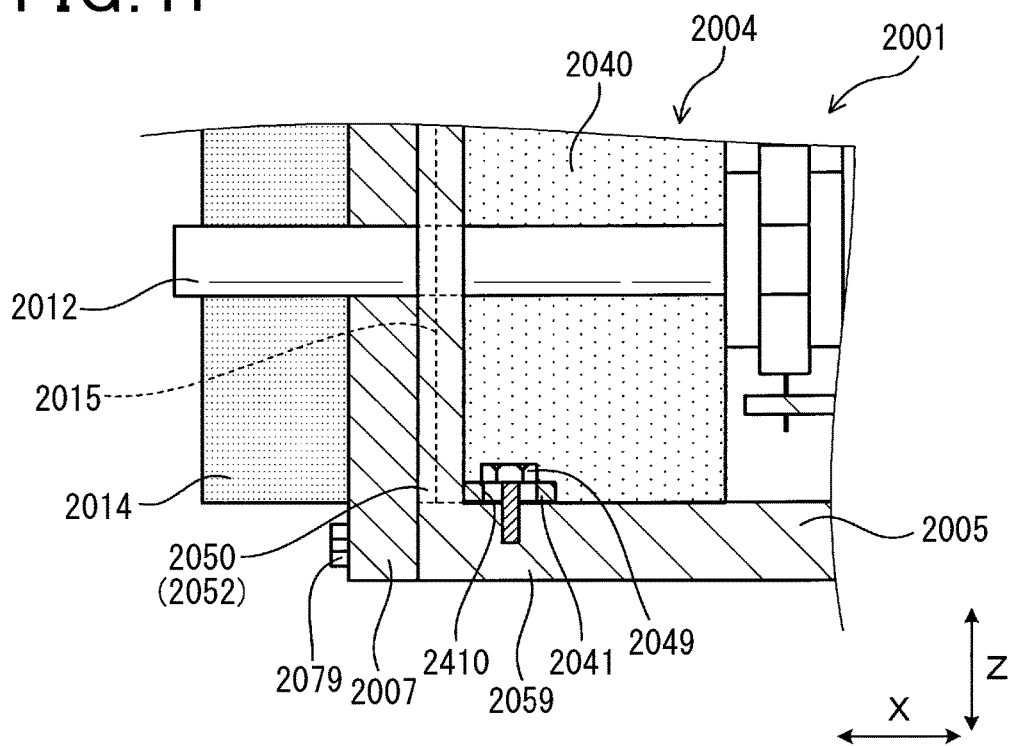
FIG. 41 is an enlarged detail from FIG. 40.

A power converter in accordance with a twelfth embodiment of the present invention will now be described with reference to FIGS. 39-47. As shown in FIGS. 39-41, the power converter 2001 of the present embodiment contains a stack 2010, electronic component 2004, a pressure applying member 2006, a casing 2005, and a cooling plate 2007. The stack 2010 is formed by stacking a plurality of semiconductor modules 2002 and a plurality of cooling conduits 2003. Each semiconductor module 2002 contains semiconductor elements 2020 (see FIG. 47). A coolant 2011 flows through the cooling conduits 2003 to cool the semiconductor modules 2002.

The electronic component 2004 is disposed adjacent to the stack 2010 in the stacking direction (i.e., the X-direction) of the stack 2010. The electronic component 2004 is electrically connected to the semiconductor modules 2002 (see FIG. 47). Each electronic component 2004 has greater mass than the semiconductor modules 2002. The electronic component 2004 of the present embodiment is a boost reactor.

The pressure applying member 2006 presses the stack 2010 towards the electronic component 2004.

The casing 2005 accommodates the stack 2010, the electronic component 2004, and the pressure applying member 2006.

Figure 45:
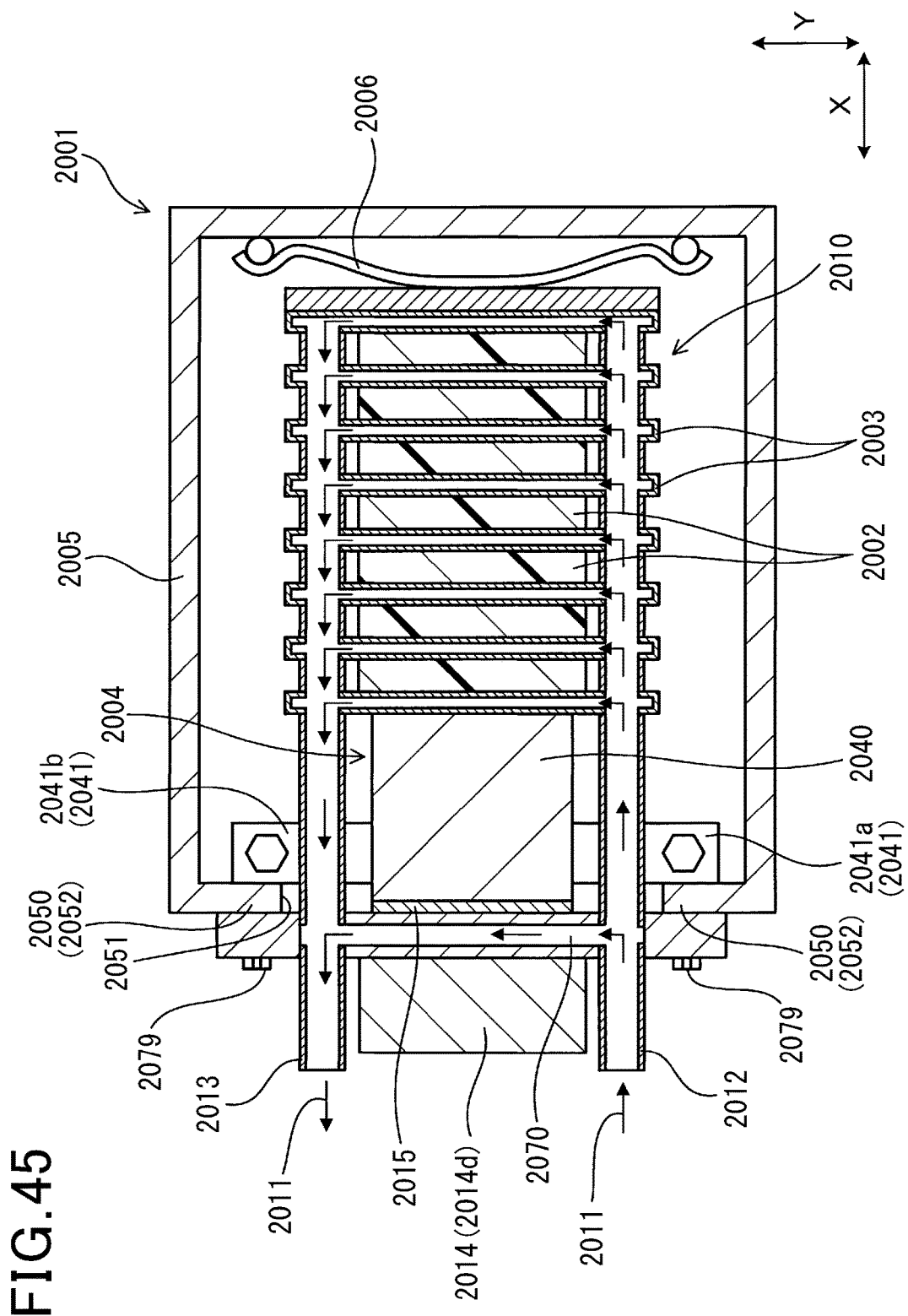
FIG. 45 is a cross-sectional view of the power converter taken along line VII-VII of FIG. 40.

A pathway 2070, through which a coolant 2011 flows, is formed in the cooling plate 2007 (see FIG. 45).

An adjacent side wall 2050 of the casing 2005, adjacent to the electronic component 2004 in the X-direction, has an opening 2051 open toward the X-direction. The opening 2051 is sealed by the cooling plate 2007 from the outside of the casing 2007. The cooling plate 2007 is fastened to the casing 2005 using fastening members 2079. The electronic component 2004 is cooled by the cooling plate 2007 from an opposite side of the cooling plate 2007 from a side thereof on which the stack 2010 is disposed.

The electronic component 2004 has a body 2040 and protrusions 2041. The body 2040 is electrically connected to the semiconductor modules 2002 (see FIG. 47). The electronic component 2004 is fastened to the casing 2005.

As shown in FIGS. 39 and 41, the casing 2005 has an abutment 2052. The protrusions 2041 of the electronic component 2004 abut the abutment 2052 from the X-direction.

Figure 47:
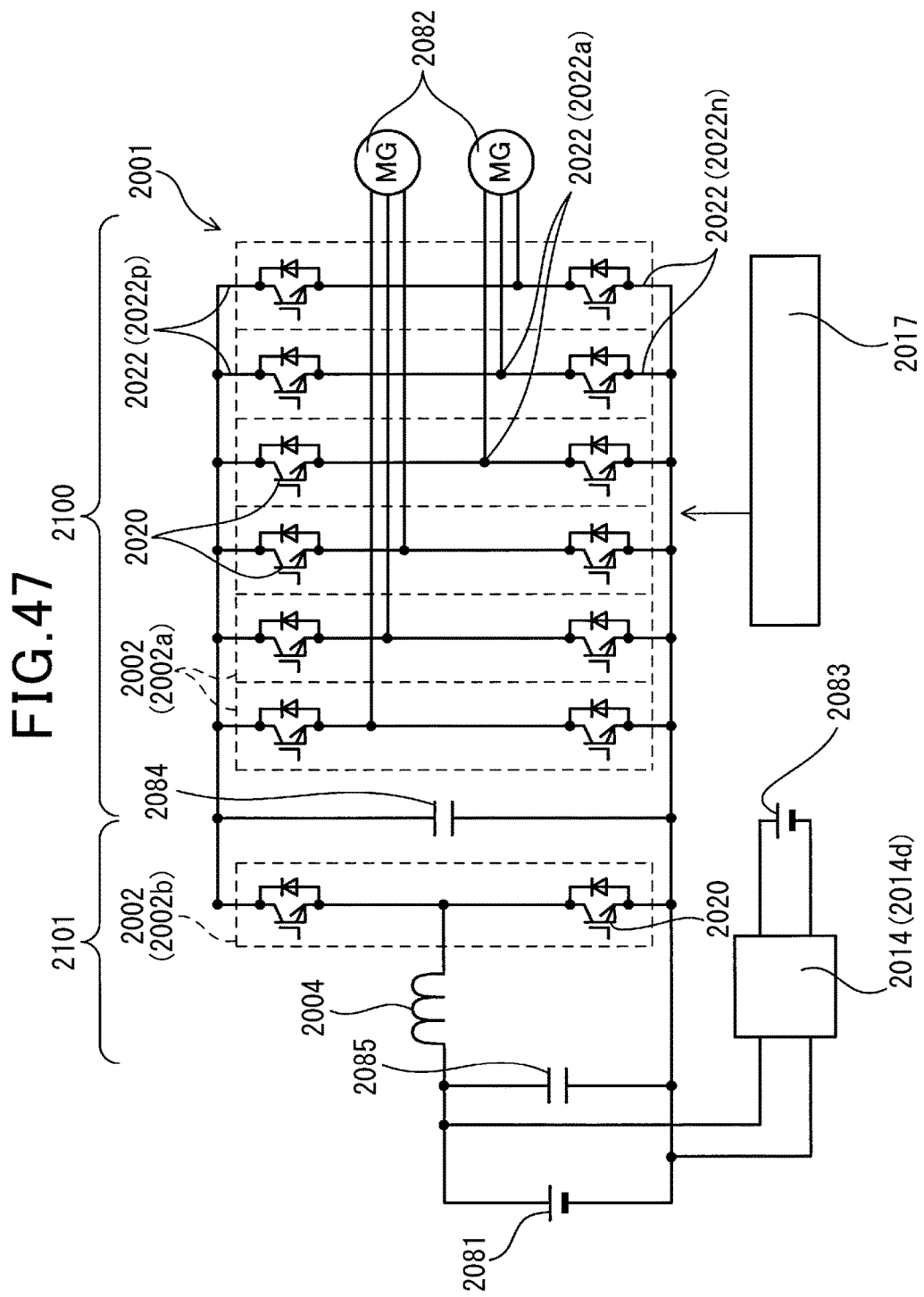
FIG. 47 is a circuit diagram of the power converter of the twelfth embodiment.

The power converter 2001 may be a vehicle-mounted power converter for an electrical vehicle, a hybrid vehicle or the like. As shown in FIG. 47, the power converter 2001 includes an inverter 2100 and a booster 2101. The booster 2101 is formed of a semiconductor module 2002b, a reactor (i.e., the electronic component 2004), and a filter capacitor 2085. The semiconductor module 2002b contains semiconductor elements 2020 such insulated gate bipolar transistors (IGBTs). The DC voltage of the DC power source 2081 is stepped up by switching on and off the semiconductor elements 2020.

The inverter 2100 is formed of a plurality of semiconductor modules 2002a and a smoothing capacitor 2084. The smoothing capacitor 2084 smoothes the voltage stepped up by the booster 2101. The stepped-up DC power is converted into alternating-current (AC) power by switching on and off the semiconductor modules 2002a. The vehicle is driven by the AC power driving an AC load 2082 such as a three-phase AC motor.

A DC-to-DC converter 2014d is electrically connected in parallel with the filter capacitor 2085. The low-voltage battery 2083 is charged by the DC-to-DC converter 2014d stepping down the voltage of the DC power source 2081.

Figure 46:
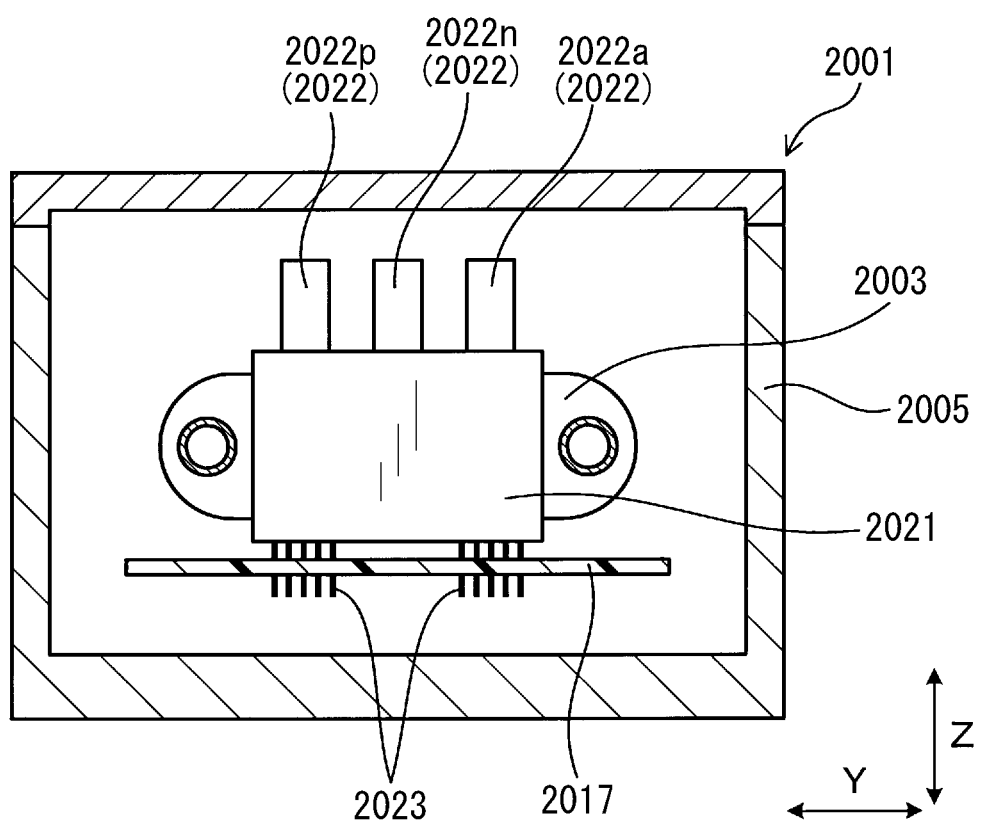
FIG. 46 is a cross-sectional view of the power converter taken along line VIII-VIII of FIG. 39.

As shown in FIG. 46, each semiconductor module 2002 has a body 2021 incorporating therein the semiconductor elements 2020 and power terminals 2022 and control terminals 2023 protruding from the body 2021. The power terminals 2022 include DC terminals 2022p and 2022n to which a DC voltage is applied and an AC terminal 2022a to which the AC load 2082 is electrically connected. The control terminals 2023 are electrically connected to a control circuit board 2017 used to control switching of the semiconductor elements 2020.

As shown in FIGS. 39 and 45, an inlet pipe 2012 into which the coolant 2011 is introduced and an outlet pipe 2013 through which the coolant 2011 is led out are connected to the cooling plate 2007. Any two cooling conduits 2003 adjacent to each other in the X-direction are connected by two connecting pipes 2016 located on both ends of each cooling conduit 2003 in a width direction (i.e., the Y-direction) that is perpendicular to a protruding direction (i.e., the Z-direction) of the power terminals 2022 and to the X-direction.

The coolant 2011 introduced into the inlet pipe 2012 divides and flows through the plurality of cooling conduits 2003 and the cooling plate 2007. Thereafter, the separate coolant flows 2011 that have passed through the respective cooling conduits 2003 and the cooling plate 2007 merge and leave through the outlet pipe 2013, thereby cooling the semiconductor modules 2002 and the electronic component 2004.

Figure 42:
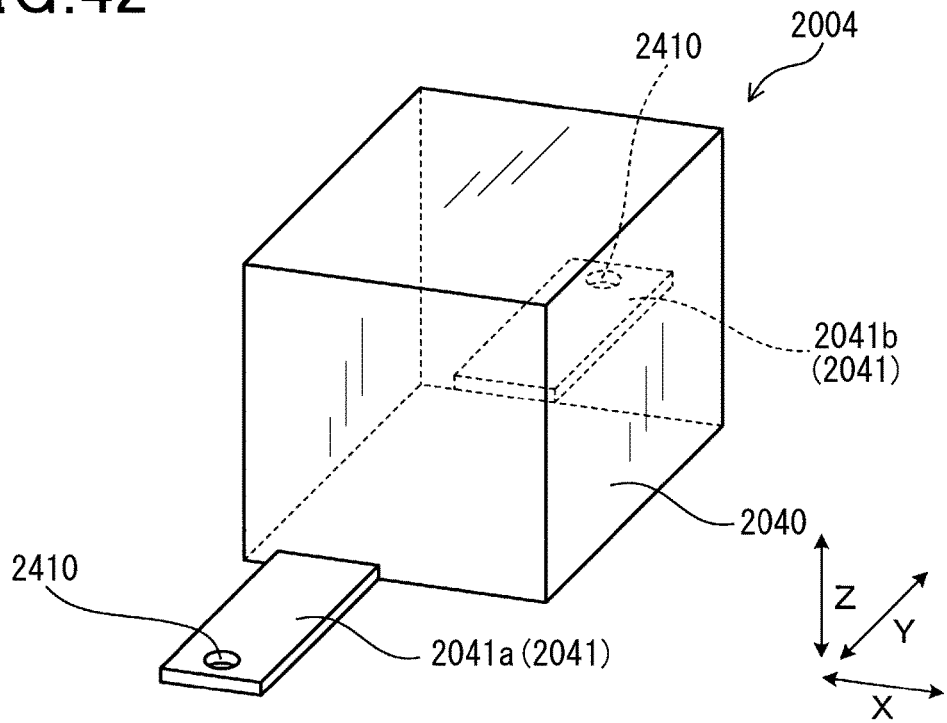
FIG. 42 is a perspective view of an electronic component of the twelfth embodiment.

As shown in FIG. 42, the electronic component 2004 has a body 2040, a pair of protrusions 2041(2041a, 2041b) protruding from the body in the Y-direction. Each protrusion 2041 has an insertion hole 2410 extending therethrough in the Z-direction. As shown in FIG. 41, a bolt 2049 is inserted into the insertion hole 2410 and fastened to a bottom wall 2059 of the casing 2005. In the present embodiment, each protrusion 2041 fastened to the casing 2005 in the direction (Z-direction) perpendicular to the X-direction.

Figure 43:
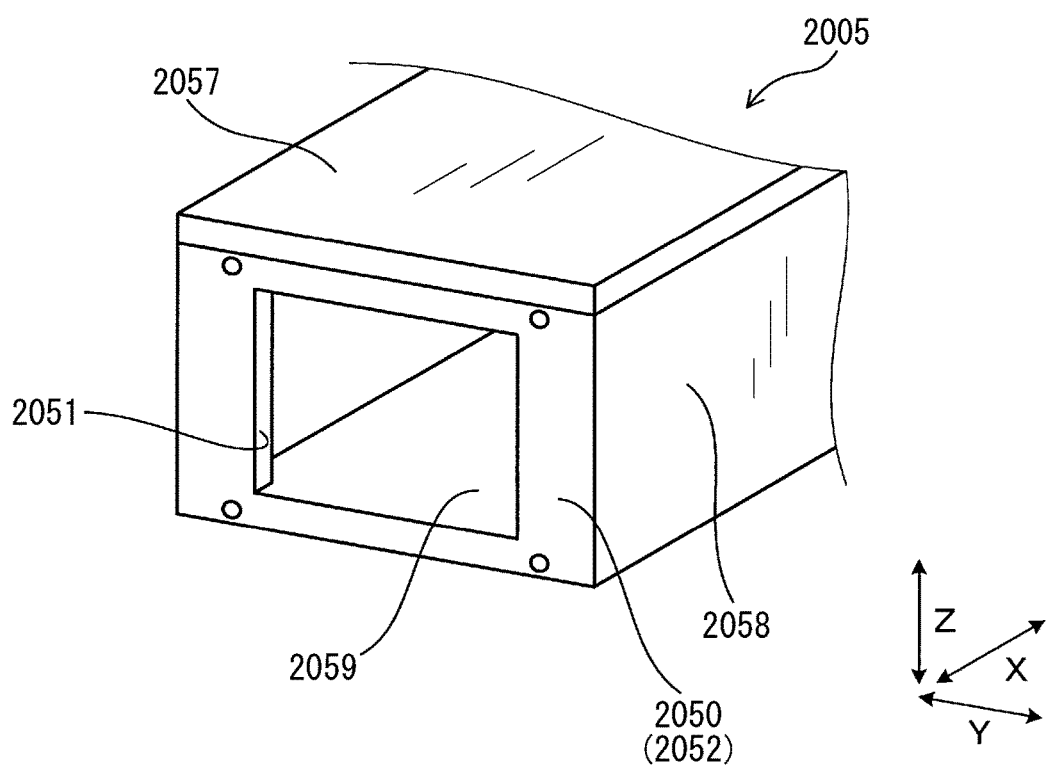
FIG. 43 is a partial perspective view of a casing of the twelfth embodiment.

As shown in FIG. 43, the casing 2005 includes the bottom wall 2059, adjacent side walls 2050, 2058 extending from the bottom wall 2059, and a cover 2057. The adjacent side wall 2050 of the casing 2005, adjacent to the electronic component 2004 in the X-direction, has the opening 2051 that opens toward the X-direction. The opening 2051 is sealed by the cooling plate 2007 from the outside of the casing. The cooling plate 2007 is fastened to the casing 2005 by the fastening members 2079. As shown in FIG. 41, the protrusions 2041 of the electronic component 2004 abut the adjacent side wall 2050 from the X-direction. As such, in the present embodiment, the adjacent side wall 2050 is deemed as an abutment 2052.

As shown in FIGS. 39 and 45, a heat dissipation resilient member 2015 is interposed between the body 2040 of the electronic component 2004 and the cooling plate 2007. The heat dissipation resilient member 2015 is made of a material having a higher thermal conductivity than air. The heat dissipation resilient member 2015 has a lower Young's modulus than the adjacent side wall 2050. Heat generated in the electronic component 2004 is dissipated to the cooling plate 2007 via the heat dissipation resilient member 2015. For example, a silicon rubber may be used as the heat dissipation member 2015.

As shown in FIGS. 39 and 45, a pressure applying member 2016, such as a plate spring, is disposed within the casing 2005. The stack 2010 and the electronic component 2004 are pressed against the adjacent side wall 2050 by the pressure applying member 2016, thereby securing the stack 10 and the electronic component 2004 within the casing 2006. Intimate contact between the cooling conduits 2003 and the semiconductor modules 2002 are established by a pressure applied by the pressure applying member 2016.

A supporting electronic component 2014 is disposed on an opposite side of the cooling plate 2007 from a side thereof on which the electronic component 2004 is disposed. The supporting electronic component 2014 is electrically connected to the semiconductor module 2002 and has greater mass than the semiconductor modules 2002. In the present embodiment, the supporting electronic component 2014 is the DC-to-DC converter 2014d (see FIG. 47).

Figure 44:
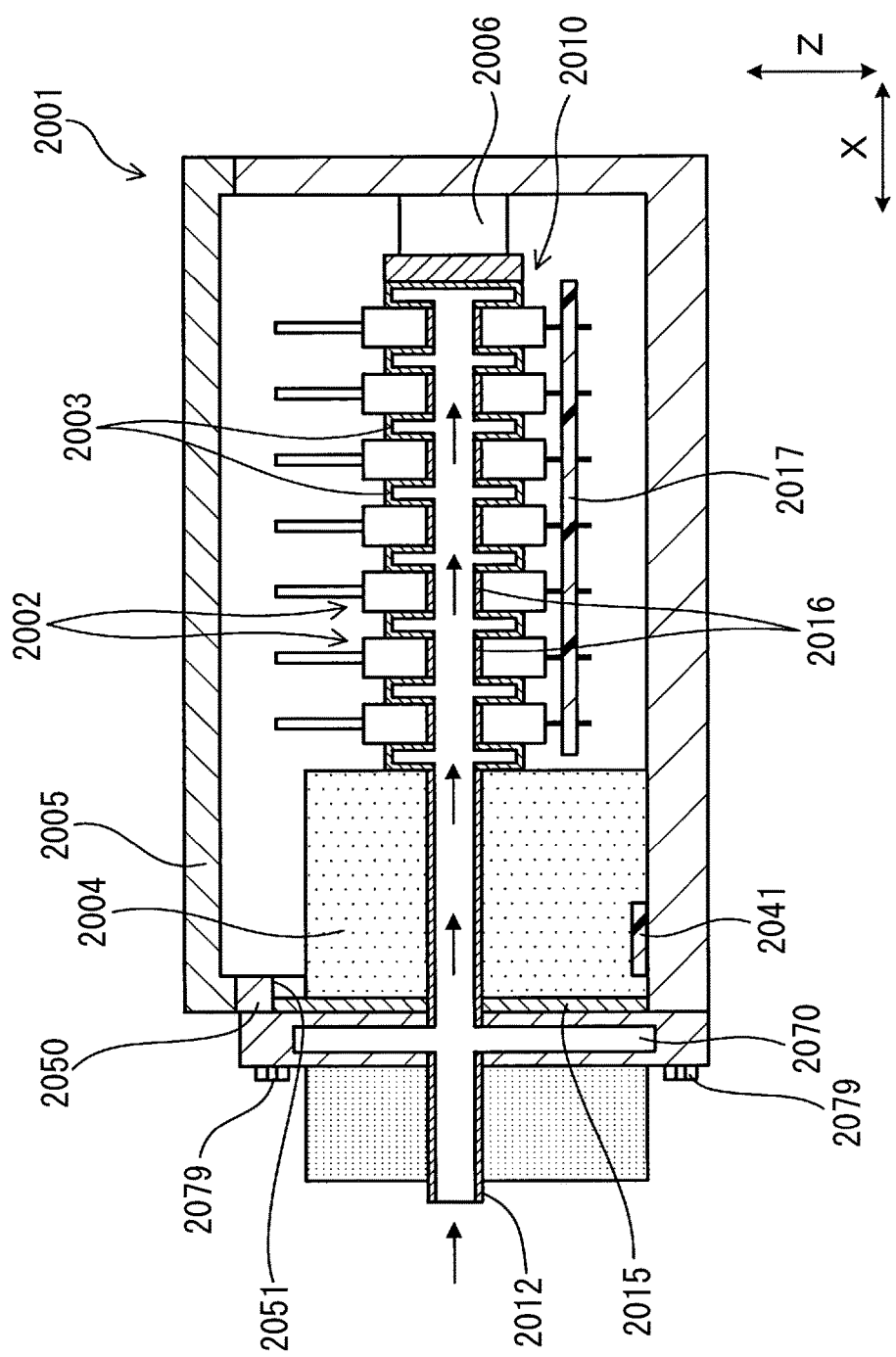
FIG. 44 is a cross-sectional view of the power converter taken along line VI-VI of FIG. 39.

The present embodiment can provide the following advantages. In the present embodiment, as shown in FIGS. 39 and 44, the adjacent side wall 2050 of the casing 2005 has the opening 2051 formed therein. The opening 2051 is sealed by the cooling plate 2007 from the outside of the casing 2005, and the cooling plate 2007 is secured to the casing 2005. The electronic component 2004 is cooled using the cooling plate 2007.

The cooling plate 2007 having a pathway 2070 therein for the coolant 2011 allows the electronic components 2004 to be effectively cooled.

As shown in FIGS. 39 and 41, the electronic component 2004 has the protrusions 2041. The protrusions 2041 abut the abutment 2052 of the casing 2005 from the X-direction.

This allows forces applied by the pressure applying member 2006 to the electronic component 2004 to be received by the abutment 2052. Therefore, the electronic component 2004 can be secured in the X-direction, thereby improving vibration resistance of the electronic component 2004.

In addition, in the present embodiment, the protrusions 2041 abut the abutment 2052, which can prevent the body 2040 of the electronic component 2004 from being pressed against the cooling plate 2007. That is, forces are less liable to be applied from the pressure applying member 2006 to cooling plate 2007 through the body 2040. Therefore, this can prevent heavy loading of fixing points between the cooling plate 2007 and the casing 2005 (i.e., the fastening members 2079).

Figure 61:
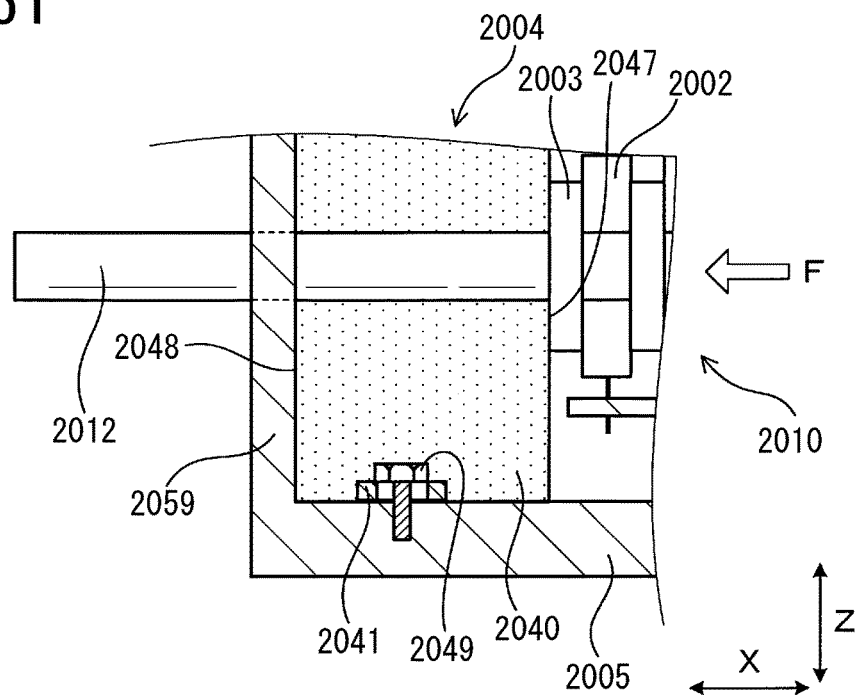
FIG. 61 is an enlarged cross-sectional view of a power converter in accordance with a first comparative example.

In a comparative example where, as shown in FIG. 61, a cooling plate 2007 is not provided and the stack 2010 and the electronic component 2004 are pressed against the side wall 2059 of the casing 2005 by the pressure applying member 2006, one face 47 of the electronic component 2004 can be cooled, but the other face of the electronic component 2004 opposite the face 47 thereof in the X-direction cannot be cooled. Due to contact with the side wall 2059, efficiency of cooling the electronic components 2004 cannot be sufficiently improved.

Figure 62:
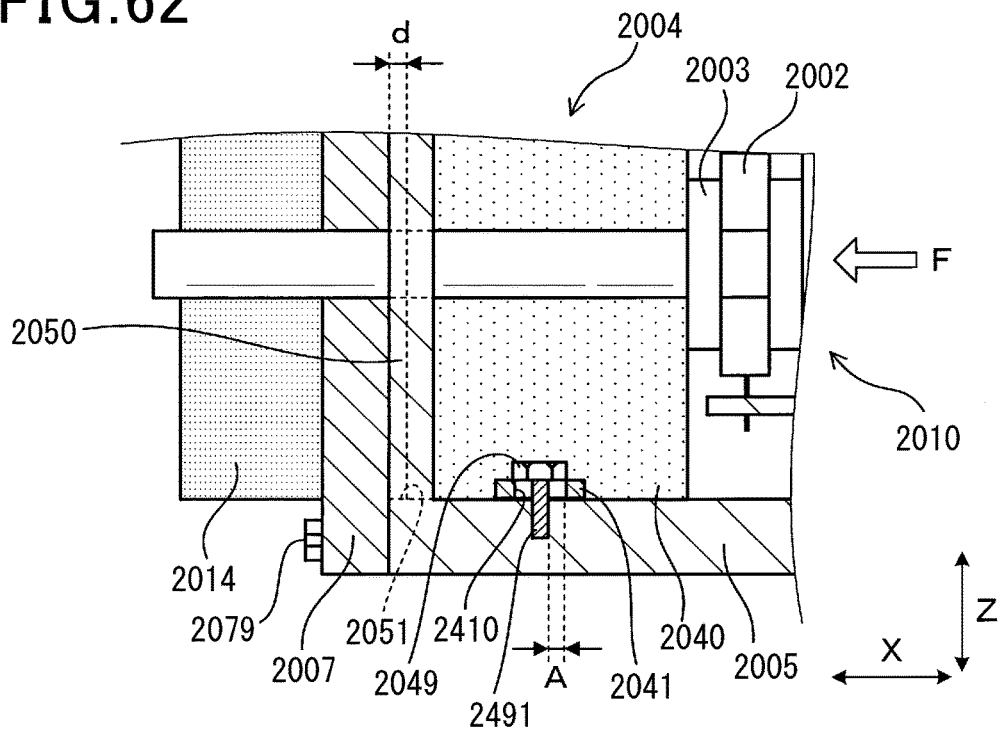
FIG. 62 is an enlarged cross-sectional view of a power converter in accordance with a second comparative example.
Figure 63:
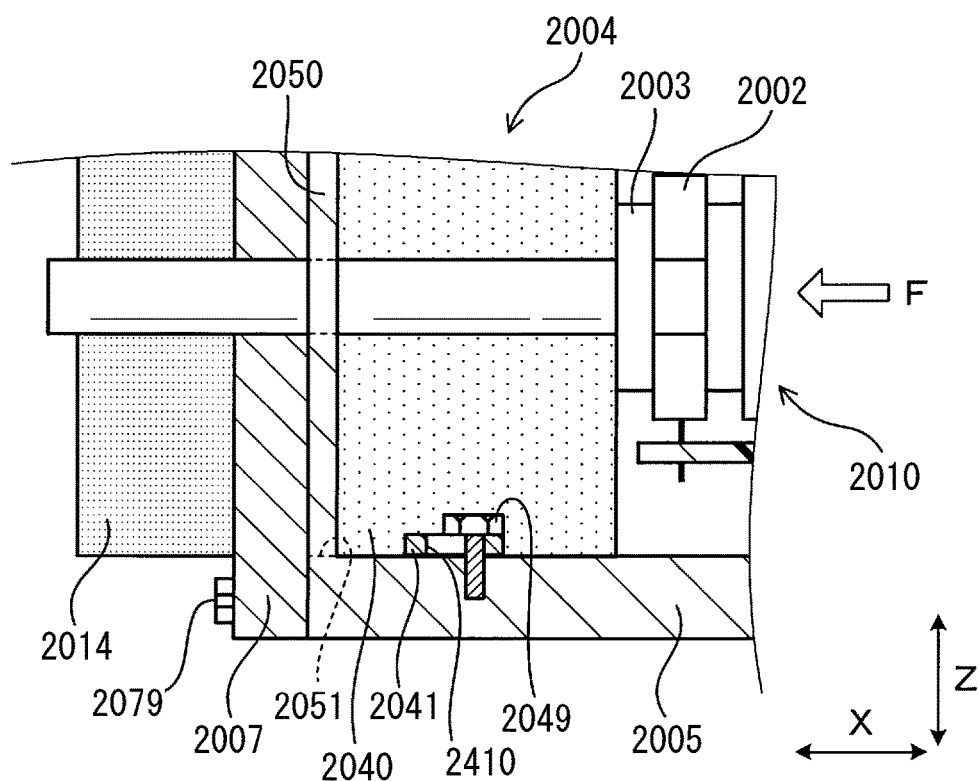
FIG. 63 is a continuation of FIG. 62.

In another comparative example where, as shown in FIG. 62, a cooling plate 2007 is provided, when a strong force is applied to the cooling plate 2007, a strong stress will be generated on the pressure applying member 2006, so that the fastening members 2079 become liable to fall off. Therefore, the cooling plate 2007 and the electronic component 2004 need to be spaced apart from each other by a predetermined spacing D. However, if, as shown in FIG. 62, the protrusions 2041 do not abut the abutment 2052, the electronic component 2004 cannot be secured in the X-direction because there is nothing to receive the force F applied from the pressure applying member 2006 to the electronic components 2004. Thus, under the action of vibrations externally applied to the electronic component 2004, the electronic component 2004 is liable to move in the X-direction. Particularly, an insertion hole 2410 formed in each protrusion 2041 has a greater diameter that a shank 2491 of the bolt 2049 so that the shank 2491 of the bolt 2049 can be readily inserted in the insertion hole 2410. That is, there is a margin A between the shank 2491 of the bolt 2049 and the insertion hole 2410. Thus, under the action of vibrations externally applied to the electronic component 2004, the electronic components 2004, as shown in FIG. 63, is likely to move within the margin A. Movement of the electronic component 2004 in the X-direction may cause the force of the pressure applying member 2004 to be weekend, which may prevent the cooling conduits 2003 and the semiconductor modules 2002 from being in intimate contact with each other.

In contrast, in the present embodiment where, as shown in FIGS. 39 and 41, the protrusions 2041 abut the abutment 2052 from the X-direction, application of the force from the pressure applying member 2006 allows the protrusions 2041 to be pressed against the abutment 2052. Therefore, the electronic components 2004 can be secured to the casing in the X-direction. The body 2040 of the electronic components 2004 is not strongly pressed against the cooling plate 2007, which can prevent heavy loading of the fastening member 2079. In addition, the electronic component 2004 can be effectively cooled by the cooling plate 2007.

In the present embodiment, as shown in FIGS. 39 and 41, the protrusions 2041 protrude from the body 2040 in the direction (i.e., the Y-direction) perpendicular to the X-direction.

Figure 60:
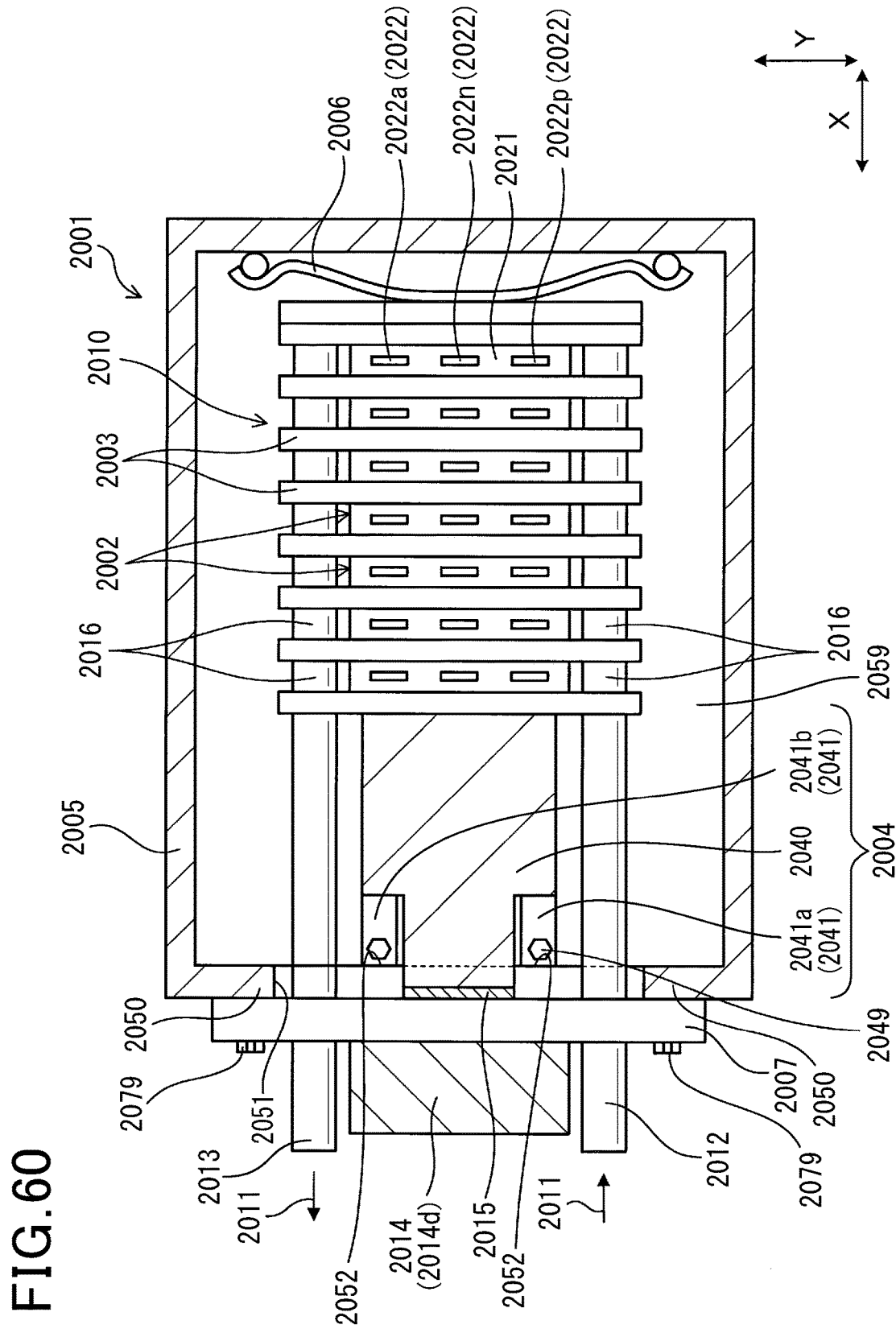
FIG. 60 is a cross-sectional view of a power converter in accordance with an eighteenth embodiment of the present invention.

Indeed, the protrusions 2041 allow to protrude from the body 2040 in the X-direction (see FIG. 60). However, in such an embodiment, the X-directional dimension of the electronic component 2004 is liable to increase, which may cause the power converter 2001 to grow in size. In contrast, in the present embodiment where the protrusions 2041 protrude from the body 2040 in the direction (i.e., the Y-direction) perpendicular to the X-direction, the X-directional dimension of the electronic component 2004 can be decreased, which can downsize the power converter 2001.

In the present embodiment, as shown in FIGS. 39 and 41, the protrusions 2041 abut the adjacent side wall 2050 that is the abutment 2052.

With this configuration, the electronic component 2004 can be effectively cooled. That is, the cooling plate 2007 attached to the adjacent side wall 2050 can cool the adjacent side wall 2050. Therefore, the protrusion 2041 abutting the adjacent side wall 2050 allows the protrusions 2041 to be cooled, whereby the body 2040 of the electronic component 2004 can be cooled.

In the present embodiment, the protrusions 2041 are fastened to the casing 2005 using the bolts 2049.

This can eliminate a need to additionally form portions of the casing 2005 for the electronic component 2004 to be fastened to, which allows the electronic component 2004 to be simplified in structure.

In the present embodiment, as shown in FIGS. 39 and 44, the heat dissipation resilient member 2015 having a higher thermal conductivity than air is interposed between the electronic component 2004 and the cooling plate 2007.

With this configuration, heat generated in the electronic component 2004 can be dissipated to the cooling plate 2007 via the heat dissipation resilient member 2015. In addition, the heat dissipation resilient member 2015 is made of an elastic material having a lower Young's modulus than the adjacent side wall 2050. Thus, forces applied from the pressure applying member 2006 to the body 2040 can be absorbed by the heat dissipation resilient member 2015, thereby effectively preventing large forces from being applied to the cooling plate 2007.

In the present embodiment, as shown in FIG. 39, a supporting electronic component 2014 is disposed on an opposite side of the cooling plate 2007 from a side thereof on which the electronic component 2004 is disposed.

With this configuration, not only the electronic component 2004, but also the supporting electronic component 2014 can be cooled using the cooling plate 2007.

In the present embodiment, as shown in FIG. 39, the protrusions 2041 are fastened to the casing 2005 by the bolts 2049 in a direction (Z-direction) perpendicular to the X-direction.

With this configuration, the electronic component 2004 can be fastened to the casing 2005 in a direction perpendicular to the direction (i.e. the X-direction) in which the electronic component 2004 is secured by the pressure applying member 2006, which can improve vibration resistance of the electronic component 2004.

In the present embodiment, as shown in FIGS. 39 and 44, part of the electronic component 2004 rests inside the opening 2051.

This configuration allows the electronic component 2004 to be closer to the cooling plate 2007, which can improve efficiency of cooling the electronic component 2004.

As above, the present embodiment can provide a power converter that can improve efficiency of cooling the electronic component, can prevent large forces of the pressure applying member from being applied to the cooling plate, and can improve vibration resistance of the electronic component.

In the present embodiment, the reactor is used as the electronic component 2004, and the DC-to-DC converter is used as the supporting electronic component 2014. Alternatively, a capacitor or other electronic components may be used.

In the present embodiment, as shown in FIG. 39, the cooling plate 2007 is fastened to the casing 2005 using the fastening members 2079. Alternatively, the cooling plate 2007 may be fastened to the casing 2005 by brazing or welding the cooling plate 2007 to the casing 2005.

In the following embodiments, although not expressly stated, similar elements are identified using similar reference labels.

Thirteenth Embodiment

Figure 48:
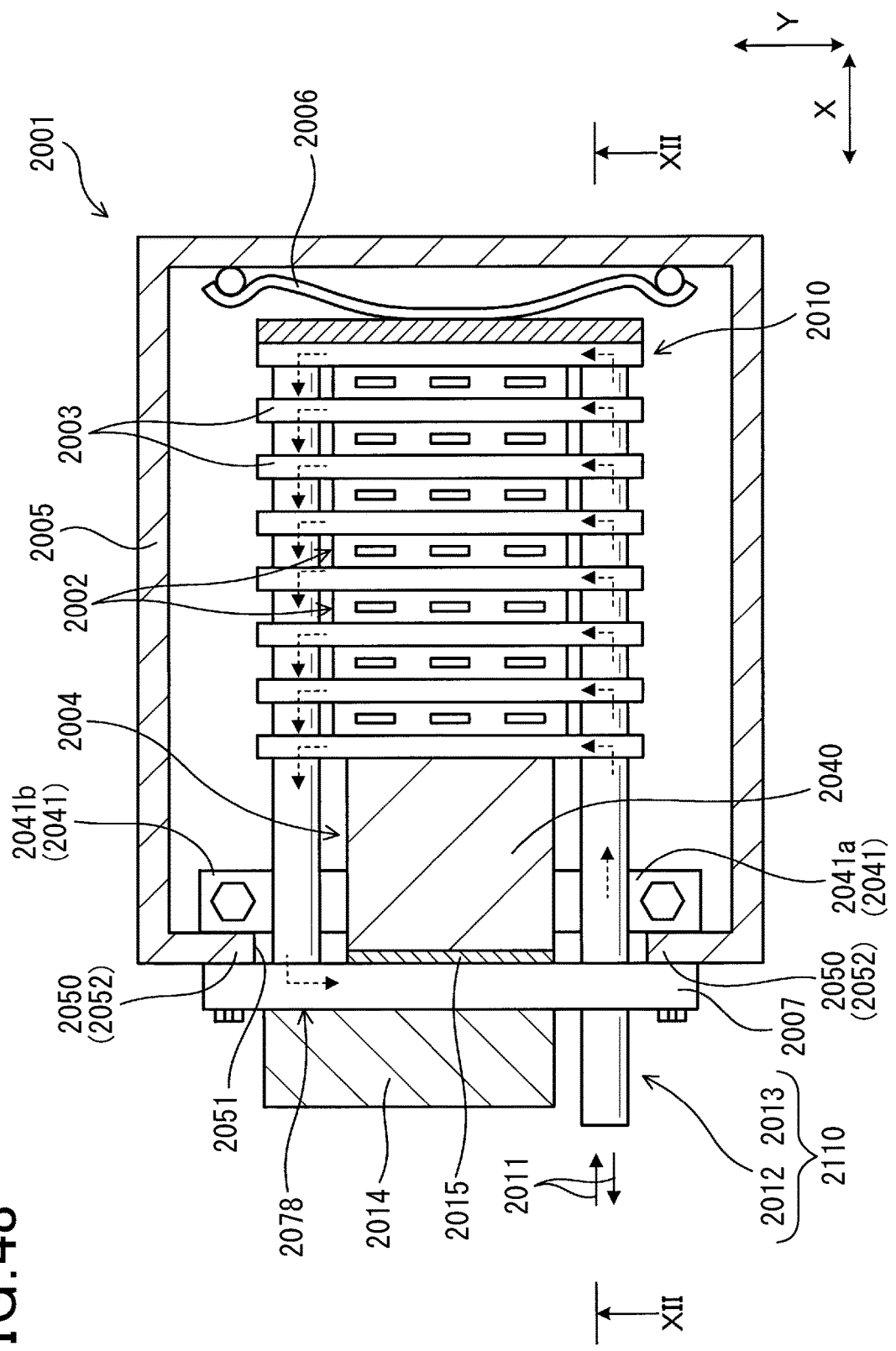
FIG. 48 is a cross-sectional view of a power converter in accordance with a thirteenth embodiment of the present invention.
Figure 49:
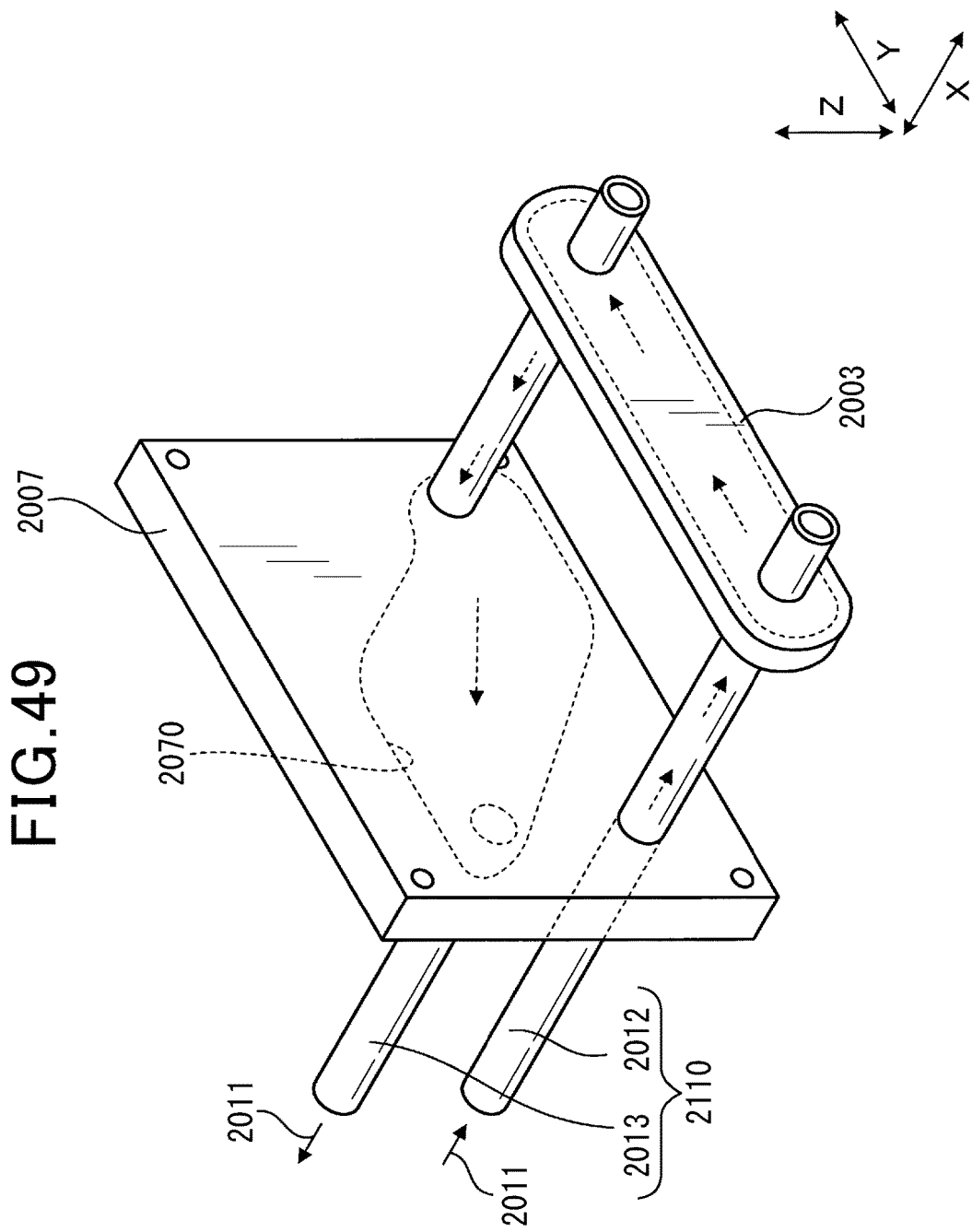
FIG. 49 is a perspective view of a cooling plate and a cooling conduit of the thirteenth embodiment.
Figure 50:
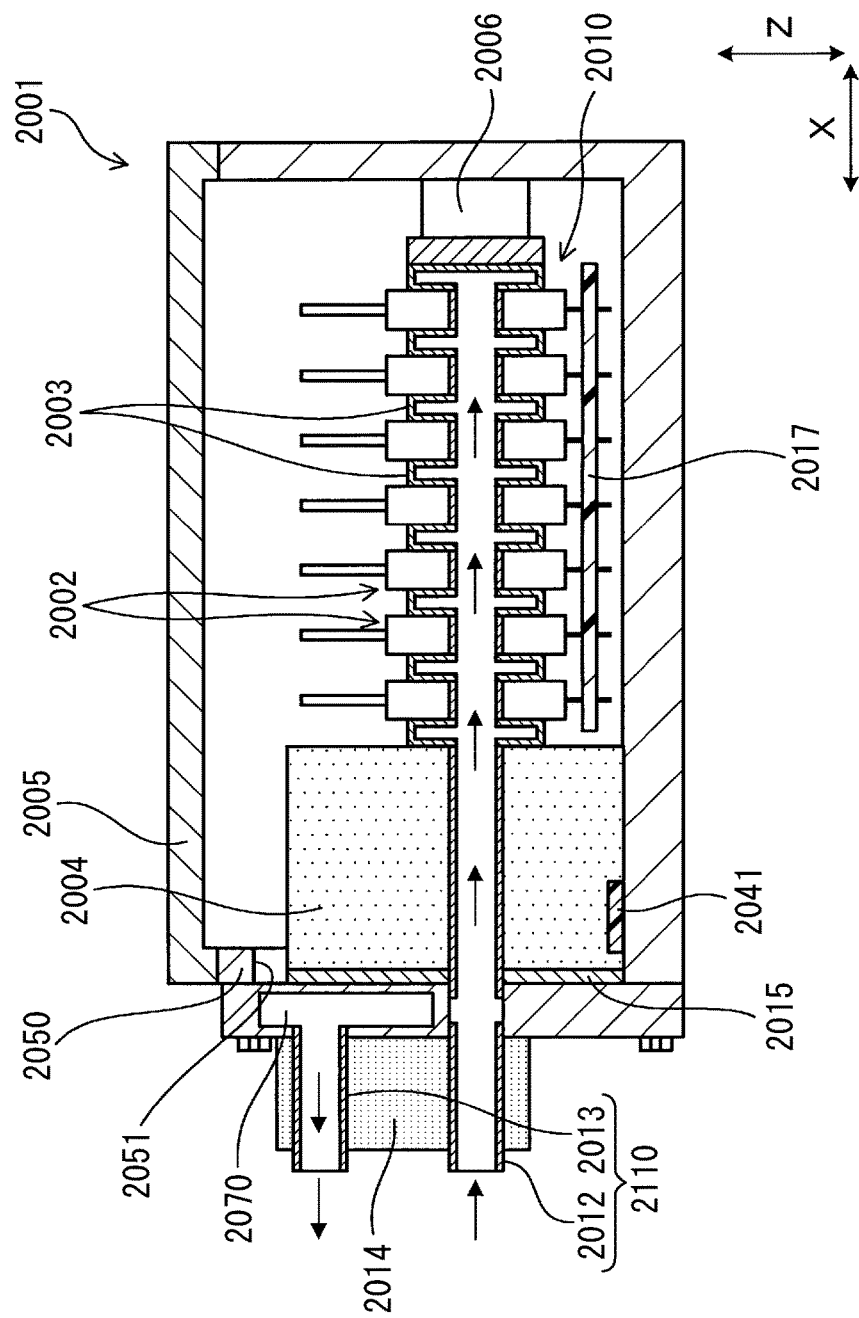
FIG. 50 is a cross-sectional view of the power converter taken along line XII-XII of FIG. 48.

In a thirteenth embodiment, the cooling plate 2007 is modified in configuration. As shown in FIGS. 48-50, the inlet pipe 2012 and the outlet pipe 2013 are connected to the cooling plate 2007 as in the twelfth embodiment. The inlet pipe 2012 and the outlet pipe 2013 are adjacent to each other to form a pair of pipes 2110. The pair of pipes 2110 are formed adjacent to the supporting electronic component 2014. The inlet pipe 2012 and the outlet pipe 2013 are adjacent to each other in the Z-direction.

The coolant 2011 introduced into the inlet pipe 2012 divides and flows through the plurality of cooling conduits 2003. Thereafter, the coolants 2011 that have passed through the plurality of cooling conduits 2003 merge and flow through the pathway 2070 in the cooling plate 2007.

The present embodiment can provide following advantages. In the present embodiment, the inlet pipe 2012 and the outlet pipe 2013 are adjacent to each other to form the pair of pipes 2110. The pair of pipes 2110 are disposed adjacent to the supporting electronic component 2014.

With this configuration, an opposite side of the cooling plate 2007 from a side thereof on which the stack 2010 is disposed may be used to cool the supporting electronic components 2014, which can increase an area of the cooling plate 2007 used to cool the supporting electronic component 2014.

The power converter 2001 of the present embodiment is configured to conduct the entire coolant 2011 introduced into the inlet pipe 2012 through the pathway 2070 in the cooling plate 2007.

This configuration allows a large amount of coolant 2011 to flow through the pathway 2070, thereby improving efficiency of cooling the electronic components 2004 and the supporting electronic component 2014.

The present embodiment can further provide similar advantages to those of the twelfth embodiment.

In the present embodiment, the coolant 2011 introduced into the inlet pipe 2012 divides and flows through the cooling conduits 2003, and then flows within the cooling plate 2007. Alternatively, the flow direction of the coolant 2011 may be reversed. In such a case, the electronic component 2004 and the supporting electronic component 2014 can be cooled by a low temperature coolant 2011 introduced into the outlet pipe 2013, which can lead to higher efficiency of cooling the components 2004 and 2014.

Fourteenth Embodiment

Figure 51:
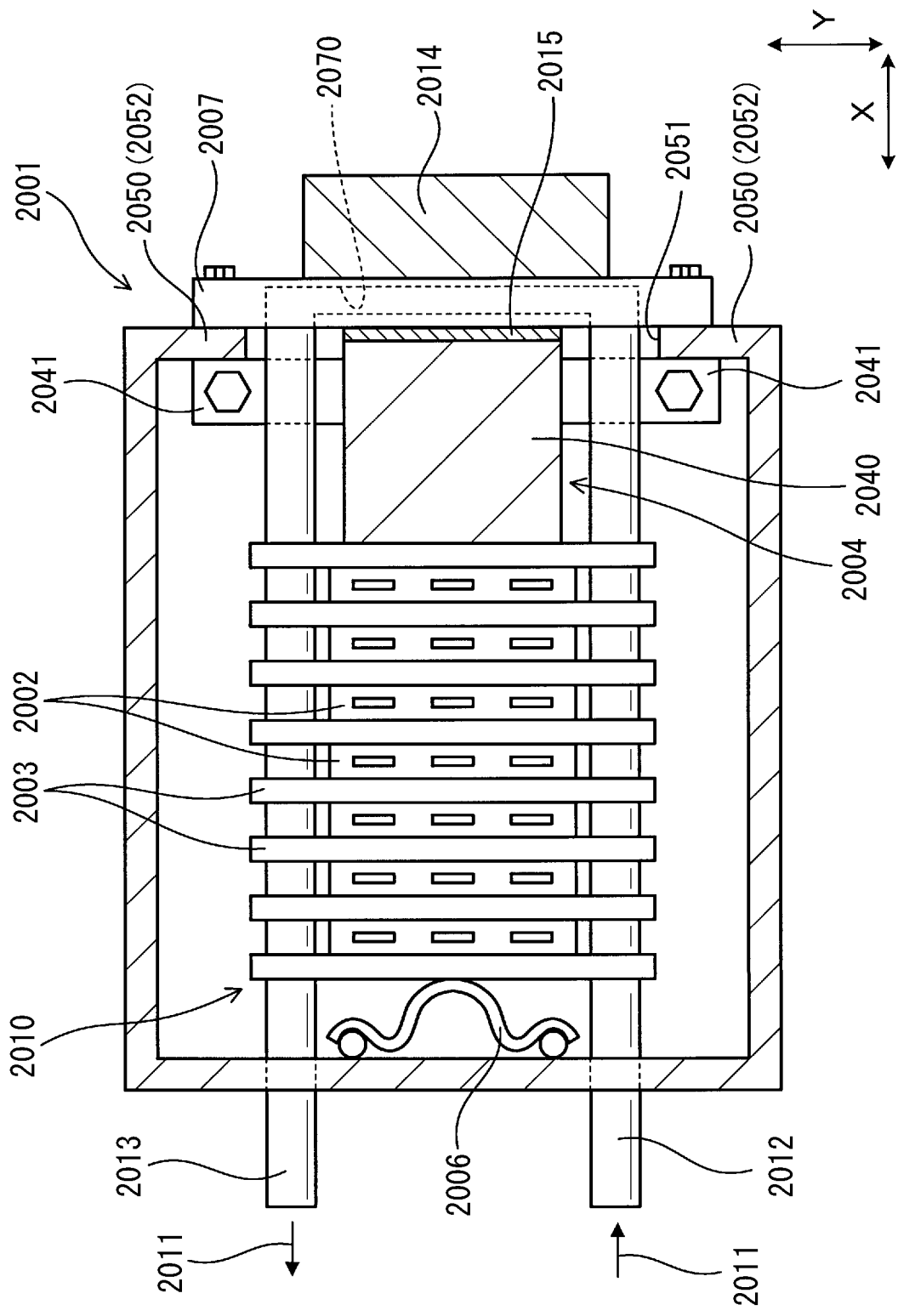
FIG. 51 is a cross-sectional view of a power converter in accordance with a fourteenth embodiment of the present invention.

In the present embodiment, the positional relationship between the electronic component 2004, the cooling plate 2007, and the supporting electronic component 2014 is modified. As shown in FIG. 51, the electronic component 2004, the cooling plate 2007, and the supporting electronic component 2014 are disposed on an opposite side of the stack 2010 from a side thereof in the X-direction on which the inlet pipe 2012 and the outlet pipe 2013 are attached to the casing 2005. The pressure applying member 2006 is disposed on the opposite side of the stack 2010 from the side thereof in the X-direction on which the electronic component 2004 is disposed. The stack 2010 and the electronic component 2004 are pressed against the cooling plate 2007 using the pressure applying member 2006. The protrusions 2041 of the electronic component 2004 abut the adjacent side wall 2050 (i.e., the abutment 2052) from the X-direction.

The present embodiment can further provide similar advantages to those of the twelfth embodiment.

Fifteenth Embodiment

Figure 52:
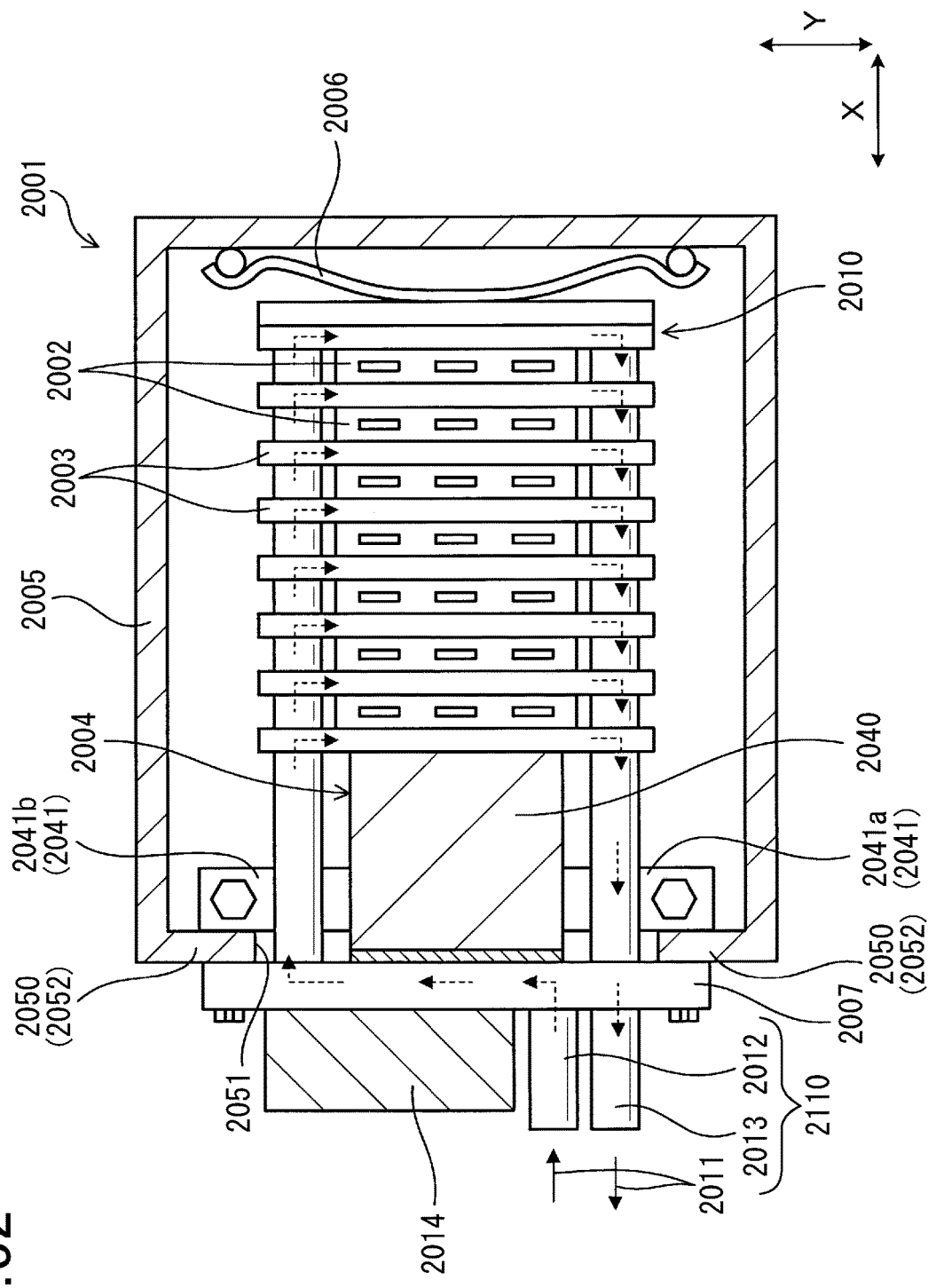
FIG. 52 is a cross-sectional view of a power converter in accordance with a fifteenth embodiment of the present invention.
Figure 53:
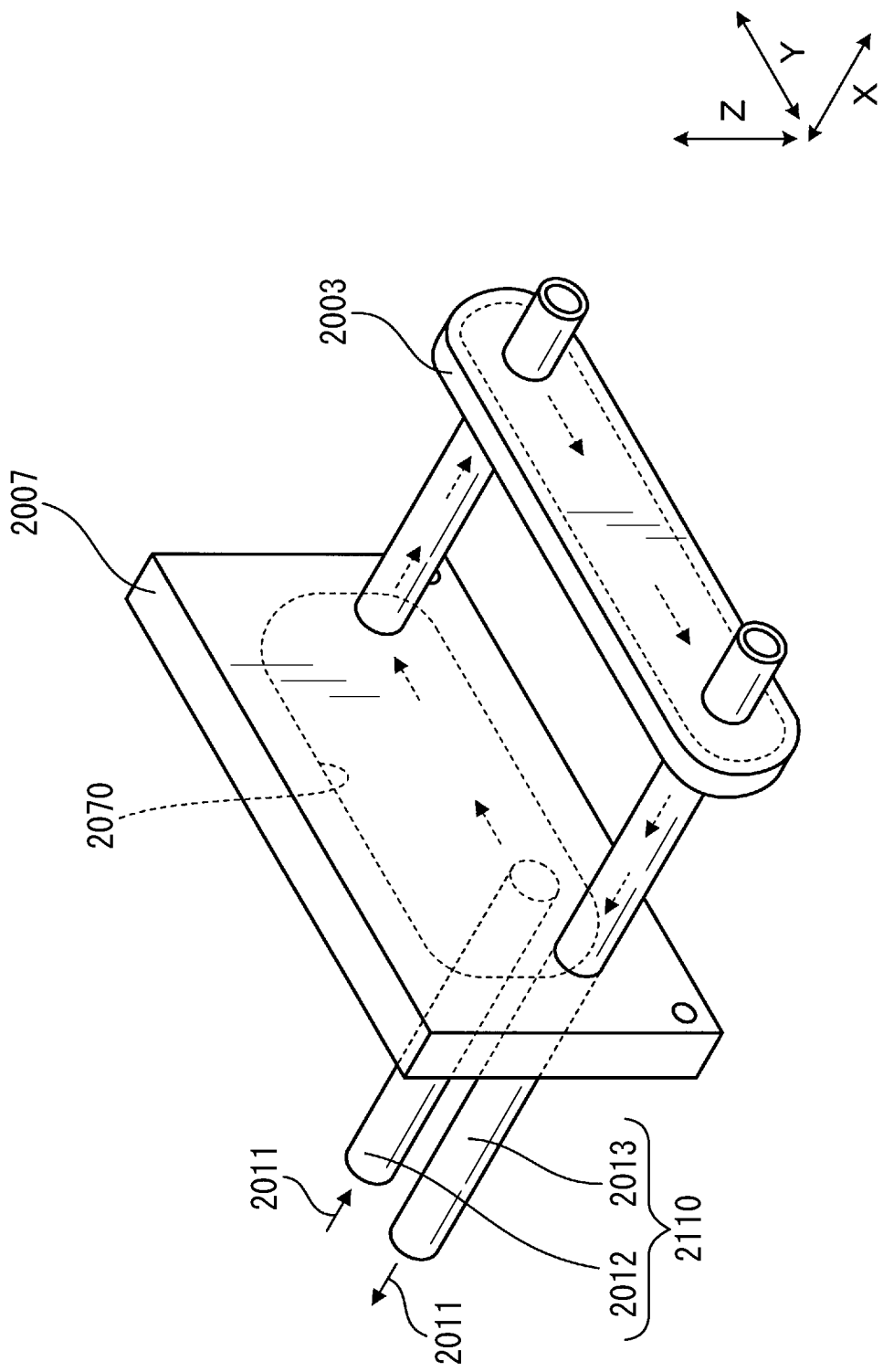
FIG. 53 is a perspective view of a cooling plate and a cooling conduit of the fifteenth embodiment.
Figure 54:
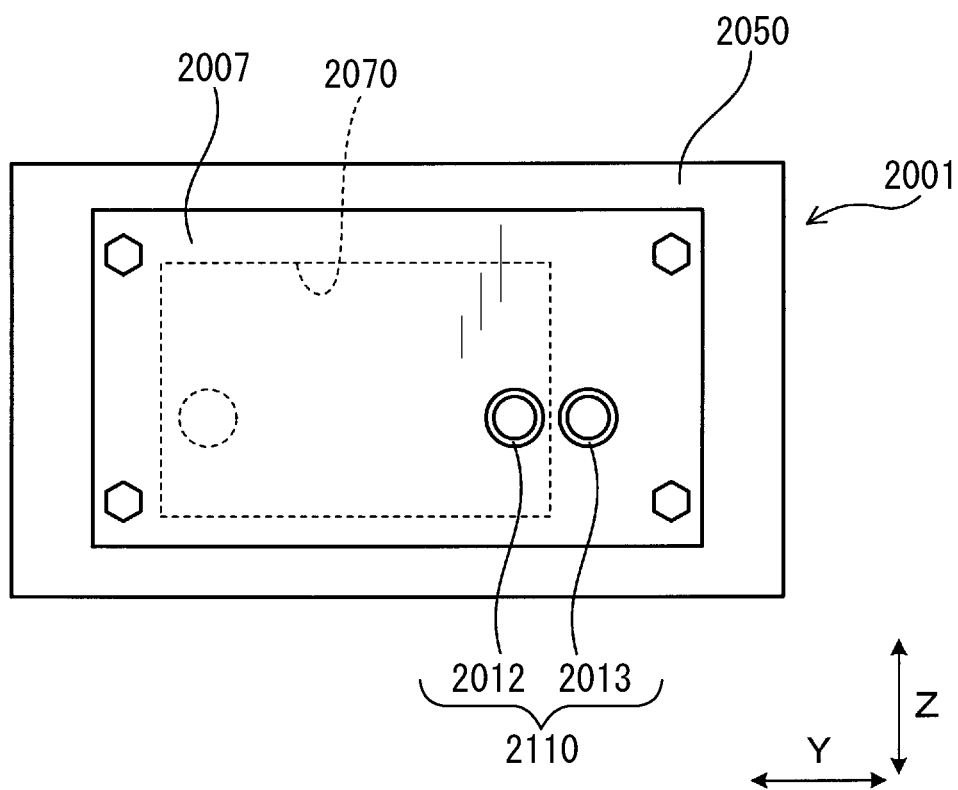
FIG. 54 is a front view of the power converter of the fifteenth embodiment with supporting electronic component removed.

In the present embodiment, the inlet pipe 2012 and the outlet pipe 2013 are modified in position as compared with the twelfth embodiment. As shown in FIGS. 52-54, as in the thirteenth embodiment, the inlet pipe 2012 and the outlet pipe 2013 are displaced adjacent to each other to form a pair of pipes 2110. The pair of pipes 2110 are disposed adjacent to the supporting electronic component 2014. The inlet pipe 2012 and the outlet pipe 2013 are adjacent to each other in the Y-direction.

The coolant 2011 introduced into the inlet pipe 2012 flows through the cooling plate 2007, and then divides and flows through the plurality of cooling conduits 2003. Thereafter, the separate coolant flows 2011 that have passed through the respective cooling conduits 2003 merge and leave through the outlet pipe 2013.

The present embodiment can provide following advantages. In the present embodiment, the inlet pipe 2012 and the outlet pipe 2013 are adjacent to each other in the Y-direction. Therefore, a length of the cooling plate 2007 in the Z-direction can be reduced as compared with the thirteenth embodiment where the pipes 2012 and 2013 are adjacent to each other in the Z-direction, which can downsize the power converter 2001.

In the thirteenth embodiment, the entire coolant 2011 introduced into the inlet pipe 2012 flows through the cooling plate 2007. This configuration allows a large amount of coolant 2011 to flow through the cooling plate 2007, thereby improving efficiency of cooling the electronic components 2004 and the supporting electronic component 2014.

The present embodiment can further provide similar advantages to those of the twelfth embodiment.

Sixteenth Embodiment

Figure 55:
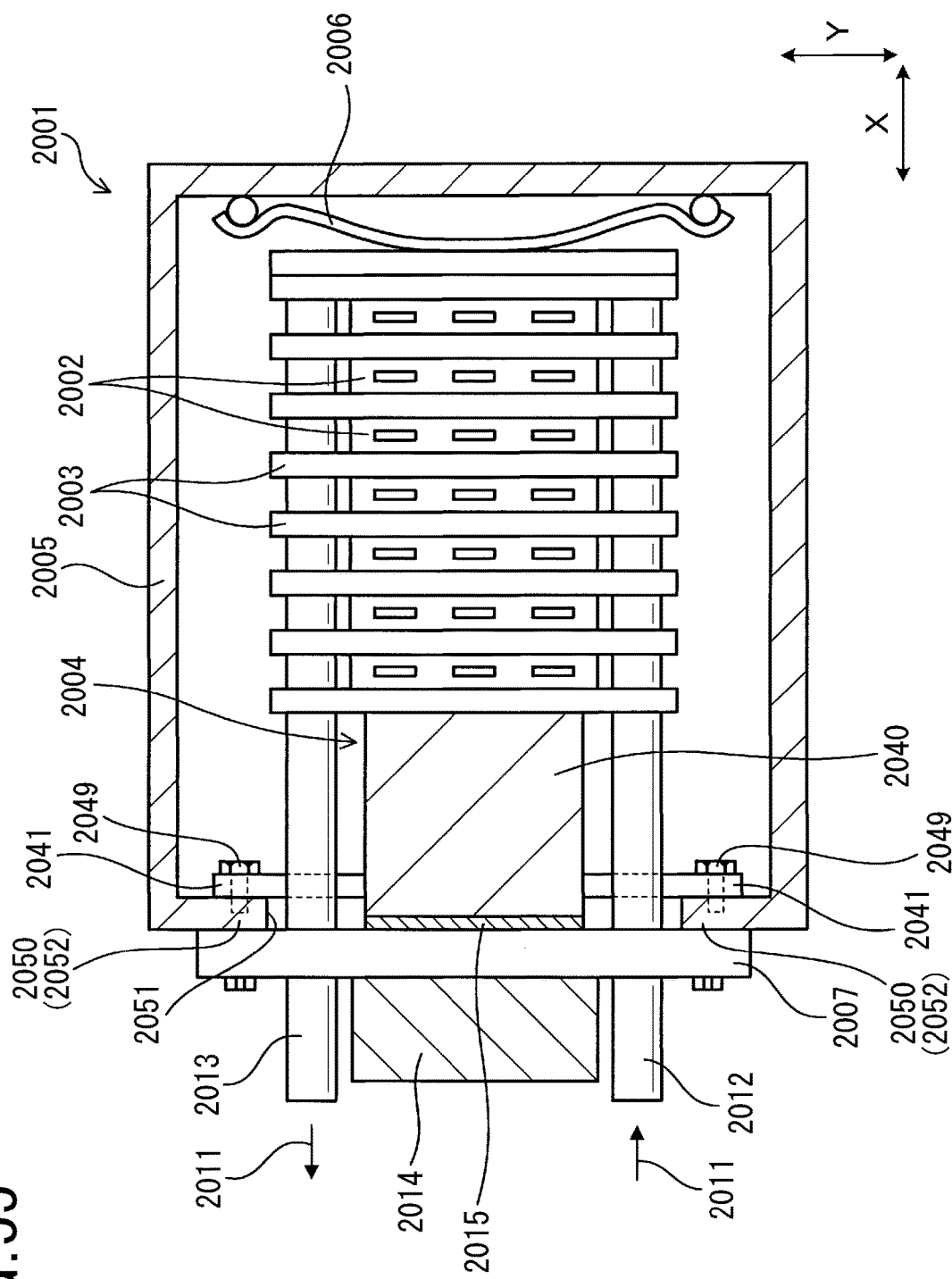
FIG. 55 is a cross-sectional view of a power converter in accordance with a sixteenth embodiment of the present invention.

In the present embodiment, the direction in which the protrusions 2041 are fastened to the casing 2007 is modified as compared with the twelfth embodiment. As shown in FIG. 55, the protrusions 2041 are plate-like shaped such that its thickness direction coincides with the X-direction. The protrusions 2041 abut the adjacent side wall 2050 (i.e., the abutment 2052) from the X-direction. The protrusions 2041 are fastened to the adjacent side wall 2050 (i.e., the abutment 2052) in the X-direction using the bolts 2049.

The present embodiment can further provide similar advantages to those of the twelfth embodiment.

Seventeenth Embodiment

Figure 56:
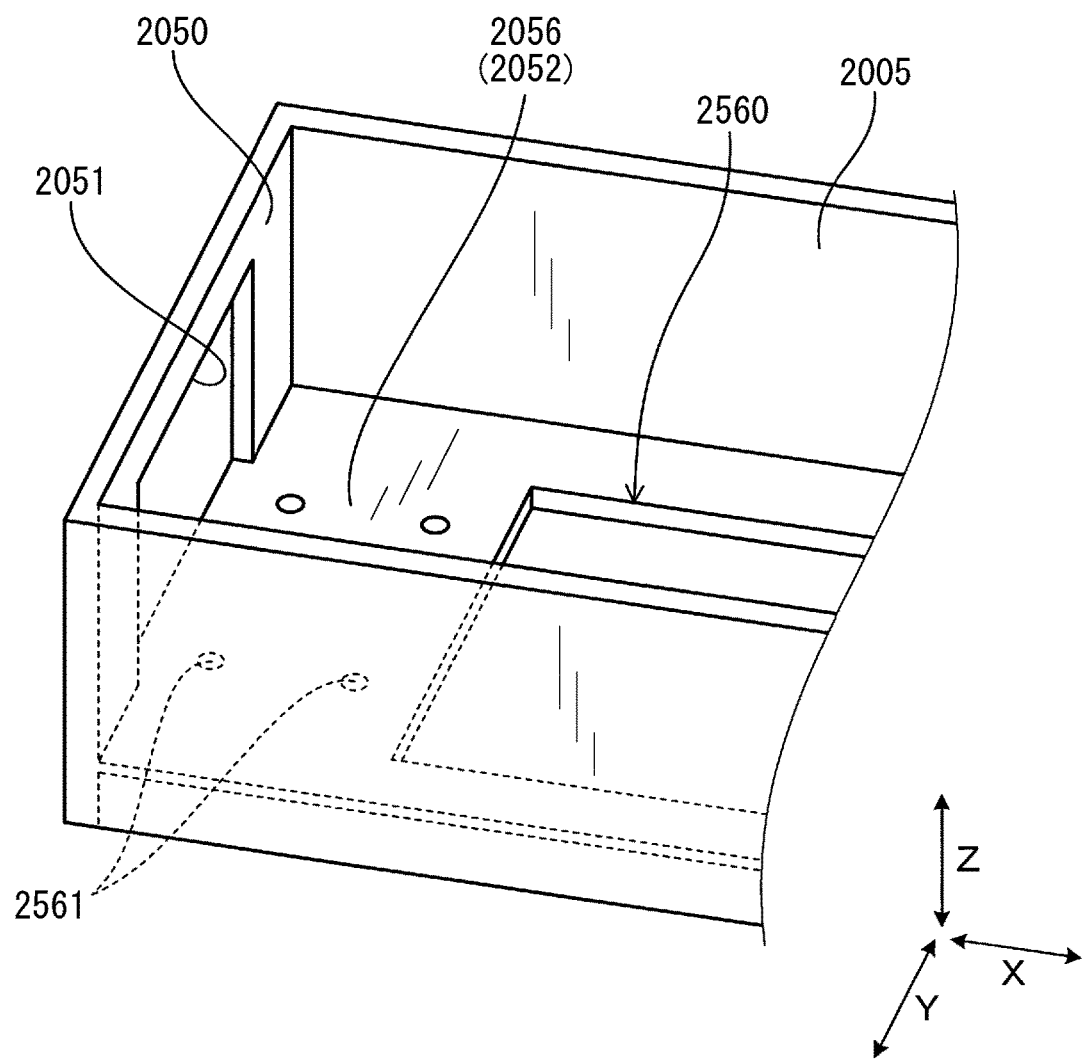
FIG. 56 is a partial perspective view of a casing in accordance with a seventeenth embodiment of the present invention.
Figure 58:
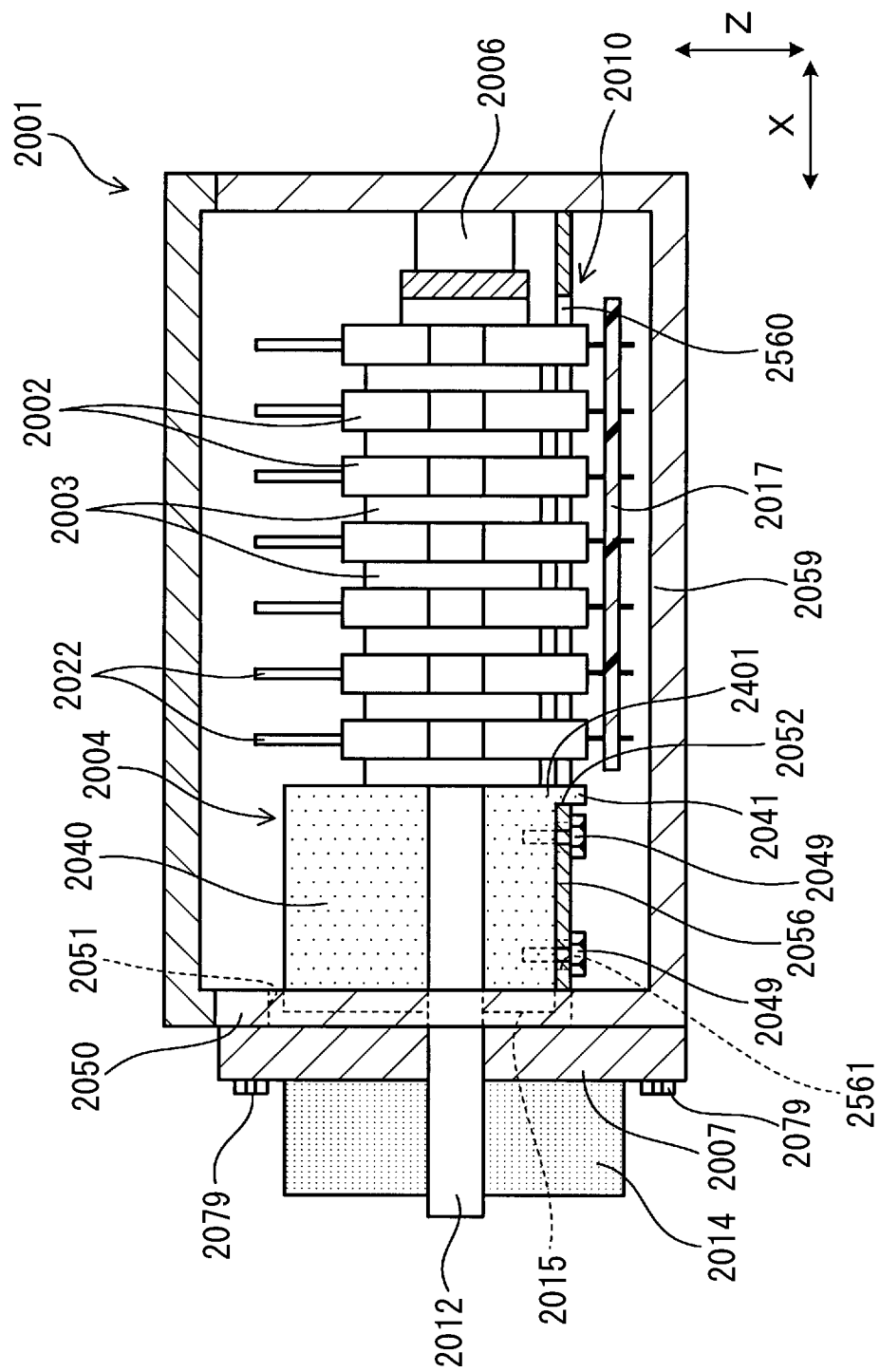
FIG. 58 is a cross-sectional view of a power converter of the seventeenth embodiment.
Figure 59:
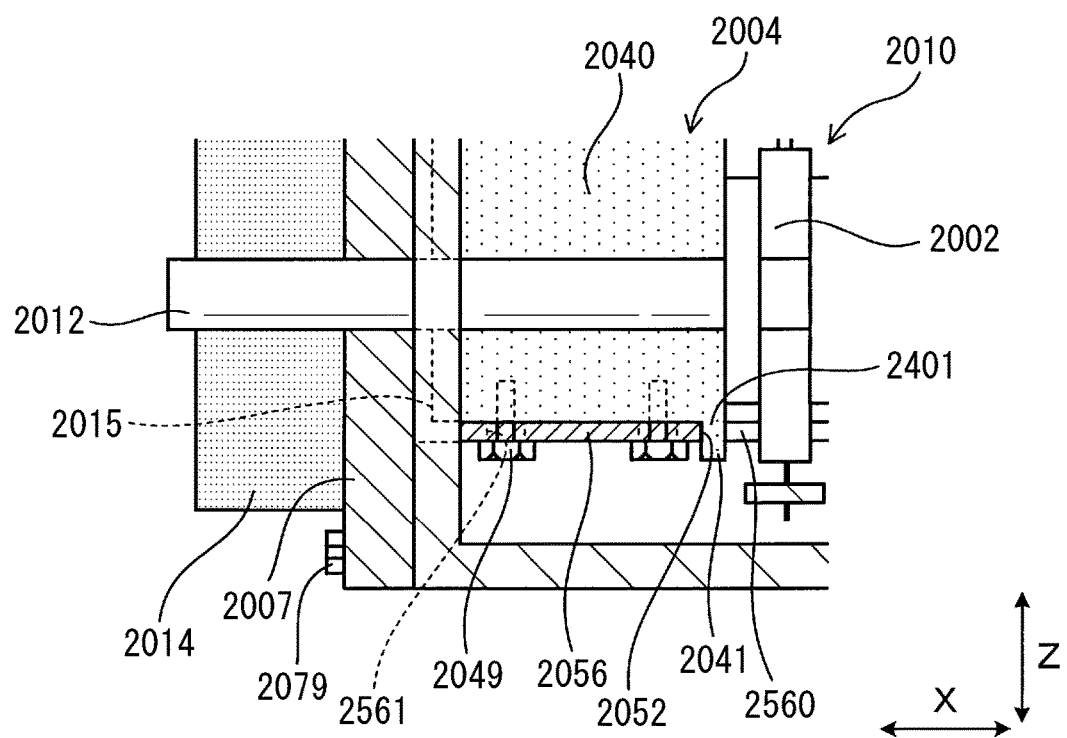
FIG. 59 is an enlarged detail from FIG. 58.

In the present embodiment, the casing 2005 and the electronic component 2004 are modified in shape as compared with the twelfth embodiment. As shown in FIG. 56, the casing 2005 includes a medium plate 2056 for mounting thereon the electronic component 2004. The medium plate 2056 has an opening 2560 extending therethrough in the Z-direction. As shown in FIGS. 58 and 59, part of each semiconductor module 2002 rests inside the opening 2560.

As shown in FIG. 56, the medium plate 2056 has bolt insertion holes 2561 extending therethrough in the Z-direction. As shown in FIGS. 58 and 59, a bolt 2049 is inserted in each bolt insertion hole 2561 and threaded to the body 2040 of the electronic component 2004, thereby securing the electronic component 2004 in the casing 2005.

Figure 57:
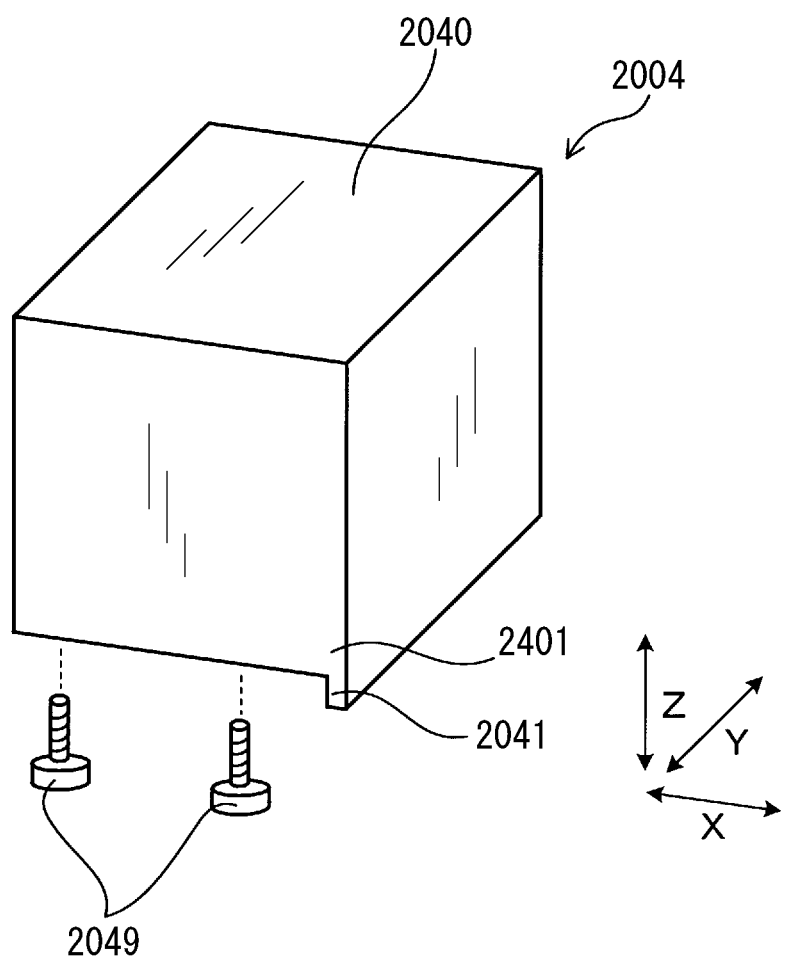
FIG. 57 is a perspective view of an electronic component of the seventeenth embodiment.

In the present embodiment, as shown in FIGS. 57-59, a protrusion 2041 protrudes in the Z-direction from one end 2401 of the body 2040 of the electronic component 2004 such that the stack 2010 is disposed adjacent to the end 2401 of the body 2040 of the electronic component 2004 in the X-direction. The end 2401 of the body 2040 of the electronic component 2004 abuts the medium plate 2056 (see FIG. 56) from the X-direction. That is, the medium plate 2056 is deemed as an abutment 2052.

The present embodiment can provide following advantages. In the present embodiment, the medium plate 2056 of the casing 2005 is the abutment 2052. The abutment 2052 is separate from the adjacent side wall 2050 of the casing 2005.

With this configuration, a pressing force F of the pressure applying member 2006 is applied to the medium plate 2056 (i.e., the abutment 2052), and thus less liable to be applied to the adjacent side wall 2050. This enables the adjacent side wall 2050 to be formed thinner, which can reduce the weight of the casing 2005. Thinning the adjacent side wall 2050 allows the cooling plate 2007 and the electronic component 2004 to be closer to each other, which can improve efficiency of cooling the electronic component 2004.

In the present embodiment, as shown in FIG. 59, the protrusion 2041 protrudes in the Z-direction from one end 2401 of the body 2040 of the electronic component 2004 such that the stack 2010 is disposed adjacent to the end 2401 of the body 2040 of the electronic component 2004 in the X-direction.

In an alternative embodiment, as in the twelfth embodiment (see FIG. 39), the protrusion 2041 may protrude in the Z-direction from one end of the body 2040 of the electronic component 2004 such that the stack 2010 is disposed adjacent to the opposite end of the body 2040 in the X-direction. In such an embodiment, however, almost entire body 2040 of the electronic component 2004 may be interposed between the abutment 2052 (i.e., the adjacent side wall 2050) and the stack 2010 in the X-direction, which may cause a pressing force F of the pressure applying member 2006 to be applied to the entire body 2040 of the electronic component 2004. Thus, the stiffness of the body 2040 needs to be increased to withstand the pressing force F. In contrast, in the present embodiment, almost none of the entire body 2040 of the electronic component 2004 is interposed between the abutment 2052 and the stack 2010 in the X-direction, which can prevent a large pressing force F of the pressure applying member 2006 from being applied to the almost entire body 2040 of the electronic component 2004. This can eliminate a need to increase the stiffness of the body 2040 of the electronic component 2004 so that the body 2040 can withstand the large pressing force F, thus reducing manufacturing costs of the electronic components 2004.

In addition, in the present embodiment, the protrusion 2041 protrudes from the body 2040 of the electronic component 2004 in the Z-direction.

With this configuration, a length of the electronic components 2004 in the Y-direction can be reduced as compared with the twelfth embodiment where the protrusions 2041 protrude from the body 2040 of the electronic component 2004 in the Y-direction, which can downsize the power converter 2001.

The present embodiment can further provide similar advantages to those of the twelfth embodiment.

Eighteenth Embodiment

In the present embodiment, the direction in which the protrusions 2041 protrude is modified as compared with the twelfth embodiment. As shown in FIG. 60, the protrusion 2041 protrude from the body 2040 of the electronic component 2004 in the X-direction. The protrusions 2041 abut the adjacent side wall 2050 (i.e., the abutment 2052) of the casing 2005.

The present embodiment can further provide similar advantages to those of the twelfth embodiment.

What is claimed is:

1. A power converter comprising:
   a stack of a plurality of semiconductor modules, each of which incorporates semiconductor elements, and a plurality of cooling conduits, though each of which a coolant flows to cool the semiconductor modules;
   at least one electronic component electrically connected to the semiconductor modules; and
   a cooling plate for cooling the at least one electronic component,
   wherein the stack, the at least one electronic component, and the cooling plate are arranged in a stacking direction of the stack,
   the cooling plate is connected to the cooling conduits and has an intra-plate pathway formed therein thorough which the coolant flows in a direction perpendicular to the stacking direction,
   the cooling plate has a greater area than each cooling conduit as viewed from the stacking direction.

2. The power converter according to claim 1, further comprising a casing accommodating the stack, wherein the casing has an opening extending therethrough in the stacking direction, and the opening is sealed by the cooling plate.

3. The power converter according to claim 1, wherein an area of the at least one electronic component, facing the cooling plate, is greater than an area of each semiconductor module, facing the cooling conduits.

4. The power converter according to claim 1, wherein:
   the at least one electronic component comprises two electronic components; and
   the cooling plate is interposed between the two electronic components.

5. A power converter comprising:
   a stack of a plurality of electronic components configuring a power conversion circuit and a plurality of cooling conduits each having a pathway formed therein through which a coolant flows to cool the electronic components; and
   a plurality of pipes connected to the respective cooling conduits, the plurality of pipes defining pathways of the coolant between any two of the cooling conduits adjacent to each other in a stacking direction of the stack and pathways of the coolant between the cooling conduit that is one of the plurality of the cooling conduits at one end of the stack in its stacking-direction and an external device operative to cool and circulate the coolant, wherein;
   the plurality of cooling conduits comprise a plurality of communication cooling conduits and at least one separation cooling conduit, each communication cooling conduit being connected to the pipes at both ends in an extensional direction of a pathway of the communication cooling conduit, all the pipes connected to the communication cooling conduit and the pathway in the communication cooling conduit being in fluid communication with each other, the at least one separation cooling conduit having a through hole formed therein and a separator, the through hole being formed at one end of the separation cooling conduit in the extensional-direction and extending therethrough in the stacking direction, the separator being interposed between the through hole and the pathway of the separation cooling conduit to separate them from each other;
   flow-channel pipes, of the plurality of pipes, are connected to the pathway of the separation cooling conduit on both sides of the separation cooling conduit in the stacking direction, and through pipes, of the plurality of pipes, are connected to the through hole of the separation cooling conduit on both sides of the separation cooling conduit in the stacking direction;
   on one side of the separation cooling conduit in the stacking direction, the flow-channel pipe is disposed separately from the through pipe in the extensional direction, and on the other side of the separation cooling conduit in the stacking direction, the flow-channel pipe is disposed adjacent to the through pipe to form a pair of pipes; and
   at least one of the electronic components is disposed adjacent to the pair of pipes in the extensional direction.

6. The power converter according to claim 5, wherein the through pipe and the flow-channel pipe defining the pair of pipes are adjacent to each other in a direction perpendicular to both the stacking direction and the extensional direction.

7. The power converter according to claim 5, wherein:
   the plurality of electronic components comprise a plurality of semiconductor modules each incorporating semiconductor elements and at least one large electronic component electrically connected to the semiconductor modules and having a larger volume than each semiconductor module; and
   the at least one large electronic component is disposed adjacent to the pair of pipes in the extensional direction.

8. The power converter according to claim 5, wherein the separation cooling conduit has a larger area than each communication cooling conduit as viewed from the stacking direction.

9. The power converter according to claim 5, wherein the separation cooling conduit is one of the plurality of cooling conduits disposed at one end of the stack in the stacking direction.

10. The power converter according to claim 9, further comprising a casing accommodating at least part of the stack, the casing having an opening formed in a side wall thereof extending through the side wall in the stacking direction, wherein:
    the opening is sealed by the separation cooling conduit;
    the pair of pipes are disposed outside the casing; and
    the electronic component is disposed outside the casing and adjacent to the pair of pipes.

11. The power converter according to claim 5, wherein the at least one separation cooling conduit is other than cooling conduits of the plurality of cooling conduits on both ends of the stack in the stacking direction.

12. A power converter comprising:
    a stack of a plurality of semiconductor modules, each of which incorporates semiconductor elements, and a plurality of cooling conduits, though each of which a coolant flows;
    an electronic component disposed adjacent to the stack in a stacking direction of the stack and electrically connected to the semiconductor modules;
    a pressure applying member pressing the stack against the electronic component;
    a casing housing the stack, the electronic component, and the pressure applying member, the casing having an adjacent side wall that is one of side walls of the casing, adjacent to the electronic component in the stacking direction, the adjacent side wall having an opening that opens toward the stacking direction; and a cooling plate having a pathway formed therein, through which the coolant flows, the cooling plate sealing the opening from the outside of the casing, the cooling plate being secured to the casing so as to cool the electronic component from an opposite side of the electronic component from a side thereof on which the stack is disposed, wherein:

the electronic component comprises a body electrically connected to the semiconductor modules and at least one protrusion protruding from the body, and is fastened to the casing; and the casing comprises an abutment that the at least one protrusion abuts from the stacking direction.

13. The power converter according to claim 12, wherein the at least one protrusion protrudes from the body of the electronic component in a direction perpendicular to the stacking direction.

14. The power converter according to claim 12, wherein the adjacent side wall comprises the abutment.

15. The power converter according to claim 12, wherein the abutment is formed separately from the adjacent side wall.

16. The power converter according to claim 15, wherein the at least one protrusion protrudes from an end of the body of the electronic component on the same side of the body as the stack.

17. The power converter according to claim 12, wherein the at least one protrusion is fastened to the casing.

18. The power converter according to claim 12, further comprising a heat dissipation resilient member interposed between the electronic component and the cooling plate, the heat dissipation resilient member being made of a material having a higher thermal conductivity than air and a lower Young's modulus than the adjacent side wall.

19. The power converter according to claim 12, wherein a supporting electronic component is disposed on an opposite side of the cooling plate from a side thereof on which the electronic component is disposed and electrically connected to the semiconductor modules.

20. The power converter according to claim 19, wherein:

an inlet pipe for introducing the coolant thereinto and an outlet pipe for leading out the coolant therethrough are adjacent to each other to form a pair of pipes; and the pair of pipes are disposed adjacent to the supporting electronic component.

21. The power converter according to claim 12, wherein part of the body of the electronic component rests inside the opening.

* * * * *